United States Patent [19]
Shibayama

[11] Patent Number: 6,160,753
[45] Date of Patent: Dec. 12, 2000

[54] SEMICONDUCTOR INTEGRATED CIRCUIT DEVICE HAVING MAIN WORD LINES AND SUB-WORD LINES

[75] Inventor: Akinori Shibayama, Kyoto, Japan

[73] Assignee: Matsushita Electric Industrial Co., Ltd., Osaka, Japan

[21] Appl. No.: 09/504,781

[22] Filed: Feb. 15, 2000

[30] Foreign Application Priority Data

Mar. 17, 1999 [JP] Japan .................................. 11-071739

[51] Int. Cl.[7] .................................................. G11C 8/08
[52] U.S. Cl. ................ 365/230.06; 365/63; 365/189.11; 365/227; 365/230.03
[58] Field of Search ............................... 365/230.06, 63, 365/189.11, 226, 227, 230.03

[56] References Cited

U.S. PATENT DOCUMENTS

| | | | |
|---|---|---|---|
| 4,798,977 | 1/1989 | Sakui et al. ................................. | 326/84 |
| 5,073,731 | 12/1991 | Oh ............................................. | 326/88 |
| 5,353,257 | 10/1994 | Yanagisawa et al. ..................... | 365/230.06 |
| 5,726,938 | 3/1998 | Okamoto .................................. | 365/189.11 |
| 5,966,341 | 10/1999 | Takahashi et al. ....................... | 365/230.03 |

OTHER PUBLICATIONS

M. Kinoshita et al., "Practical Low Power Design Architecture for 256 Mb DRAM", Technical Report of IEICE, DSP97–103, SDM97–141, ICD97–157, pp. 55–59, 1997–10 (English abstract).

Primary Examiner—Andrew Q. Tran
Attorney, Agent, or Firm—Eric J. Robinson; Nixon Peabody LLP

[57] ABSTRACT

Each sub-word line drive circuit SWD in a sub-word line drive section SWLB receives a signal carried by a main word line MWL0, a sub-word line non-selection signal XWD, and a sub-word line drive signal WD to drive a sub-word line SW. The sub-word line non-selection signal XWD is generated by an inverter XWDG in an intersection region SDR based on the sub-word line drive signal WD received by the inverter. The active level of the sub-word line drive signal WD is an internal boosted potential VPP which is higher than the external supply potential VDD. By using as the inactive level of the sub-word line non-selection signal XWD an internal lowered potential VINT which is lower than the external supply potential VDD, power consumption of an internal boosted potential generation circuit is reduced.

21 Claims, 19 Drawing Sheets

SEMICONDUCTOR INTEGRATED CIRCUIT DEVICE HAVING MAIN WORD LINES AND SUB-WORD LINES

BACKGROUND OF THE INVENTION

The present invention relates to a semiconductor integrated circuit device serving as a semiconductor memory device such as a large-capacity dynamic random access memory (DRAM) and the like, and more particularly, to related techniques for reducing power consumption of the device.

Conventionally, there exist, as one type of semiconductor integrated circuit devices, semiconductor memory devices such as a DRAM which has as its basic components memory cell arrays each including a plurality of word lines and bit lines intersecting orthogonally and a plurality of dynamic memory cells arranged in a lattice at the intersection points between the word lines and the bit lines. In recent years, DRAMs have been made large in size and highly integrated at rapid pace, and various techniques are being disclosed to accelerate this progress.

A conventional technique on such a DRAM is disclosed, for example, in Japanese Laid-Open Patent Publication No. 8-181292 (hereinafter, referred to as the first prior art). As shown in FIG. 3 of the publication, the DRAM of the first prior art has, as its basic components, unit memory cell arrays each including a plurality of word lines and bit lines intersecting orthogonally and a plurality of dynamic memory cells arranged in a lattice at the intersection points between the word lines and the bit lines. On each of two opposite sides of the unit memory cell array, a sub-word line drive section including unit sub-word line drive circuits is placed. On each of the other two opposite sides thereof, a sense amplifier section including unit amplifier circuits is placed.

As shown in FIG. 6 of the first prior art, the sub-word line drive circuits of which output terminals correspond to even-numbered sub-word lines of the memory cell array are placed on one side of the memory cell array (the lower side as is viewed from FIG. 6). In the illustrated example, the sub-word line drive section includes 256 sub-word line drive circuits. On the opposite side of the memory cell array (the upper side as is viewed from FIG. 6), the sub-word line drive circuits of which output terminals correspond to odd-numbered sub-word lines of the memory cell array are placed. In the illustrated example, the sub-word line drive section includes 256 sub-word line drive circuits. Every four of the 256 sub-word line drive circuits corresponding to even-numbered sub-word lines are commonly connected to one main word line. In the illustrated example, the four sub-word line drive circuits are also sequentially connected with lines for sub-word line drive signals DX40, DX42, DX44, and DX46. Every four of the 256 sub-word line drive circuits corresponding to odd-numbered sub-word lines are commonly connected to one main word line. In the illustrated example, the four sub-word line drive circuits are also sequentially connected with lines for sub-word line drive signals DX41, DX43, DX45, and DX47.

In the DRAM of the first prior art with the above configuration, therefore, a total of 514 sub-word lines in one sub-memory mat are coupled with the corresponding sub-word line drive circuits in two sub-word line drive sections placed on the opposite sides (upper and lower sides as are viewed from the figure) thereof. The respective sub-word line drive circuits are alternately placed on one side or the opposite side (upper or lower side) of the sub-word lines, and a total of eight sub-word line drive circuits are sequentially connected with one common main word line. Thus, in the first prior art, the sub-word line drive circuits are placed at a pitch twice as large as that of the sub-word lines, and the main word lines are placed at a pitch eight times as large as that of the sub-word lines. In this way, the pitches of the sub-word line drive circuits and the complementary main word lines are relaxed.

The first prior art also discloses three examples of specific constitutions and operations of the sub-word line drive circuits in FIGS. 7, 8, and 9 of the publication (partial circuit diagrams with timing charts).

Each sub-word line drive section includes 256 sub-word line drive circuits as described above. Each of the sub-word line drive circuits in the example shown in FIG. 7 includes a p-channel MOS transistor interposed between a corresponding sub-word line drive signal line and sub-word line, and an n-channel MOS transistor interposed between the corresponding sub-word line and the ground potential. The gates of these MOS transistors are connected to an inverted signal line of a corresponding main word line, i.e., an inverted main word line. The sub-word line drive circuit further includes an n-channel MOS transistor arranged in parallel with the p-channel MOS transistor between the sub-word line drive signal line and the sub-word line and connected to a non-inverted main word line at the gate thereof.

The non-inverted main word line is brought to the ground potential VSS when not selected and, when selected, driven to an internal boosted potential VCH, i.e., the active level such as +4 V used as a word line activating potential. The inverted main word line is brought to the internal boosted potential VCH when not selected and driven to the ground potential VSS when selected. The sub-word line drive signal DX40 is brought to the ground potential VSS when not selected and driven to the internal boosted potential VCH when selected. The internal voltage VCH is generated based on a supply voltage VCC, e.g., 3.3 V, by an internal boosted potential generation circuit incorporated in the DRAM, providing a comparatively stable potential of 4 V.

When the non-inverted main word line and the inverted main word line are brought to the respective inactive levels, both MOS transistors interposed between the sub-word line drive signal line and the sub-word line are turned OFF in the sub-word line drive circuit, while the n-channel MOS transistor interposed between the sub-word line and the ground is turned ON. This results in the sub-word line being set to the non-selection level such as the ground potential VSS, irrespective of the level of the sub-word line drive signal DX40. Meanwhile, when the non-inverted main word line and the inverted main word line are brought to the respective active levels, the n-channel MOS transistor interposed between the sub-word line and the ground is turned OFF. Instead, the MOS transistors interposed between the sub-word line drive signal line and the sub-word line are turned ON. This results in that the sub-word line is set to the internal boosted potential VCH when receiving the active level of the sub-word line drive signal DX40, and set to the ground potential VSS when receiving the inactive level thereof.

In the example shown in FIG. 8, each of the sub-word line drive circuits includes a p-channel MOS transistor interposed between a corresponding non-inverted main word line and sub-word line and receives the sub-word line drive signal DX40 at the gate thereof, and n-channel MOS transistors interposed in parallel between the sub-word line and the ground and connected respectively with the sub-word line drive signal line DX40 and the inverted main word line at the gates thereof.

In the example shown in FIG. 9, each of the sub-word line drive circuits includes a p-channel MOS transistor interposed between a corresponding non-inverted sub-word line drive signal line and sub-word line and connected with an inverted main word line at the gate thereof, and n-channel MOS transistors interposed in parallel between the sub-word line and the ground and connected respectively with the inverted main word line and an inverted sub-word line drive signal line at the gates thereof. In this example, the inverted main word line is brought to the internal boosted potential VCH when not selected and brought to the ground potential VSS when selected. The sub-word line drive signal is brought to the ground potential VSS when not selected and driven to the internal boosted potential VCH when selected. The inverted sub-word line drive signal is brought to the internal boosted potential VCH when not selected and brought to the ground potential VSS when selected.

When the inverted main word line is brought to the internal boosted potential VCH, the p-channel MOS transistor interposed between the sub-word line drive signal line and the sub-word line is turned OFF, while the n-channel MOS transistors interposed between the sub-word line and the ground is turned ON in the sub-word line drive circuit. This results in the potential of the sub-word line being set to the non-selection level such as the ground potential VSS, irrespective of the level of the sub-word line drive signal DX40. Meanwhile, when the inverted main word line is brought to the active level, the n-channel MOS transistor connected with the inverted main word line at the gate thereof is turned OFF in the sub-word line drive circuit. Instead, the p-channel MOS transistor interposed between the sub-word line drive signal line and the sub-word line is turned ON. In this state, when the sub-word line drive signal DX40 is at the internal boosted potential VCH which is the active level, since the inverted sub-word line drive signal is at the ground potential, the n-channel MOS transistor receiving the inverted sub-word line drive signal at the gate thereof is turned OFF. In response to this state, the sub-word line is set to the internal boosted potential VCH. When the sub-word line drive signal is at the ground potential VSS which is the inactive level, since the inverted sub-word line drive signal is at the internal boosted potential VCH, the n-channel MOS transistor receiving the inverted sub-word line drive signal at the gate thereof is turned ON. In response to this state, the sub-word line is set to the ground potential VSS.

The first prior art with the above constitution intends to provide a DRAM and the like taking full advantage of the benefits of the hierarchical structure so as to realize enhanced operation speed, higher degree of circuit integration, and lowered manufacturing cost in the DRAM and the like.

A circuit architecture effective for low power and high speed DRAMs is disclosed, for example, in "Technical Report of IEICE (The Institute of Electronics Information and Communication Engineers)", ICD97-157 (October, 1997), pp. 55–59 (hereinafter, referred to as the second prior art). The literature suggests under Chapter 3.1 a method for reduction of power consumption by a "fish bone layout" of sub-decode lines (sub-word line drive signal lines or inverted sub-word line drive signal lines) in a divided word line (hierarchical word line) architecture.

The technique of the second prior art adopts the divided word line architecture for relaxing the layout pitch of main word lines. In this architecture, a sub-word line is activated when a main word line and a sub-decode line are selected in a sub-decode circuit (sub-word line drive circuit). A fish bone layout is shown in FIG. 3b on page 57 of the literature. As is observed from this figure, only sub-decode lines SDL<0,1> are placed in a sense amplifier section on the left side of a memory cell array as is viewed from the figure. The sub-decode lines SDL<0,1> are not buffered at the intersections with the sub-decode circuits, and connected only with the odd sub-decode circuits, for example. Likewise, only sub-decode lines SDL<2,3> are placed in a sense amplifier section on the right side of the memory cell array. The sub-decode lines SDL<0,1> are not buffered at the intersections with the sub-decode circuits, and connected only with the even sub-decode circuits, for example. With such a hierarchical word line architecture of the fish bone layout, a plurality of sub-decode lines are not driven simultaneously, but driven individually.

Thus, in the second prior art, power reduction is attempted by adopting the hierarchical word line architecture.

However, the above prior art techniques have the following problems.

The hierarchical structures shown in FIGS. 7 and 8 of the first prior art are required to have non-inverted main word lines and inverted main word lines: A total of 64 pairs of non-inverted main word lines and Inverted main word lines have to be arranged alternately over the memory cell array in the illustrated examples. With such a large number of non-inverted main word lines and inverted main word lines alternately arranged over the memory cells, if a defect such as particle attachment occurs during the fabrication process and the like, lines may not be formed as designed, with a possibility that a non-inverted main word line and an inverted main word line may be partly short-circuited with each other. Such non-inverted main word lines and inverted main word lines are generally formed of a comparatively low resistance wiring layer made of metal or the like. In addition, since the non-inverted main word line is at the ground potential VSS and the inverted main word line is at the boosted potential VCH when not selected, a large potential difference is generated therebetween. In view of the above, when not selected, the non-inverted main word line and the inverted main word line may be short-circuited in the state of a large potential difference therebetween and a low resistance, causing markedly large current flow therebetween. This results in failure to satisfy the standby rated current of the product specification and failure to generate a potential as designed in a low-performance boosted potential generation circuit.

The structure shown in FIG. 9 of the first prior art, which includes only non-inverted main word lines arranged over the memory cells, has the following inconvenience.

The inverted main word line is brought to the internal boosted potential VCH when not selected and to the ground potential VSS when selected. The sub-word line drive signal is brought to the ground potential VSS when not selected and to the internal boosted potential VCH when selected. The inverted sub-word line drive signal is brought to the internal boosted potential VCH when not selected and to the ground potential VSS when selected. In other words, the inverted sub-word line drive signal can be considered as a sub-word line non-selection signal that turns the sub-word line to the inactive level by inactivating the sub-word line drive circuit.

When the inverted main word line is turned to the active level, the n-channel MOS transistor connected with the inverted main word line at the gate thereof is turned OFF in the sub-word line drive circuit. Instead, the p-channel MOS transistor interposed between the sub-word line drive signal line and the sub-word line is turned ON. In this state, when the sub-word line drive signal DX40 is at the internal boosted potential VCH which is the active level, since the inverted sub-word line drive signal is at the ground potential, the n-channel MOS transistor receiving the inverted sub-word line drive signal at the gate thereof is turned OFF. In response to this state, the sub-word line is set to the internal boosted potential VCH. When the sub-word line drive signal is at the ground potential VSS which is the inactive level, since the inverted sub-word line drive signal, i.e., the sub-word line non-selection signal is at the internal boosted potential VCH, the n-channel MOS transistor receiving the inverted sub-word line drive signal at the gate thereof is turned ON. In response to this state, the sub-word line is set to the ground potential VSS. Thereby, the inverted sub-word line drive signal, i.e., the sub-word line non-selection signal is charged and discharged between the levels of the boosted potential VCH and the ground potential VSS.

In the above configuration, a total of 256 sub-word line drive circuits are placed in one sub-word line drive section, one-fourth of which, i.e., 64 sub-word line drive circuits, are to receive a common inverted sub-word line drive signal, i.e., a common sub-word line non-selection signal. Moreover, in general, and actually in the first prior art, eight sub-memory mats SMR04 to SMR74, for example, are selected simultaneously, resulting in that nine sub-word line drive sections placed on opposite sides of the selected sub-memory mats operate simultaneously. This means that at least 64×9 sub-word line drive circuits operate simultaneously in response to the inverted sub-word line drive signal or the sub-word line non-selection signal. It is the gate electrodes of the n-channel MOS transistors that receive the sub-word line non-selection signal. In the recent miniaturization process, a gate oxide film tends to be thinned. This tends to increase the gate capacitance of a channel MOS transistor. As a result, the total gate capacitance of all the channel MOS transistors that receive the common sub-word line non-selection signal amounts to a significantly large value.

Thus, considering that the total gate capacitance of the plurality of channel MOS transistors that are connected to a common sub-word line non-selection signal to operate simultaneously is significantly large, and moreover that the sub-word line non-selection signal is charged and discharged between a large amplitude of the boosted potential VCH and the ground potential VSS, power consumption of the boosted potential generation circuit greatly increases.

The second prior art disclosed in "Technical Report of IEICE" has the following problems. When the hierarchical word line architecture of the second prior art is adopted and either inverted or non-inverted main word lines are arranged over the memory cells, it is inevitably required to place two kinds of signal lines, i.e., lines for a sub-word line drive signal and lines for a sub-word line non-selection signal, as the sub-word decode lines in the sense amplifier section. This means that two pairs of sub-word line drive signal lines and sub-word line non-selection signal lines (total four lines) must be arranged as the sub-decode lines SDL<0,1> in the sense amplifier section on the left side of the memory cell array. These lines are not buffered at the intersections with the sub-decode circuits, and connected only with the odd sub-decode circuits, for example. Likewise, two pairs of sub-word line drive signal lines and sub-word line non-selection signal lines (total four lines) must be arranged as the sub-decode lines SDL<2,3> in the sense amplifier section on the right side of the memory cell array. These lines are not buffered at the intersections with the sub-decode circuits, and connected only with the even sub-decode circuits, for example. Therefore, in the illustrated example of the fish bone layout hierarchical word line architecture, a pair of sub-word line drive signal line and sub-word line non-selection signal line (total two lines) are driven simultaneously as one sub-decode line.

However, in the fish bone layout hierarchical word line architecture, as in the first prior art, a plurality of sub-word line drive circuits are connected to a common sub-word line non-selection signal line of the sub-decode line. Moreover, in general, and actually in this prior art, a plurality of memory cell mats are selected simultaneously. Accordingly, the sub-word line drive sections on both sides of the memory cell mats are driven simultaneously, and thus a number of sub-word line drive circuits operate simultaneously in response to a sub-word line non-selection signal supplied from the sub-decode line. As described above, the gate electrodes of a large number of n-channel MOS transistors receive the common sub-word line non-selection signal, and a gate oxide film tends to be thinned. As a result, the total gate capacitance of the channel MOS transistors that receive the common sub-word line non-selection signal amounts to a significantly large value. Moreover, the sub-word non-selection signal line is charged and discharged between the boosted potential VCH and the ground potential. This greatly increases power consumption of a boosted potential generation circuit during operation. Furthermore, since the large-capacitance gates of the sub-word line drive circuits in a number of sub-word line drive sections must be charged and discharged using the common sub-word line non-selection signal, a long delay time is required until the potential is established during charging or discharging.

Hereinbelow, the operation of inverting or not inverting main word lines arranged over memory cells will be described using the circuit shown in FIG. 9 of the first prior art (Japanese Laid-Open Patent Publication No. 8-181292) which is generally used as a sub-word line drive circuit.

For example, in selection of a sub-word line, assume the case where the sub-word line drive signal and the sub-word line non-selection signal supplied from a sub-decode line are first turned to the boosted potential VCH as the active level and, after an interval, for example, the inverted main word line is turned to the ground potential VSS as the active level to set the sub-word line to be selected to the boosted potential as the active level. In this case, the p-channel MOS transistor and the n-channel MOS transistor connected to the inverted main word line are turned ON simultaneously when the potential of the inverted main word line shifts from the boosted potential to the ground potential. This causes a current flow through the sub-word line drive circuit from the boosted potential supply terminal to the ground in response to the sub-word line drive signal. This unnecessarily increases power consumption of the boosted potential generation circuit.

In reverse, assume the case where the inverted main word line is first turned to the ground potential VSS as the active level and, after an interval, for example, the sub-word line drive signal and the sub-word line non-selection signal supplied from the sub-decode line are turned to the active level. In this case, while the sub-word line drive signal rises to the boosted potential, the sub-word line non-selection signal falls to the ground potential. During this potential shift, however, large-capacitance gates of channel MOS transistors of the sub-word line drive circuits in a number of sub-word line drive sections are charged and discharged in response to the sub-word line non-selection signal. A long delay time is therefore required until the potential is established during charging or discharging. In other words, it takes a long time to turn OFF the n-channel MOS transistor that operates in response to the sub-word line non-selection signal. At this time, since the inverted main word line is already at the ground potential VSS as the active level, the p-channel MOS transistor connected to the inverted main word line is in the ON state. As a result, a current flows through the sub-word line drive circuit from the boosted potential supply terminal to the ground in response to the sub-word line drive signal. This unnecessarily increases power consumption of the boosted potential generation circuit. Thus, whichever line, the inverted main word line or the sub-decode line (the sub-word line drive signal and the sub-word line non-selection signal), is activated first, power consumption of the boosted potential generation circuit is unnecessarily increased.

In view of the above, in both the first prior art and the second prior art, the boosted potential generation circuit needs a considerably large consumption charge amount compared with the supply charge amount, and becomes large in size requiring a large layout area.

SUMMARY OF THE INVENTION

The problems of the prior art techniques described above are caused by the fact that the charge supply capacity of the internal boosted potential generation circuit is comparatively low. It is therefore a primary object of the present invention to provide a semiconductor integrated circuit device including a low-power internal boosted potential generation circuit.

A typical embodiment of the semiconductor integrated circuit device according to the present invention is summarized as follows.

In order to reduce power consumption during selection of word lines and realize a highly-integrated arrangement in DRAMs of the hierarchical word line structure, each memory cell block of the semiconductor integrated circuit device includes: sub-memory cell arrays each including dynamic memory cells arranged in a lattice; sub-word line drive sections each including sub-word line drive circuits; main word line drive circuits which generate main word lines connected to the sub-word line drive circuits for selecting the sub-word line drive circuits; sub-word line drive signal generation circuits connected to the sub-word line drive circuits for supplying a selection potential to the sub-word lines; sub-word line non-selection signal generation circuits connected to the sub-word line drive circuits for supplying a non-selection potential to the sub-word lines; and sense amplifier sections including unit sense amplifiers. Each sub-memory cell array, together with the sub-word line drive sections on two opposite sides thereof and the sense amplifiers on the other two opposite sides thereof, constitute a sub-memory block. The sub-word line non-selection signal generation circuits are placed in respective intersection regions between the sub-word line drive sections and the sense amplifier sections. Such sub-memory blocks including the memory cells and peripheries thereof are arranged in a lattice. The active level of the sub-word line drive signal is set at a boosted potential higher than the external supply potential, and the active level of the sub-word line non-selection signal is set at a lowered potential lower than the external supply potential.

In a semiconductor integrated circuit of the hierarchical word line structure, a signal is connected to a number of sub-word line drive circuits and operated simultaneously during operation of rows of circuits. This increases power consumption with an increase in capacity of the device. In particular, power consumption of an internal boosted potential generation circuit increases. Such an internal boosted potential generation circuit is low in efficiency, requiring a great amount of current during generation of a boosted potential. For this reason, power consumption of the internal boosted potential generation circuit should be as small as possible. By adopting the above configuration where an internal lowered potential generation circuit having a higher efficiency, not the internal boosted potential generation circuit having a lower efficiency, is used for the sub-word line non-selection signal, great reduction in power consumption is possible. Specifically, the following configurations are proposed.

The first embodiment of the semiconductor integrated circuit device of the present invention has a number of MOS transistors and lines integrated on a semiconductor substrate. The device comprises: main word lines and a plurality of sub-word lines branching from each of the main word lines; a plurality of bit lines extending to intersect the plurality of sub-word lines; memory cell arrays each including a plurality of memory cells arranged in a matrix, the memory cells being connected with the sub-word lines and the bit lines; sense amplifier sections each including a plurality of sense amplifiers connected with the bit lines;

main-word line drive signal generation circuits for generating a main word line drive signal; sub-word line drive signal generation circuits for generating a sub-word line drive signal; sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein the sub-word line drive signal has a state of being at a boosted potential higher than an external supply potential, and the sub-word line non-selection signal has a state of being at an internal lowered potential lower than the external supply potential.

By the above configuration, the following effects are obtained. The total gate capacitance of all MOS transistors that receive a sub-word line non-selection signal and simultaneously operate is considerably large. Therefore, if the sub-word line non-selection signal is charged and discharged through the potential difference between a boosted potential and the ground potential, the power consumed by a boosted potential generation circuit during operation becomes great. In the first embodiment of the semiconductor integrated circuit of the present invention, however, the sub-word line non-selection signal is charged and discharged between the internal lowered potential and the ground potential. This saves the charge supply amount required for generation of the internal boosted potential that is higher than the external supply potential. In short, reduction in power consumption is possible by using the internal lowered potential which is lower than the external supply potential and has a higher efficiency, not the internal boosted potential having a lower efficiency. Also, by using a circuit for generating the internal boosted potential requiring a reduced charge supply amount, the circuit configuration is simplified, reducing the circuit area and thus reducing the layout area.

In the first embodiment of the semiconductor integrated circuit device, preferably, the sub-word line drive sections and the sense amplifier sections are placed in directions to intersect each other, and the sub-word line non-selection signal generation circuits are placed in respective intersection regions at which the sub-word line drive sections and the sense amplifier sections intersect each other.

By the above configuration, for example, the main word line drive signal may be first turned to the ground potential as the active level before the sub-word line drive signal and the sub-word line non-selection signal are turned to their active levels, to select a sub-word line. The sub-word line drive signal rises to the boosted potential, while the sub-word line non-selection signal falls from the internal lowered potential to the ground potential. Since the sub-word line non-selection signal generation circuits are placed in the respective intersection regions, the capacitance connected to one line for the sub-word line non-selection signal is only those of gates of MOS transistors of the sub-word line drive circuits in one sub-word line drive section. In other words, the gate capacitance connected to one signal line is reduced. Thus, due to this effect, in addition to the above effect of reducing the shift level of the sub-word line non-selection signal to the difference between the internal lowered potential and the ground potential, the time required to turn off the MOS transistors which receive the sub-word line non-selection signal can be reduced. This shortens the delay time until establishment of the potential during discharging.

In the first embodiment of the semiconductor integrated circuit device, preferably, the sub-word line non-selection circuit generation circuits are configured to receive the sub-word line drive signal and generate the sub-word line non-selection signal based on the sub-word line drive signal.

By the above configuration, the number of circuits to be placed in each intersection region with a comparatively small area can be reduced, allowing for a circuit configuration suitable for high integration.

In the first embodiment of the semiconductor integrated circuit device, preferably, the boosted potential and the internal lowered potential are generated based on the external supply potential, and the boosted potential and the internal lowered potential are substantially fixed when the external supply potential falls within a range.

By the above configuration, when the external supply potential falls within a range, it is possible to set the same change characteristics with respect to the external supply potential for both the boosted potential which is the active level of the sub-word line drive signal and the internal lowered potential which is the inactive level of the sub-word line non-selection signal, which have a small external potential dependency. By this setting, the change characteristics of the three signals, i.e., the sub-word line drive signal, the main word line drive signal, and the sub-word line non-selection signal, with respect to the external supply potential can be made close to one another. This increases the operation allowance with respect to the external power supply and thus allows for stable operation.

In the first embodiment of the semiconductor integrated circuit device, preferably, the device further comprises sense amplifier drive circuits in the respective intersection regions for driving the sense amplifiers, wherein the sense amplifier drive circuit and the sub-word line non-selection signal generation circuit in each intersection region have respective MOS transistors having a common source or drain formed in the semiconductor substrate.

By the above configuration, it is possible to lay out so that the source or drain is shared by the MOS transistors of the sense amplifier drive circuit and the sub-word line non-selection signal generation circuit placed in a comparatively small intersection region. This reduces the layout area, and thus allows for adoption of a circuit configuration suitable for high integration.

In the first embodiment of the semiconductor integrated circuit device, preferably, the sub-word line non-selection signal generation circuits are placed on both sides of each of the sub-word line drive sections, and the sub-word line drive sections receive the sub-word line non-selection signal from the sub-word line non-selection signal generation circuits as an input signal.

By the above configuration, since the sub-word line drive sections can receive the sub-word line non-selection signal from both sides thereof, the number of the sub-word line non-selection signal generation circuits placed in the comparatively small intersection region can be a half of the number of the sub-word line non-selection signals input into the sub-word line drive section. This reduces the number of circuits to be placed in the intersection region and thus allows for adoption of a circuit configuration suitable for high integration.

In the first embodiment of the semiconductor integrated circuit device, preferably, four or more lines for the sub-word line non-selection signal are connected to each of the sub-word line drive sections, the sub-word line non-selection signal generation circuits and the sub-word line drive sections are alternately placed adjacent to each other, and the sub-word line non-selection signal generated by each of the sub-word line non-selection signal generation circuits excluding outermost ones is input into four or more sub-word line drive sections including the adjacent ones on both sides.

By the above configuration, even if four or more lines for the sub-word line non-selection signal are to be input into each sub-word line drive section, it is not necessary to place four or more sub-word line non-selection signal generation circuits in each of the comparatively small intersection regions adjacent to the sub-word line drive section, but it is only necessary to place at least one sub-word line non-selection signal generation circuit. The sub-word line non-selection signal generated by this sub-word line non-selection signal generation circuit can be shared by adjacent four more sub-word line drive sections. This reduces the number of circuits placed in the intersection region and allows for adoption of a circuit configuration suitable for high integration.

In the first embodiment of the semiconductor integrated circuit device, preferably, and sub-word line drive sections and the sub-word line non-selection signal generation circuits are alternately placed adjacent to each other, the sub-word line drive signal is input into the sub-word line drive sections from both sides, and the sub-word line non-selection signal is input into the sub-word line drive sections from the adjacent sub-word line non-selection signal generation circuits on both sides.

By the above configuration, the number of sub-word line drive sections that receive a common sub-word line drive signal is reduced, allowing for high-speed selection of a sub-word line. Also, by placing a sub-word line drive section, a sub-word line drive signal generation circuit in an intersection region, another sub-word line drive section, and a sub-word line non-selection signal generation circuit in the next intersection region in this order repeatedly, the sub-word line drive signal and the sub-word line non-selection signal can be shared by the sub-word line drive sections.

This reduces the number of circuits to be placed in each intersection region and thus allows for adoption of a circuit configuration suitable for high integration.

In the first embodiment of the semiconductor integrated circuit device, preferably, the device further comprises: an internal lowered potential generation circuit for generating the internal lowered potential based on the input external supply potential; a selected internal lowered potential generation circuit including a MOS transistor driven by the internal lowered potential generated by the internal lowered potential generation circuit, a selected internal lowered potential changing depending on a change of the internal lowered potential; and a line for supplying the selected internal lowered potential extending from the selected internal lowered potential generation circuit to be connected with the sub-word line non-selection signal generation circuit, wherein the line for supplying the selected internal lowered potential is placed over the sense amplifier section.

By the above configuration and assuming that the above MOS transistor is of a p-channel and uses a boosted potential as the substrate potential and a lowered potential as the active level of the sub-word line non-selection signal which is the source potential, the source potential of the MOS transistor will not be increased beyond the substrate potential even if the internal lowered potential temporarily becomes higher than the boosted potential due to the difference in the rising state between the boosted potential and the internal lowered potential at power-on of the power supply. This avoids an occurrence of forward current at the pn junction and thus possibility of latch-up.

In the first embodiment of the semiconductor integrated circuit device, preferably, the device further comprises: an internal lowered potential generation circuit for generating the internal lowered potential based on the input external supply potential; a selected internal lowered potential generation circuit including a MOS transistor driven by the internal lowered potential generated by the internal lowered potential generation circuit, a selected internal lowered potential changing depending on a change of the internal lowered potential; and a line for supplying the selected internal lowered potential extending from the selected internal lowered potential generation circuit to be connected with the sub-word line non-selection signal generation circuit, wherein the line for supplying the selected internal lowered potential is placed over the sub-word line drive section.

By the above configuration and assuming that the above MOS transistor is of a p-channel and uses a boosted potential as the substrate potential and a lowered potential as the active level of the sub-word line non-selection signal which is the source potential, as in the former case, the source potential of the MOS transistor will not be increased beyond the substrate potential even if the internal lowered potential temporarily becomes higher than the boosted potential due to the difference in the rising state between the boosted potential and the internal lowered potential at the start of power supply. This avoids an occurrence of a forward current at the pn junction and thus possibility of latch-up.

In the first embodiment of the semiconductor integrated circuit device, preferably, the device further comprises: an internal lowered potential generation circuit for generating the internal lowered potential based on the external supply potential received as an input; a selected internal lowered potential generation circuit including a MOS transistor driven by the internal lowered potential generated by the internal lowered potential generation circuit, a selected internal lowered potential changing depending on a change of the internal lowered potential; a line for supplying the selected internal lowered potential extending from the circuit for generating the selected internal lowered potential to be connected with the sub-word line non-selection signal generation circuit; and a control circuit receiving the boosted potential for controlling the MOS transistor so as to stop supply of charges to the line for supplying the selected internal lowered potential until the boosted potential reaches a value.

By the above configuration, the possibility of latch-up can be avoided which may otherwise occur when the internal lowered potential becomes higher than the boosted potential.

In the first embodiment of the semiconductor integrated circuit device, preferably, the device further comprises a control circuit receiving the external supply potential for controlling the MOS transistor so as to stop supply of charges to the line for supplying the selected internal lowered potential until a time passes from power-on of an external power supply.

By the above configuration, the possibility of latch-up can be avoided which may otherwise occur when the internal lowered potential becomes higher than the boosted potential.

In the first embodiment of the semiconductor integrated circuit device, preferably, the memory cell array includes n-channel MOS transistors each formed in a p-well in a first n-well region, and a negative potential is applied to the p-well during operation of the n-channel MOS transistors, the sense amplifier section includes p-channel MOS transistors each formed in a second n-well region which is shallower than the first n-well region, the sub-word line drive section includes p-channel MOS transistors each formed in a third n-well region which is shallower than the first n-well region, and the second n-well region and the third n-well region are electrically isolated from each other.

By the above configuration, the third n-well region kept at a boosted potential which is the substrate potential of the p-channel MOS transistors in the sub-word line drive section is electrically isolated from the second n-well region kept at an internal lowered potential where the p-channel MOS transistors in the sense amplifier section are formed, during operation of the transistors. Thus, even if the internal lowered potential temporarily becomes higher than the boosted potential due to the difference in the rising state between the boosted potential and the internal lowered potential at power-on of the power supply, the source potential of the MOS transistors in the sense amplifier section will not be increased beyond the substrate potential. This avoids an occurrence of a forward current at the pn junction and thus possibility of latch-up.

In the first embodiment of the semiconductor integrated circuit device, preferably, the memory cell array and the sub-word line drive section respectively include n-channel MOS transistors each formed in a p-well in a first n-well region, a negative potential is applied to the p-well while a boosted potential is applied to the first n-well region during operation of the n-channel MOS transistors, the sense amplifier section includes p-channel MOS transistors each formed in a second n-well region which is shallower than the first n-well region, and the first n-well region and the second n-well region are electrically isolated from each other.

By the above configuration, even in the semiconductor integrated circuit of a triple structure which includes both the memory cells and the sub-word line drive circuits therein, the first n-well region kept at a boosted potential which is the substrate potential of the p-channel MOS transistors in the sub-word line drive section are electrically isolated from the second n-well region kept at an internal lowered potential where the p-channel MOS transistors in the sense amplifier section are formed, during operation of the transistors. Thus, even if the internal lowered potential temporarily becomes higher than the boosted potential due to the difference in the rising state between the boosted potential and the internal lowered potential at power-on of the power supply, the source potential of the MOS transistors in the sense amplifier section will not be increased beyond the substrate potential. This avoids an occurrence of a forward current at the pn junction and thus possibility of latch-up.

In the first embodiment of the semiconductor integrated circuit device, preferably, the device further comprises dummy memory cells free from data storing formed in a fourth n-well region which is shallower than the first n-well region at ends of each of the memory cell arrays, wherein the fourth n-well region and the first n-well region are electrically isolated from each other.

By the above configuration, in realizing the above layout that the (first or third) n-well region kept at a boosted potential which is the substrate potential of the p-channel MOS transistors in the sub-word line drive section is electrically isolated from the (second) n-well region kept at an internal powered potential where the p-channel MOS transistors in the sense amplifier section are formed, the dummy memory cell can be used for the isolation between the n-well region of the sub-word line drive section and the n-well region of the sense amplifier section. This avoids an occurrence of latch-up and thus allows for adoption of a circuit configuration suitable for high integration.

The second embodiment of the semiconductor integrated circuit device according to the present invention has a number of MOS transistors and lines integrated on a semiconductor substrate. The device comprises: main word lines and a plurality of sub-word lines branching from each of the main word lines; a plurality of bit lines extending to intersect the plurality of sub-word lines; memory cell arrays each including a plurality of memory cells arranged in a matrix, the memory cells being connected with the sub-word lines and the bit lines; sense amplifier sections each including a plurality of sense amplifiers connected with the bit lines; main-word line drive signal generation circuits for generating a main word line drive signal; sub-word line drive signal generation circuits for generating a sub-word line drive signal; sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein a plurality of columns of n-type diffusion regions are formed in the semiconductor substrate, each of the sub-word line drive sections includes a plurality of n-type diffusion regions belonging to the plurality of columns of n-type diffusion regions, each of the n-type diffusion regions includes a plurality of MOS transistors having gate electrodes, and a line for the sub-word line non-selection signal extending from each of the sub-word line non-selection signal generation circuits is connected to the gate electrodes in the n-type diffusion regions of a common column in the sub-word line drive sections on both sides of the sub-word line non-selection signal generation circuit.

By the above configuration, with the same layout for all the sub-word line drive sections, the order of lines to which a plurality of sub-word line drive signals are connected in the sub-word line drive sections is unified. This simplifies the physical address arrangement of the sub-word lines in the respective memory cell arrays.

The third embodiment of the semiconductor integrated circuit device according to the present invention has a number of MOS transistors and lines integrated on a semiconductor substrate. The device comprises: main word lines and a plurality of sub-word lines branching from each of the main word lines; a plurality of bit lines extending to intersect the plurality of sub-word lines; memory cell arrays each including a plurality of memory cells arranged in a matrix, the memory cells being connected with the sub-word lines and the bit lines; sense amplifier sections each including a plurality of sense amplifiers connected with the bit lines; main-word line drive signal generation circuits for generating a main word line drive signal; sub-word line drive signal generation circuits for generating a sub-word line drive signal; sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein a plurality of columns of n-type diffusion regions are formed in the semiconductor substrate, each of the sub-word line drive sections includes a plurality of n-type diffusion regions belonging to the plurality of columns of n-type diffusion regions, each of the n-type diffusion regions includes a plurality of MOS transistors having gate electrodes, and a line for the sub-word line non-selection signal extending from each of the sub-word line non-selection signal generation circuits is connected to the gate electrodes in the n-type diffusion regions of different columns in the sub-word line drive sections on both sides of the sub-word line non-selection signal generation circuit.

By the above configuration, the layout of the intersection regions can be unified allowing for layout of the intersection regions as one cell. This simplifies the layout design of the semiconductor integrated circuit.

The fourth embodiment of the semiconductor integrated circuit device according to the present invention has a number of MOS transistors and lines integrated on a semiconductor substrate. The device comprise: a plurality of word lines; a plurality of bit lines extending to intersect the plurality of word lines; memory cell arrays each including a plurality of memory cells arranged in a matrix, the memory cells being connected with the word lines and the bit lines; sense amplifier sections each including a plurality of sense amplifiers connected with the bit lines; word line drive sections each including a plurality of word line drive circuits for driving the word line; a first wiring layer constituting the word lines; a second wiring layer having a resistance lower than the first wiring layer; and a word line backing section for connecting the first wiring layer and the second wiring layer, wherein the memory cell array includes n-channel MOS transistors each formed in a p-well in a first n-well region, and a negative potential is applied to the p-well during operation of the n-channel MOS transistor, and the sense amplifier section includes p-channel MOS transistors each formed in a second n-well region.

By the above configuration, in the semiconductor integrated circuit device of a word line structure other than the hierarchical word line structure, also, an occurrence of latch-up can be avoided by having a layout that the first n-well region kept at a boosted potential where the n-channel MOS transistors in the memory cell array are formed is electrically isolated from the second n-well region kept at an internal powered potential where the p-channel MOS transistors in the sense amplifier section are formed.

The fifth embodiment of the semiconductor integrated circuit device according to the present invention has a number of MOS transistors and lines integrated on a semiconductor substrate. The device comprises: main word lines and a plurality of sub-word lines branching from each of the main word lines; a plurality of bit lines extending to intersect the plurality of sub-word lines; memory cell arrays each including a plurality of memory cells arranged in a matrix, the memory cells being connected with the sub-word lines and the bit lines; sense amplifier sections each including a plurality of sense amplifiers connected with the bit lines; main-word line drive signal generation circuits for generating a main word line drive signal; sub-word line drive signal generation circuits for generating a sub-word line drive signal; sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein each of the sub-word line drive circuits includes a MOS transistor having a gate connected to the main word line and a source or a drain receiving the sub-word line drive signal for selecting the sub-word line, and when the selected sub-word line drive circuit is to be inactivated, the sub-word line is first inactivated before the main word line drive signal is inactivated.

By the above configuration, when the sub-word line drive circuit is to be inactivated, the sub-word line drive signal is first lowered to the ground potential as the non-selection state before the main word line drive signal is shifted from the ground potential to the boosted potential as the non-selection state. This prevents a through current from flowing due to the potential difference between the boosted potential and the ground potential of the sub-word line drive signal, generated by the state shift of the main word line drive signal. This reduces the charge supply amount of the boosted potential generation circuit having a comparatively low supply capacity.

In the fifth embodiment of the semiconductor integrated circuit device, preferably, the sub-word line drive signal has a state of being at a boosted potential higher than an external supply potential, and the sub-word line non-selection signal has a state of being at an internal lowered potential lower than the external supply potential, the sub-word line drive sections and the sense amplifier sections are placed to intersect each other, and each of the sub-word line non-selection signal generation circuits is placed in an intersection region between the sub-word line drive section and the sense amplifier section, and composed of an inverter receiving the sub-word line drive signal.

By the above configuration, the sub-word line non-selection signal generation circuit can be composed of an inverter, a comparatively small circuit. This reduces the number of circuits to be located in each comparatively small intersection region, and thus allows for adoption of a circuit configuration suitable for high integration.

The sixth embodiment of the semiconductor integrated circuit device according to the present invention has a number of MOS transistors and lines integrated on a semiconductor substrate. The device comprises: main word lines and a plurality of sub-word lines branching from each of the main word lines; a plurality of bit lines extending to intersect the plurality of sub-word lines; memory cell arrays each including a plurality of memory cells arranged in a matrix, the memory cells being connected with the sub-word lines and the bit lines; sense amplifier sections each including a plurality of sense amplifiers connected with the bit lines; main-word line drive signal generation circuits for generating a main word line drive signal; sub-word line drive signal generation circuits for generating a sub-word line drive signal; sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein each of the sub-word line drive circuits includes a first MOS transistor having a gate connected to the main word line and a source or a drain receiving the sub-word line drive signal for selecting the sub-word line, and a second MOS transistor having a gate receiving the sub-word line non-selection signal for inactivating the sub-word line, and when the sub-word line drive circuit is to be selected, the second MOS transistor is first turned off before the sub-word line is selected, and when the selected sub-word line drive circuit is to be inactivated, the sub-word line is first inactivated before the main word line drive signal is inactivated.

By the above configuration, a through current is prevented from flowing due to the potential difference between the boosted potential and the ground potential of the sub-word line drive signal, generated by the state shift of the main word line drive signal. This reduces the charge supply amount of the boosted potential generation having a comparatively low supply capacity.

DESCRIPTION OF THE PREFERRED EMBODIMENTS

Hereinafter, a preferred embodiment of the present invention will be described with reference to the accompanying drawings.

(Overall configuration of semiconductor memory device)

Figure 1:
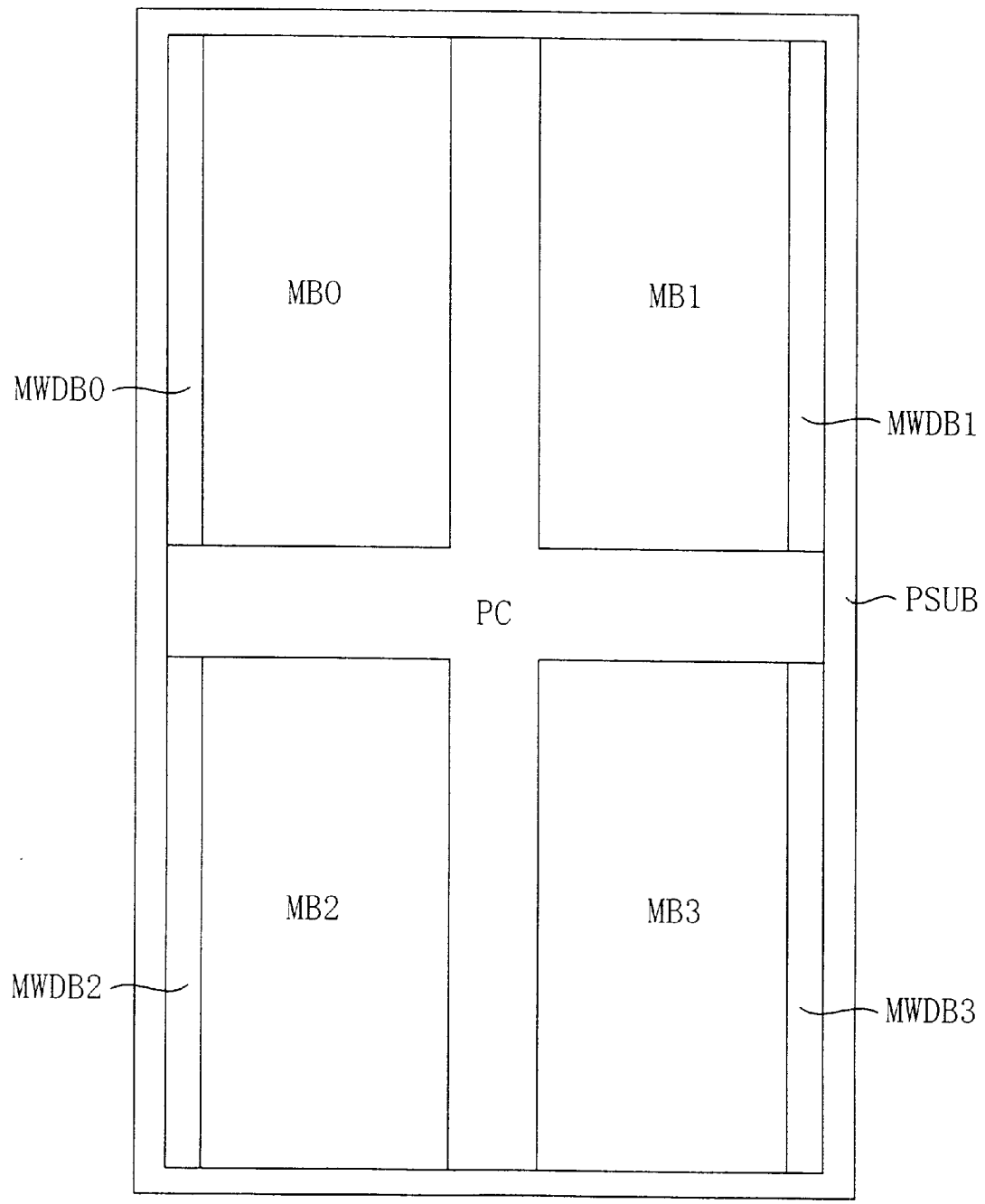
FIG. 1 is a block layout of an embodiment of a DRAM to which the present invention is applied.

FIG. 1 is a block layout of a DRAM (semiconductor memory device), an embodiment of the semiconductor integrated circuit device according to the present invention. Circuit elements constituting the respective blocks shown in FIG. 1 comprise insulating gate type field effect transistors (hereinafter, referred to as channel MOS transistors) that are formed on a single semiconductor substrate made of single-crystal silicon, for example. In the circuit diagrams referred to in the following description, channel MOS transistors having an outward arrow at the channel (back-gate) thereof represent p-channel MOS transistors, while those having no such arrow represent n-channel MOS transistors.

As shown in FIG. 1, the DRAM of this embodiment includes four large memory cell blocks MB0 to MB3 as basic components and four main word line drive circuit blocks MWDB0 to MWDB3 placed adjacent to the respective large memory cell blocks MB0 to MB3.

Each of the large memory cell blocks MB0 to MB3 includes 128 sub-memory cell arrays SMA arranged in a lattice as will be described later (see FIG. 2). Also included are: sub-word line drive sections SWLB including sub-word line drive circuits; main word line drive circuits which generate a main word line drive signal for selecting main word lines to be connected to the sub-word line drive circuits; sub-word line drive signal generation circuits WDG connected to the sub-word line drive circuits for supplying a selected potential to the sub-word lines; sub-word line non-selection signal generation circuits XWDG connected to the sub-word line drive circuits for inactivating the sub-word lines; and sense amplifier sections SAB including unit amplifier circuits. Each sub-memory cell array SMA, together with the sub-word line drive sections SWLB located on two opposite sides thereof laterally as is viewed from the figure and the sense amplifier sections SAB located on two opposite sides thereof vertically as is viewed from the figure, are hereinafter called a sub-memory block. In the intersection regions between the sub-word line drive sections SWLB and the sense amplifier sections SAB are placed the sub-word line non-selection signal generation circuits XWDG. A plurality of such sub-memory blocks each composed of the sub-memory cell array and the periphery thereof are arranged in a lattice. Over the lattice of 128 sub-memory cell arrays are placed main word lines MWL driven by the main word line drive circuits. Specific configurations, operations, and layouts of the large memory cell blocks MB0 to MB3 and the sub-memory cell arrays constituting each large memory cell block will be described later in detail.

Hereinbelow, the chip layout of the DRAM of this embodiment will be outlined. Note that in the following description with reference to the layouts, the positional indications (upper, lower, right, left, vertical, and lateral) on components in the plane of a chip and others are represented by the positional relationship in the plane of the respective layout drawings.

The DRAM of this embodiment shown in FIG. 1 is formed on a p-type semiconductor substrate PSUB in a so-called lead on chip (LOC) form, where periphery circuits PC including bonding pads for bonding inner leads to the semiconductor substrate PSUB, address input buffers, data output buffers, and other control circuits are placed in a cross-shaped region formed along vertical and lateral center lines of the semiconductor substrate PSUB. The large memory cell blocks MB0, MB1, MB2, and MB3 are located upper left, upper right, lower left, and lower right, respectively, of the semiconductor substrate PSUB. The main word line drive circuit blocks MWDB0 to MWDB3 each including a number of main word line drive circuits are placed adjacent to the large memory cell blocks MB0 to MB3, respectively. In this embodiment, the main word line drive circuit blocks MWDB0 to MWDB3 are placed on the sides of the respective large memory cell blocks MB0 to MB3 closer to the edges of the semiconductor substrate PSUB.

The quantity and positions of the large memory cell blocks and those of the main word line drive circuit blocks are not limited to those shown in FIG. 1.

(Configuration of large memory cell block)

Figure 2:
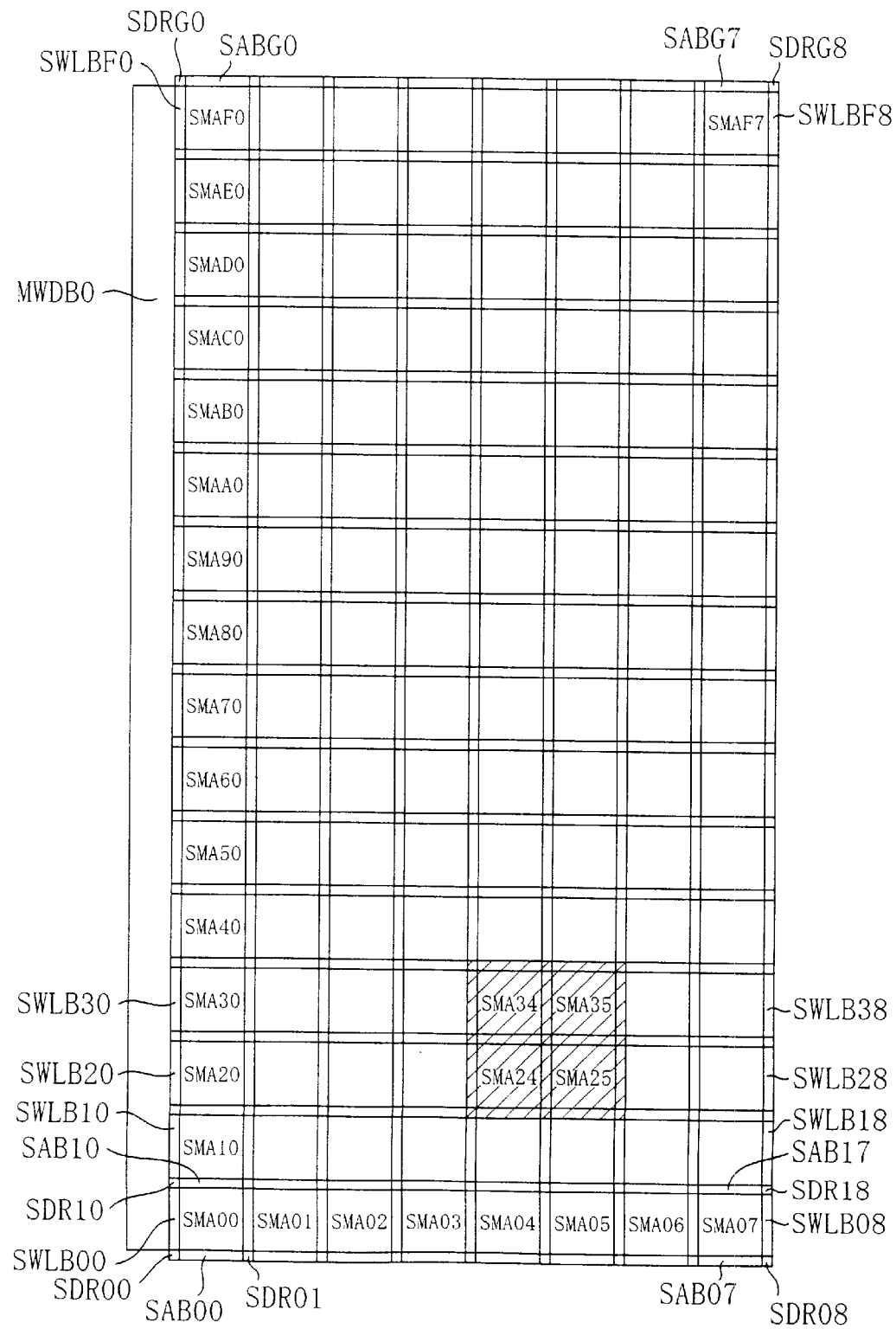
FIG. 2 is a block diagram of a large memory cell block of the DRAM according to the present invention.

FIG. 2 is a block diagram of the large memory cell block MB0 of the DRAM shown in FIG. 1. It would be understood that the other memory cell blocks MB1 to MB3 have the same configuration as that described below on the large memory cell block MB0.

Referring to FIG. 2, the large memory cell block MB0 includes 128 sub-memory cell arrays SMA00 to SMAF7 arranged in a 16×8 matrix. The periphery of the sub-memory cell arrays SMA00 to SMAF7 includes the sub-word line drive sections SWLB running in the vertical direction, the sense amplifier sections SAB running in the lateral direction, and intersection regions SDR between the sub-word line drive sections SWLB and the sense amplifier sections SAB. For example, focusing on the bottom row of the sub-memory cell arrays (SMA00 to SMA07), nine sub-word line drive sections SWLB00 to SWLB08 are placed from left to right in both ends of the row and respective spaces between the adjacent sub-memory cell arrays SMA00 to SMA07. Eight sense amplifier sections SAB00 to SAB07 and nine intersection regions SDR00 to SDR08 are alternately placed left to right on the lower side of the bottom row of sub-memory cell arrays, and eight sense amplifier sections SAB10 to SAB17 and nine intersection regions SDR10 to SDR18 are alternately placed left to right on the upper side of the bottom row of sub-memory cell arrays. Focusing on the leftmost column of sub-memory cell arrays (SMA00 to SMAF0), 17 sub-word line drive sections SWLB00 to SWLBF0 and 18 intersection regions SDR00 to SDRG0 are alternately placed from bottom upward on the left side of the leftmost column of sub-memory cell arrays, and 17 sub-word line drive sections SWLB01 to SWLBF1 and 18 intersection regions SDR01 to SDRG1 are alternately placed from bottom upward on the right side of the leftmost column of sub-memory cell arrays.

Although not shown in FIG. 2, main word lines extend laterally from the main word line drive circuits placed on the left side of the large memory cell block MB0 and each connected with a plurality of sub-word line drive circuits in the sub-word line drive sections SWLB of the large memory cell block MB0. This configuration enables a plurality of sub-word line drive circuits in the sub-word line drive sections SWLB to be selected in response to an external row address via the main word line drive circuit and the main word line. For example, two sub-word line drive circuits in each of nine sub-word line drive sections SWLB20 to SWLB28 are selected simultaneously via one main word line.

(Configuration of periphery of sub-memory cell array)

Examples of the configuration of the peripheries of the sub-memory cell arrays shown in FIG. 2 will be described.

First Example

The first example of the peripheries of the sub-memory cell arrays will be described focusing on the peripheries of four sub-memory cell arrays SMA24, SMA25, SMA34, and SMA35 of the large memory cell block MB0 shown in FIG. 2.

Figure 3:
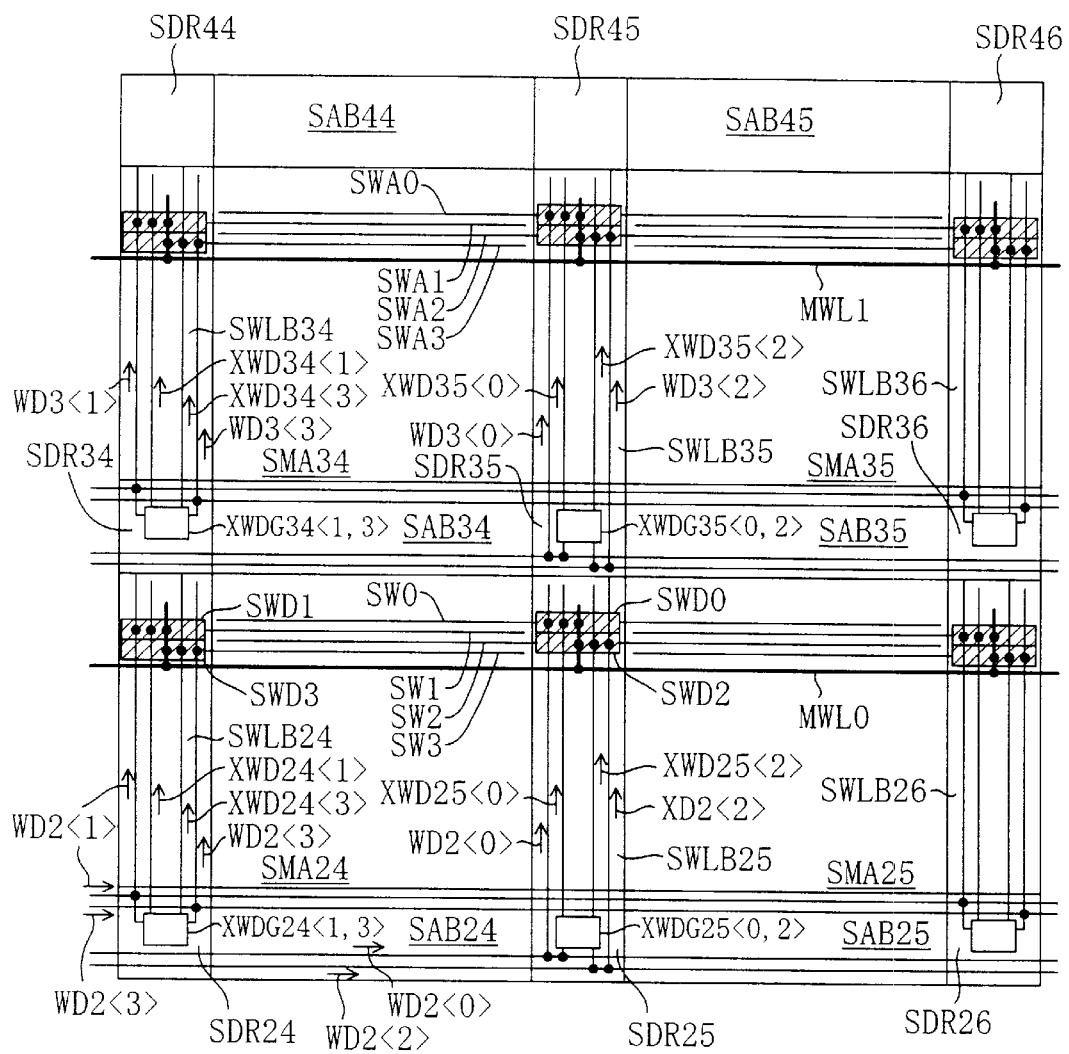
FIG. 3 is a block diagram of a first example of the peripheries of sub-memory cell arrays in the large memory cell block shown in FIG. 2.

FIG. 3 is a partial block diagram of the first example of the periphery configuration, showing the peripheries of the sub-memory cell arrays SMA24, SMA25, SMA34, and SMA35. It would be understood that the peripheries of the other sub-memory cell arrays have the same configuration as the illustrated one.

Sub-word line drive sections SWLB24 and SWLB25 are placed on the left and right sides of the sub-memory cell array SMA24, for example, and sense amplifier sections SAB34 and SAB24 are placed on the upper and lower sides thereof. Intersection regions SDR are placed at respective intersections between the sub-word line drive sections and the sense amplifier sections. For example, an intersection region SDR35 is located between the sub-word line drive sections SWLB25 and SWLB35 and between the sense amplifier sections SAB34 and SAB35. In this example, sub-word line non-selection signal generation circuits XWDG are placed in the respective intersection regions SDR. For example, sub-word line non-selection signal generation circuits XWDG35<0,2> are placed in the intersection region SDR35. The sub-word line non-selection signal generation circuits XWDG35<0,2> refer to circuits generating a plurality of signals, i.e., sub-word line non-selection signals XWD35<0> and XWD35<2>.

A total of 512 sub-word lines SW (SW0 to SW511) run laterally in the sub-memory cell array SMA24 (only four sub-word lines SW0 to SW3 are shown in FIG. 3). Although not shown, a total of 256 bit line pairs BIT, XBIT (BIT0, XBIT0 to BIT255, XBIT255) run vertically in the sub-memory cell array SMA24. In the following description, codes representing an inverted signal and an inverted signal line are given the prefix "X" unless otherwise mentioned.

The number of sub-word lines and the number of bit line pairs are not limited to those used in this example.

At the respective intersections between the sub-word lines and the bit lines, a total of 512×256 dynamic memory cells composed of information accumulation capacitors and address selective MOS transistors are arranged in a matrix. With this configuration, each of the sub-memory cell arrays SMA00 to SMAF7 has a so-called 128 Kbit dynamic memory capacity, each of the large memory cell blocks MB0 to MB3 has a 128×128, i.e., 16 Mbit memory capacity, and the DRAM has a 16×4, i.e., 64 Mbit memory capacity.

A total of 256 sub-word line drive circuits SWD1, SWD3, . . . are placed in the sub-word line drive section SWLB24 for respective connections to the odd-numbered sub-word lines SW1, SW3, . . . in the sub-memory cell array SMA24. Likewise, a total of 256 sub-word line drive circuits SWD2, SWD5, . . . are placed in the sub-word line drive section SWLB25 located between the sub-memory cell arrays SMA24 and SMA25, for respective connections to the even-numbered sub-word lines SW0, SW2, . . . in the sub-memory cell array SMA24. That is, each sub-word line drive circuit SWD generates a sub-word line activating signal to be transmitted to memory cells in two sub-memory cell arrays SMA on both sides thereof. This indicates that the two sub-word lines SW in the adjacent sub-memory cell arrays SMA are electrically connected with each other.

Hereinbelow, the signal transmission routes to the respective sub-word line drive circuits SWD and the method of selection of the sub-word line drive circuit SWD will be described. Each sub-word line drive circuit SWD is configured to receive a main word line drive signal, a sub-word line drive signal WD, and a sub-word line non-selection signal XWD. These signals are transmitted in response to a row address input externally.

First, the transmission route of the main word line drive signal will be described. The main word line drive signal is generated in the main word line drive circuit in the main word line drive circuit block MWDB located adjacent to the large memory cell block MB, and input into the large memory cell block MB via a main word line MWL. Each main word line MWL is connected to a plurality of sub-word line drive circuits SWD in a plurality of sub-word line drive sections SWLB. In the illustrated example, a main word line MWL0 is connected to two sub-word line drive circuits SWD in each of the sub-word line drive sections SWLB20 to SWLB27 in a lateral row, e.g., two sub-word line drive circuits SWD1 and SWD3 in the sub-word line drive section SWLB24, and two sub-word line drive circuits SWD0 and SWD2 in the sub-word line drive section SWLB25. That is, with each two sub-word line drive circuits SWD being connected to one main word line MWL, a total of 2×9 sub-word line drive circuits SWD are commonly connected to one main word line MWL in one large memory cell block MB.

Next, the transmission routes of the sub-word line drive signal WD and the sub-word line non-selection signal XWD will be described. Sub-word line drive signals WD2<0,2>, for example, are generated in the periphery circuit PC or the main word line drive circuit. In the illustrated example, lines for the sub-word line drive signals WD2<0,2>, which are formed of a metal layer or the like, extend in the sense amplifier sections SAB24 and SAB25, and branched at the intersection region SDR25 to extend vertically. The branched lines for the sub-word line drive signals WD2<0, 2>, which are formed of a metal layer or the like, extend in the sub-word line drive section SWLB25 and connected to the sub-word line drive circuits SWD0 and SWD2, respectively. Likewise, sub-word line drive signals WD2<1,3>, for example, are generated in the periphery circuit PC or the main word line drive circuit. Lines for the sub-word line drive signals WD2<1,3>, which are formed of a metal layer or the like, extend in the sense amplifier sections SAB24 and SAB25 and branched at the intersection regions SDR24 and SDR26 to extend vertically. The branched lines for the sub-word line drive signals WD2<1,3>, which are made of a metal layer or the like, extend in the sub-word line drive sections SWLB24 and SWLB26 and connected to the sub-word line drive circuits SWD1 and SWD3, respectively. In other words, the sub-word line drive signal WD generated outside the large memory cell block MB passes through the line in the sense amplifier sections SAB, branched at every odd-numbered or even-numbered intersection regions, i.e., every other intersection regions, and passes through the lines in the sub-word line drive sections SWLB, to be input into the sub-word line drive circuits SWD. Specifically, each of the sub-word line drive signals WD2<0,2> is input into four sub-word line drive circuits in the sub-word line drive sections SWLB21, SWLB23, SWLB25, and SWLB27, and each of the sub-word line drive signals WD2<1,3> is input into four sub-word line drive circuits in the sub-word line drive sections SWLB20, SWLB22, SWLB24, and SWLB26 for selecting corresponding sub-word lines.

The transmission route of the sub-word line non-selection signal XWD is as follows. The sub-word line non-selection signal XWD is generated by the sub-word line non-selection signal generation circuit placed in each of the intersection regions SDR between the sub-word line drive sections SWLB and the sense amplifier sections SAB, based on the sub-word line drive signal which is input into the sub-word line non-selection signal generation circuit. In the example shown in FIG. 3, the sub-word line drive signals WD2<0,2> transmitted through the lines in the sense amplifier section SAB24 are input into sub-word line non-selection signal generation circuits XWDG25<0,2>, which then generates the sub-word line non-selection signals XWD25<0,2>. Lines for the sub-word line non-selection signals XWD25<0,2>, which are formed of a metal layer or the like, extend in the sub-word line drive section SWLB and connected to the sub-word line drive circuits SWD0 and SWD2, respectively. The sub-word line non-selection signal generation circuits XWDG<0,2> are formed in the odd-numbered intersection regions along one row, while sub-word line non-selection signal generation circuits XWDG<1,3> are formed in the even-numbered intersection regions along the row.

The lines for the sub-word line drive signal WD and the sub-word line non-selection signal XWD are connected to every other sub-word line drive circuits SWD, not all of them, placed in the sub-word line drive section SWLB. Therefore, each of the lines for the sub-word line drive signal WD and for the sub-word line non-selection signal WXD is connected to a total of 128 sub-word line drive circuits SWD in each sub-word line drive section SWLB.

As described above, the operation of each sub-word line drive circuit SWD is controlled by the main word line drive signal, the sub-word line drive signal WD, and the sub-word line non-selection signal XWD. The operation of the sub-word line drive circuit SWD will be described later in detail.

Thus, in this example, the number of MOS transistors driven with one sub-word line drive signal WD is reduced, in comparison with the prior art technique where one sub-word line non-selection signal XWD is commonly connected to a plurality of, e.g., nine sub-word line drive sections SWLB, by providing the sub-word line non-selection signal generation circuits XWDG in each intersection region SDR. This increases the potential shift speed of the sub-word line drive signal WD. In particular, if it becomes possible to turn the sub-word line drive signal WD to the low level from the high level at a higher speed when the sub-word line SW is selected, a transient current flowing through the sub-word line drive circuit SWD can be suppressed. This contributes to reducing power consumption. This effect will be described later in detail.

Second Example

The second example of the peripheries of the sub-memory cell arrays will be described focusing on the peripheries of four sub-memory cell arrays SMA24, SMA25, SMA34, and SMA35 of the large memory cell block MB0 shown in FIG. 2.

Figure 4:
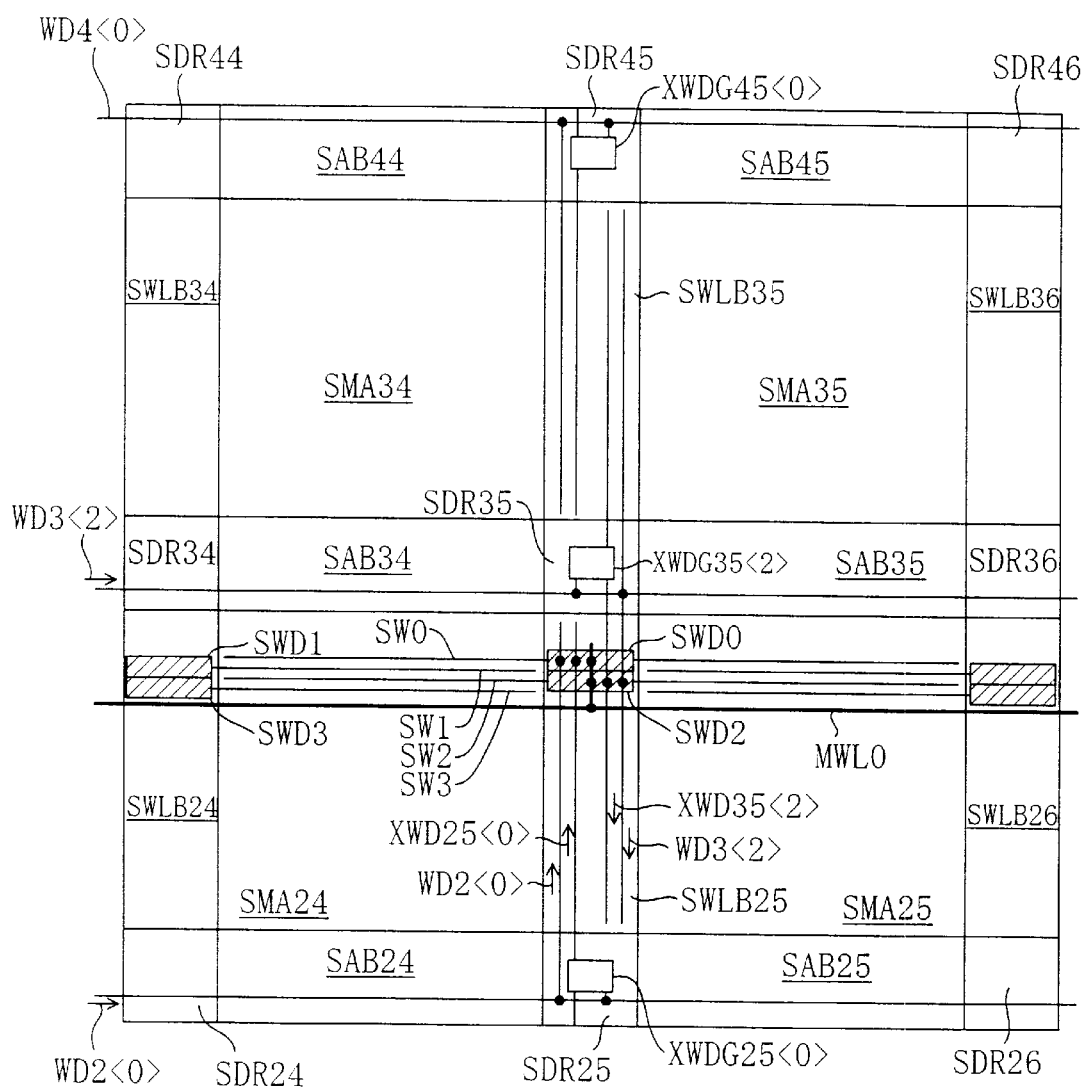
FIG. 4 is a block diagram of a second example of the peripheries of sub-memory cell arrays in the large memory cell block shown in FIG. 2.

FIG. 4 is a partial block diagram of the second example of the periphery configuration, showing the peripheries of the sub-memory cell arrays SMA24, SMA25, SMA34, and SMA35. It would be understood that the peripheries of the other sub-memory cell arrays have the same configuration as the illustrated one. In this example, only the difference from the first example shown in FIG. 3 will be discussed.

In the first example, two sub-word line non-selection signal generation circuits XWDG are provided in each intersection region SDR. In the second example, only one sub-word line non-selection signal generation circuit XWDG is provided in each intersection region SDR. Specifically, as shown in FIG. 4, only a sub-word line non-selection signal generation circuit XWDG25<0> is provided in an intersection region SDR25 for generating a sub-word line non-selection signal XWD25<0>, only a sub-word line non-selection signal generation circuit XWDG35<2> is provided in an intersection region SDR35 for generating a sub-word line non-selection signal XWD35<2>, and only a sub-word line non-selection signal generation circuit XWDG45<0> is provided in an intersection region SDR45 for generating a sub-word line non-selection signal XWD45<0>. The line for the sub-word line non-selection signal XWD25<0> is connected to the upper and lower sub-word line drive sections SWLB15 and SWLB25, the line for the sub-word line non-selection signal XWD35<0> is connected to the upper and lower sub-word line drive sections SWLB25 and SWLB35, and the line for the sub-word line non-selection signal XWD45<0> is connected to the upper and lower sub-word line drive sections SWLB35 and SWLB45.

Referring to FIG. 2, in an n-th intersection region SDRn5 (n is an even number) in the vertical direction (which also represents the first and subsequent every other intersection regions in the lateral direction), a generation circuit XWDGn5<0> for a sub-word line non-selection signal XWDn5<0> is placed. In an m-th intersection region SDRm5 (m is an odd number) in the vertical direction, a generation circuit XWDGm5<2> for a sub-word line non-selection signal XWDm5<2> is placed. Likewise, in an n-th intersection region SDRn4 in the vertical direction (which also represents the second and subsequent every other intersection regions in the lateral direction), a generation circuit XWDGn4<1> for a sub-word line non-selection signal XWDn4<1> is placed. In an m-th intersection region SDRm4 in the vertical direction, a generation circuit XWDGm4<3> for a sub-word line non-selection signal XWDm4<3> is placed.

In short, in an intersection region SDRnx located n-th in the vertical direction and x-th (x is an even number) in the lateral direction, a generation circuit XWDGnx<0> for a sub-word line non-selection signal XWDnx<0> is placed. In an intersection region SDRmx located m-th in the vertical direction and x-th in the lateral direction, a generation circuit XWDGmx<2> for a sub-word line non-selection signal XWDmx<2> is placed. In an intersection region SDRny located n-th in the vertical direction and y-th (y is an odd number) in the lateral direction, a generation circuit XWDGny<1> for a sub-word line non-selection signal XWDny<1> is placed. In an intersection region SDRmy located m-th in the vertical direction and y-th in the lateral direction, a generation circuit XWDGmy<3> for a sub-word line non-selection signal XWDmy<3> is placed. The configurations of the circuits and lines and the signal transmission routes in this example are substantially the same as those in the first example shown in FIG. 3.

In this example, the areas required for the sub-word line drive sections SWLB and the sense amplifier sections SAB are comparatively reduced, and thus only comparatively small areas are secured for the intersection regions SDR between the two sections. Such a small area is however enough for the intersection region SDR in this example which has only one sub-word line non-selection signal generation circuit XWDG as described above. This reduction in the number of circuits in the intersection regions SDR contributes to adoption of a circuit configuration suitable for high integration.

Third Example

The third example of the peripheries of the sub-memory cell arrays will be described focusing on the peripheries of eight sub-memory cell arrays SMA24, SMA25, SMA34, SMA35, SMA44, SMA45, SMA54, and SMA55 of the large memory cell block MB0 shown in FIG. 2.

Figure 5:
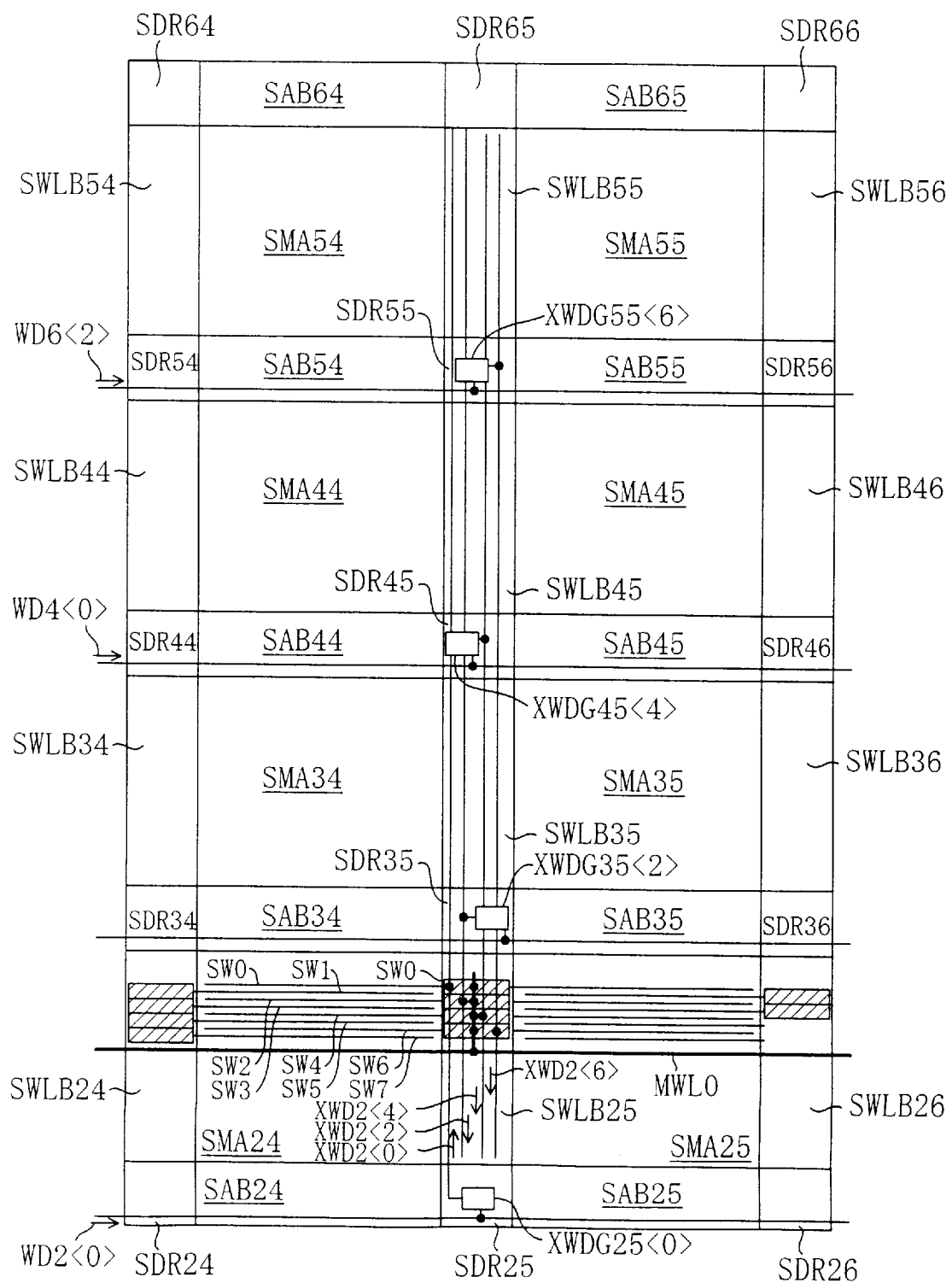
FIG. 5 is a block diagram of a third example of the peripheries of sub-memory cell arrays in the large memory cell block shown in FIG. 2.

FIG. 5 is a partial block diagram of the third example of the periphery configuration, showing the peripheries of the sub-memory cell arrays SMA24, SMA25, SMA34, SMA35, SMA44, SMA45, SMA54, and SMA55. It would be understood that the peripheries of the other sub-memory cell arrays have the same configuration as the illustrated one. In this example, only the difference from the first example shown in FIG. 3 will be discussed.

In the first example, two sub-word line non-selection signal generation circuits XWDG are provided in each intersection region SDR. In the third example, only one sub-word line non-selection signal generation circuit XWDG is provided in each intersection region SDR, as in the second example. Also, in each sub-word line drive section SWLB, four lines for sub-word line drive signals WD are sequentially connected to sub-word line drive circuits SWD. Four lines for sub-word line non-selection signals SWD are also sequentially connected to the sub-word line drive circuits SWD. More specifically, as shown in FIG. 5, only a sub-word line non-selection signal generation circuit XWDG25<0> is provided in an intersection region SDR25 for generating a sub-word line non-selection signal XWD25<0>, only a sub-word line non-selection signal generation circuit XWDG35<2> is provided in an intersection region SDR35 for generating a sub-word line non-selection signal XWD35<2>, only a sub-word line non-selection signal generation circuit XWDG45<4> is provided in an intersection region SDR45 for generating a sub-word line non-selection signal XWD45<4>, and only a sub-word line non-selection signal generation circuit XWDG55<6> is provided in an intersection region SDR55 for generating a sub-word line non-selection signal XWD55<6>. Lines for the sub-word line non-selection signals XWD25<0>, XWD35<2>, XWD45<4>, and XWD55<6> are connected to at least four sub-word line drive sections SWLB25 to SWLB55.

For example, in an n-th column (n is an even number) in the lateral direction in FIG. 2, sub-word line non-selection signal generation circuits XWDG<0,2,4,6> for respectively generating sub-word line non-selection signals XWD<0,2,4,6> are respectively placed in every four intersection regions in the vertical direction. Likewise, in an m-th column (m is an odd number) in the lateral direction in FIG. 2, sub-word line non-selection signal generation circuits XWDG<1,3,5,7> for respectively generating sub-word line non-selection signals XWD<1,3,5,7> are respectively placed in every four intersection regions in the vertical direction. The configurations of the circuits and lines and the signal transmission routes in this example are substantially the same as those in the first example shown in FIG. 3. Although not shown in FIG. 5 for easier understanding, it would be understood that lines for sub-word line drive signals WD are arranged as in the second example described above.

In this example, the areas required for the sub-word line drive sections SWLB and the sense amplifier sections SAB are comparatively reduced, and thus only comparatively small areas are secured for the intersection regions SDR between the two sections. Such a small area is however enough for the intersection region SDR in this example which has only one sub-word line non-selection signal generation circuit XWDG as described above. This reduction in the number of circuits in the intersection regions SDR contributes to adoption of a circuit configuration suitable for high integration.

Moreover, in this example, the number of times of selection of each sub-word line drive signal WD is reduced to one-fourth from a half in the first example. This reduces the number of times of selection done by the main word lines MWL in each sub-memory cell array, whereby the pitch of the main word lines MWL can be doubled. This facilitates the fabrication process of the main word lines MWL and reduces the probability of a trouble due to short-circuiting between main word lines MWL.

Fourth Example

The fourth example of the peripheries of the sub-memory cell arrays will be described focusing on the peripheries of four sub-memory cell arrays SMA24, SMA25, SMA34, and SMA35 of the large memory cell block MB0 shown in FIG. 2.

Figure 6:
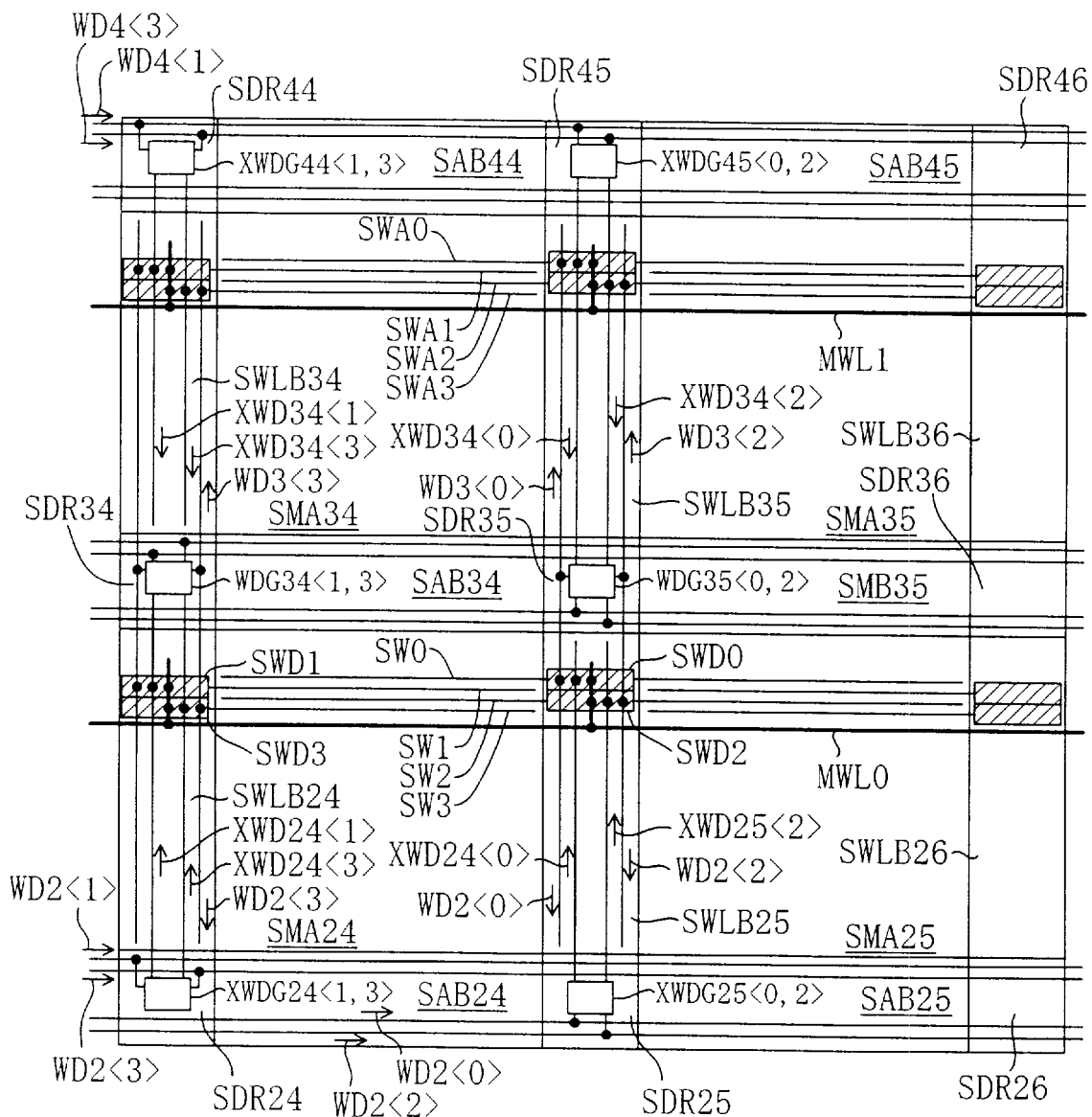
FIG. 6 is a block diagram of a fourth example of the peripheries of sub-memory cell arrays in the large memory cell block shown in FIG. 2.

FIG. 6 is a partial block diagram of the fourth example of the periphery configuration, showing the peripheries of the sub-memory cell arrays SMA24, SMA25, SMA34, and SMA35. It would be understood that the peripheries of the other sub-memory cell arrays have the same configuration as the illustrated one. In this example, only the difference from the first example shown in FIG. 3 will be discussed.

In the first example, all intersection regions SDR include two sub-word line non-selection signal generation circuits XWDG. In the fourth example, some intersection regions SDR include sub-word line drive signal generation circuits WDG only. More precisely, intersection regions SDR including sub-word line non-selection signal generation circuits XWDG and intersection regions SDR including sub-word line drive signal generation circuits WDG are alternately placed in the vertical direction. Specifically, referring to FIG. 6, an intersection region SDR25 includes only sub-word line non-selection signal generation circuits XWDG25<0,2> for generating sub-word line non-selection signals XWD25<0,2>, an intersection region SDR35 includes only sub-word line drive signal generation circuits WDG35<0,2> for generating sub-word line drive signals WD25<0,2>, and an intersection region SDR45 includes only sub-word line non-selection signal generation circuits XWDG45<0,2> for generating sub-word line non-selection signal XWD45<0,2>. Lines for the sub-word line non-selection signals XWD25<0,2> are connected to upper and lower sub-word line drive sections SWLB15 and SWLB25, lines for the sub-word line drive signals WD35<0,2> are connected to upper and lower sub-word line drive sections SWLB25 and SWLB35, and lines for the sub-word line non-selection signals XWD45<0,2> are connected to upper and lower sub-word line drive sections SWLB35 and SWLB45. The configurations of the circuits and lines and the signal transmission routes in this example are substantially the same as those in the first example shown in FIG. 3.

In this example, the areas required for the sub-word line drive sections SWLB and the sense amplifier sections SAB are comparatively reduced, and thus only comparatively small areas are secured for the intersection regions SDR between the two sections. Such a small area is however enough for the intersection region SDR in this example which has either sub-word line non-selection signal generation circuits XWDG or sub-word line drive signal generation circuits WDG as described above. This reduction in the number of circuits in the intersection regions SDR contributes to adoption of a circuit configuration suitable for high integration.

(Configuration of sub-word line drive section)

Examples of the configuration of the sub-word line drive section SWLB will be described.

First Example

Figure 7A:
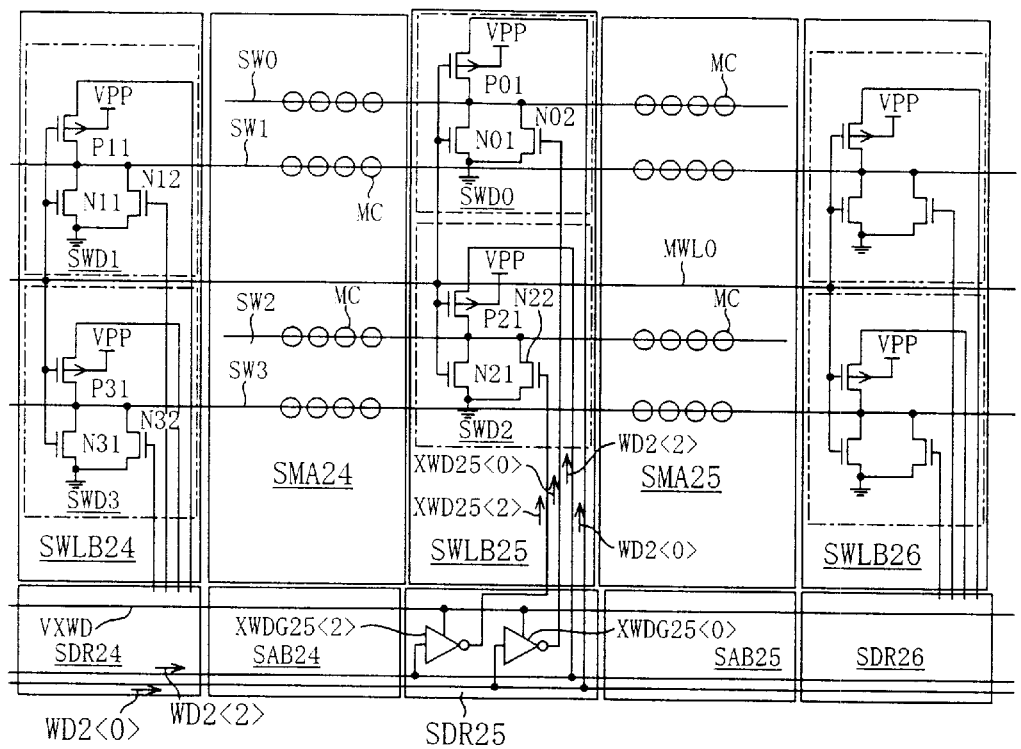
FIGS. 7(a) and 7(b) are a circuit diagram and a timing chart, respectively, of a first example of the sub-word line drive section shown in FIG. 3.
Figure 7B:
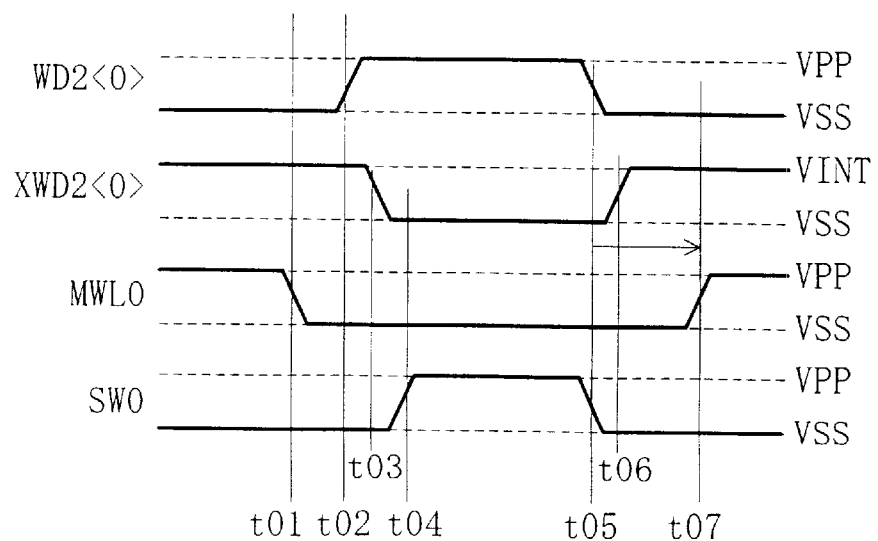

FIGS. 7(a) and 7(b) are a circuit diagram of the first example of the configuration of the sub-word line drive section and a timing chart of the circuit operation, respectively. The following description of this example is based on the configuration shown in FIG. 3: Specifically, configuration and operations of the sub-memory cell arrays SMA24 and SMA25 with the sub-word lines SW0 to SW3, memory cells MC connected to these sub-word lines, the sub-word line drive circuits SWD0 to SWD3, and the sub-word line non-selection signal generation circuits XWDG25<0,2> formed in the intersection region SDR are used to describe the first example of the sub-word line drive section. It would be understood that the sub-word line drive section SWLB of this example is also applicable to the configurations shown in FIGS. 4 to 6.

As described above, a main word line MWL0 extends from the main word line drive circuit block MWDB0 located adjacent to the large memory cell block MB0, and is commonly connected to two sub-word line drive circuits SWD in each of the sub-word line drive sections SWLB in one row, such as two sub-word line drive circuits SWD1 and SWD3 among a number of sub-word line drive circuits SWD in the sub-word line drive sections SWLB24 and two sub-word line drive circuits SWD0 and SWD2 in the sub-word line drive sections SWLB25 shown in FIG. 7(a). More precisely, the main word line MWL0 is connected to gate electrodes of p-channel MOS transistors P01, P11, P21, and P31 for raising the potential of the sub-word lines SW0 to SW3 corresponding to the sub-word line drive circuits SWD0 to SWD3 to the active level, i.e., an internal boosted potential VPP, and gate electrodes of n-channel MOS transistors N0, N11, N21, and N31 for lowering the potential of the sub-word lines SW to the inactive level, i.e., the ground potential VSS.

As described above, sub-word line drive signals WD2<0–3> are generated in the periphery circuit PC or the main word line drive circuit MWDB. They are coupled with sub-word line drive circuits SWD in the odd-numbered or even-numbered sub-word line drive sections SWLB in the lateral direction in FIG. 2, as well as with sub-word line non-selection signal generation circuits XWDG in the odd-numbered or even-numbered intersection regions SDR. More specifically, as shown in FIG. 7(a), a line for the sub-word line drive signal WD2<0> is connected to an input gate of the sub-word line non-selection signal generation circuit XWDG25<0> as an inverter in the intersection region SDR25, as well as to the source region of the p-channel MOS transistor P01 of the sub-word line drive circuit SWD0 in the sub-word line drive section SWLB25. Likewise, a line for the sub-word line drive signal WD2<2> is connected to an input gate of the sub-word line non-selection signal generation circuit XWDG25<2> as an inverter in the intersection region SDR25, as well as to the source region of the p-channel MOS transistor P21 of the sub-word line drive circuit SWD2 in the sub-word line drive section SWLB25.

The sub-word line non-selection signal XWD is generated by the sub-word line non-selection signal generation circuit XWDG placed in each Intersection region SDR based on the sub-word line drive signal WD received by the circuit WXDG, and is input into sub-word line drive circuits SWD in the sub-word line drive section SWLB located above adjacent to the intersection region SDR. More specifically, the sub-word line non-selection signal XWD25<0> is generated by the sub-word line non-selection signal generation circuit XWDG25<0> as an inverter placed in the intersection region SDR25 based on the sub-word line drive signal WD2<0> received by the circuit XWDG25<0>. The line for the sub-word line non-selection signal XWD25<0> is connected to the gate electrode of an n-channel MOS transistor N02 constituting the sub-word line drive circuit SWD0 in the sub-word line drive section SWLB25 located above adjacent to the intersection region SDR25. Likewise, the sub-word line non-selection signal XWD25<2> is generated by the sub-word line non-selection signal generation circuit XWDG25<2> as an inverter placed in the intersection region SDR25 based on the sub-word line drive signal WD2<2> received by the XWDG25<2>. The line for the sub-word line non-selection signal XWD25<2> is connected to the gate electrode of an n-channel MOS transistor N22 constituting the sub-word line drive circuit SWD2 in the sub-word line drive section SWLB25 located above adjacent to the intersection region SDR25. In the illustrated example, the sub-word line non-selection signal generation circuit is composed of an inverter. It may also be composed of a NAND circuit, a NOR circuit, or the like. Otherwise, a plurality of logic circuits may be combined to provide the function of generating a sub-word line non-selection signal.

The operation of the sub-word line drive circuit SWD will be described with reference to FIG. 7(b). Herein described specifically with reference to FIG. 7(b) are the operation that the sub-word line drive circuit SWD0 in the sub-word line drive section SWLB25 is selected to raise the sub-word line SW0 to the active level, i.e., the internal boosted potential VPP, and the operation that the sub-word line drive circuit SWD0 is inactivated to lower the sub-word line SW0 to the inactive level, i.e., the ground potential VSS.

First, as is shown by the third waveform of the timing chart of FIG. 7(b), the main word line MWL0 is lowered from the inactive level, i.e., the internal boosted potential VPP, to the active level, i.e., the ground potential VSS, at timing t01 in response to an input of an external row address, so as to select the sub-word line drive circuit SWD0, as well as the sub-word line drive circuits SWD0 to SWD3, in the sub-word line drive sections SWLB24 and SWLB25, changing the state of the MOS transistors constituting the sub-word line drive circuits SWD0 to SWD3. More specifically, the main word line MWL0 is connected to the gate electrodes of the p-channel MOS transistor P01 and the n-channel MOS transistor N01 of the sub-word line drive circuit SWD0. With the potential change from the internal boosted potential VPP to the ground potential VSS of the main word line MWL0, the n-channel MOS transistor N01 is turned from the ON to OFF state. Likewise, the n-channel MOS transistors N11 to N31 of the sub-word line drive circuits SWD1 to SWD3 are turned from the ON to OFF state. Nevertheless, although the potential of the main word line MWL0 has changed to the ground potential VSS as the active level, the sub-word lines SW0 to SW3 are still kept at the ground potential VSS as the inactive level. This is due to the fact that the sub-word line drive signals WD2<0–3> are still kept at the ground potential VSS as the inactive level, the sub-word line non-selection signals XWD24<1,3> and XWD25<0,2> are still kept at in internal lowered potential VINT, and thus the n-channel MOS transistors N02 to N32 of the sub-word line drive circuits SWD0 to SWD3 are in the ON state. These MOS transistors keep the sub-word lines SW0 to SW3 lowered at the ground potential VSS.

Thereafter, as is shown by the first waveform of the timing chart, at timing t02, the sub-word line drive signal WD2<0> is raised to the active level, i.e., the internal boosted potential VPP from the inactive level, i.e., the ground potential VSS. As a result, as is shown by the second waveform of the chart, at timing t03, the sub-word line non-selection signal XWD25<0> is lowered from the internal lowered potential VINT to the ground potential VSS in response to the boosted potential of the sub-word line drive signal WD2<0> input into the sub-word line non-selection signal generation circuit XWDG25<0> in the intersection region SDR25.

The sub-word line non-selection signal generation circuit XWDG is connected to a line supplying a selected internal lowered potential VXWD, which is used as the supply potential for the circuit. In the illustrated example, the active level of the selected internal lowered potential VXWD is equal to the internal lowered potential VINT, which is therefore used as the inactive level of the sub-word line non-selection signal XWD. In this example, the active level of the selected internal lowered potential VXWD is set at the internal lowered potential VINT. It may also be the external supply potential VDD. Control of the selected internal lowered potential VXWD will be described later. In this example, the internal boosted potential VPP is about 4 V, the internal lowered potential VINT is about 2.5 V, the ground potential is about 0 V, and the external supply potential is about 3.3 V.

The line for the sub-word line drive signal WD2<0> is connected to the source region of the p-channel MOS transistor P01 of the sub-word line drive circuit SWD0. The gate of the p-channel MOS transistor P01 is already at the ground potential VSS in response to the main word line MWL0. Under these conditions, when the sub-word line drive signal WD2<0> is raised to the internal boosted potential VPP from the ground potential VSS, the sub-word line SW0 is also raised to the active level, i.e., the internal boosted potential VPP from the inactive level, i.e., the ground potential VSS at timing t04. At this time, since the sub-word line non-selection signal XWD25<0> has already changed from the internal lowered potential VINT to the ground potential VSS, the n-channel MOS transistor N02 of the sub-word line drive circuit SWD0 is already in the OFF state, preventing the sub-word line SW0 from being lowered to the ground potential VSS.

Meanwhile, since the other sub-word line drive signals WD2<1,2,3> are kept at the inactive level, i.e., the ground potential VSS, the other sub-word line non-selection signals XWD25<2> and XWD24<1,3> are kept at the internal lowered potential VINT. Therefore, the n-channel MOS transistors N12, N22, and N32 of the non-selected sub-word line drive circuits SWD1, SWD2, and SWD3 are in the ON state, keeping the potential at the sub-word lines connected to these drive circuits unchanged. This contributes to keeping the sub-word lines from high impedance.

Next, with continued reference to FIG. 7(b), the operation that the sub-word line drive circuit SWD0 is inactivated to lower the sub-word line SW0 to the inactive level, i.e., the ground potential VSS will be described.

As is shown by the first waveform of the timing chart, at timing t05, when the sub-word line drive signal WD2<0> is lowered from the internal boosted potential VPP as the active level to the ground potential VSS as the inactive level, first, at timing t06, the sub-word line non-selection signal XWD25<0> is raised from the ground potential VSS to the internal lowered potential VINT, as is shown by the second waveform of the timing chart, in response to the sub-word line drive signal WD2<0> input into the sub-word line non-selection signal generation circuit XWDG25<0> in the intersection region SDR25. The line for the sub-word line drive signal WD2<0> is connected to the source region of the p-channel MOS transistor P01 of the sub-word line drive circuit SWD0, and the gate of the p-channel MOS transistor P01 is at the ground potential VSS which is equal to the potential at the main word line MWL0. Under these conditions, when the sub-word line drive signal WD2<0> is lowered from the internal boosted potential VPP to the ground potential VSS at timing t05, the sub-word line SW0 is lowered from the internal boosted potential VPP as the active level to a potential of the ground potential VSS as the inactive level with a threshold voltage Vtp of the p-channel MOS transistor P01 added thereto. Thereafter, as the sub-word line non-selection signal XWD25<0> changes from the ground potential VSS to the internal lowered potential VINT, the n-channel MOS transistor N02 of the sub-word line drive circuit SWD0 is tuned ON. Thus, as is shown by the fourth waveform of the timing chart, the sub-word line SW0 is lowered to the ground potential VSS.

Subsequently, as is shown by the third waveform of the timing chart, at timing t07, the main word line MWL0 is raised from the ground potential VSS as the active level to the internal boosted potential VPP as the inactive level. The main word line MWL0 is connected to the gate electrodes of the p-channel MOS transistor P01 and the n-channel MOS transistor N01 of the sub-word line drive circuit SWD0 as described above. Therefore, with the potential change of the main word line MWL0 from the ground potential to the internal boosted potential VPP, the p-channel MOS transistor P01 is turned from the ON to OFF state, while the n-channel MOS transistor N01 is turned from the OFF to ON state. Likewise, the n-channel MOS transistors N11 to N31 of the sub-word line drive circuits SWD1 to SWD3 change from the OFF to ON state. Thus, with the potential change of the main word line MWL0 to the internal boosted potential VPP as the inactive level, the sub-word lines SW0 to SW3 are kept fixed at the ground potential VSS also by the n-channel MOS transistors N11 to N31 of which gate electrodes are connected to the main word line MWL0.

As described above, the line for the sub-word line non-selection signal XWD is connected to gate electrodes of the n-channel MOS transistors of a number of sub-word line drive circuits SWD in each sub-word line drive section SWLB. In the illustrated example, the line for the sub-word line non-selection signal XWD is connected to gate electrodes of a total of 128 n-channel MOS transistors in each sub-word line drive section SWLB. Moreover, as described above, four or five of the sub-word line drive sections SWLB20 to SWLB28 shown in FIG. 2, for example, are operated simultaneously. Therefore, in the illustrated example, at least 128×4 n-channel MOS transistors are operated simultaneously. This means that a large capacitance of Cn×128×4 wherein Cn denotes the capacitance of the n-channel MOS transistor N02 is required to be charged and discharged.

In this example, the potential difference at charging and discharging of gates of the transistors required for the operation of sub-word line non-selection can be reduced from the conventional potential difference between the internal boosted potential VPP and the ground potential VSS to the potential difference between the internal lowered potential VINT to the ground potential VSS. Power can therefore be saved by the reduction of the potential difference. In other words, power consumption of the entire circuit can be reduced by changing the source for driving the sub-word line non-selection signal XWD from the internal boosted potential generation circuit to a circuit for generating the internal lowered potential VINT (2.5 V in this example) which is lower than the internal boosted potential VPP (4 V in this example).

Further, as described above, in the prior art technique, the line for the sub-word line non-selection signal XWD is commonly connected to a plurality of, e.g., nine sub-word line drive sections SWLB. According to the present invention, the sub-word line non-selection signal generation circuit XWDG is provided in each intersection region SDR, so as to reduce the number of n-channel MOS transistors connected to a common line for the sub-word line non-selection signal XWD. This increases the potential shift speed of the sub-word line non-selection signal XWD. If the shift from the internal lowered potential VINT to the ground potential VSS of the sub-word line non-selection signal XWD is slow when the sub-word line SW is selected, a current flows from the line for the sub-word line drive signal WD which is kept at the internal boosted potential VPP to the ground via the p-channel MOS transistor P01 and the n-channel MOS transistor N02. This occurs because while the main word line MWL0 has already been lowered to the ground potential VSS to turn ON the p-channel MOS transistor P01 and the sub-word line drive signal WD has become the internal boosted potential VPP, the n-channel MOS transistor N02 is not readily turned OFF. By speeding up the shift from the internal lowered potential VINT to the ground potential VSS of the sub-word line non-selection signal XWD as described above, such a through current can be reduced. By saving wasteful power consumption due to such a through current, power consumption of the internal boosted potential generation circuit can be reduced.

Moreover, in the process of the non-selection of the sub-word line SW, the potential at the main word line MWL0 is raised at a sufficient interval from the previous lowering of the sub-word line drive signal WD2<0> to the ground potential VSS. This prevents a through current from flowing in the sub-word line drive circuit SWD0 from the p-channel transistor P01 and the n-channel MOS transistor N01 to the ground in response to the sub-word line drive signal WD2<0>. If the main word line MWL0 is first raised from the ground potential VSS to the internal boosted potential VPP before the sub-word line drive signal WD is lowered from the internal boosted potential VPP to the ground potential VSS, there exists a state allowing the p-channel MOS transistor P01 and the n-channel MOS transistor N01 to be turned ON simultaneously during the period in which the main word line MWL0 is raised from the level of [ground potential VSS+threshold voltage Vtn of n-channel MOS transistor N0] to the level of [internal boosted potential VPP—threshold voltage Vtp of p-channel MOS transistor P01]. In such a state, a through current flows from the line for the sub-word line drive signal WD to the ground. In order to avoid this occurrence, the sub-word line drive signal WD2<0> is first lowered to the ground potential VSS, and after a sufficient interval, the potential at the main word line MWL0 is raised. Thus, by saving wasteful power consumption due to such a through current, also, power consumption of the internal boosted potential generation circuit can be reduced.

In this example, by reducing power consumption of the internal boosted potential generation circuit, effective power reduction of the entire semiconductor memory device is realized. The reason is as follows.

In general, the internal boosted potential VPP is generated by a charge pump type circuit as the internal boosted potential generation circuit. In this type of circuit, charges are accumulated in an enormously large pump capacity from an external power supply having a voltage VDD, for example. The potential difference in the pump capacity is then further increased to generate the internal boosted potential VPP. This charge pump type circuit is however poor in potential generation efficiency. The consumption charge amount required for generation of the internal boosted potential VPP is 200% or more of the supply charge amount from the external power supply to the internal boosted potential generation circuit even in an ideal case. The efficiency is further reduced when the external power supply potential VDD is low. Moreover, since the pump capacity is enormously large, a large layout area is required for the internal boosted potential generation circuit. According to the present invention, power consumption of the internal boosted potential generation circuit can be reduced as described above. This greatly contributes to reduction of the entire power supply and also to reduction of the layout area.

Second Example

FIGS. 8(*a*) and 8(*b*) are a circuit diagram of the second example of the configuration of the sub-word line drive section and a timing chart of the circuit operation, respectively. This example will be described with reference to the configurations and operations of the sub-memory cell arrays SMA24 and SMA25 with the sub-word lines SW0 to SW3, memory cells MC connected to the sub-word lines SW0 to SW3, and the sub-word line drive circuits SWD0 to SWD3. In this example, differences from the configurations and operations in the first example shown in FIGS. 7(a) and 7(b) will be mainly described.

In the first example, the sub-word line non-selection signal generation circuit XWDG is placed in each intersection region SDR. In the second example, the sub-word line non-selection signal generation circuit XWDG is placed in the periphery circuit PC or the main word line drive circuit block, as the sub-word line drive signal generation circuit WDG. Therefore, the line for the sub-word line non-selection signal XWD extends in the sense amplifier section SAB, is branched in each intersection region SDR, and is connected to each sub-word line drive section SWD, as the line for the sub-word line drive signal WD. That is, this arrangement is not based on any of the periphery configurations of the sub-memory cell arrays shown in FIGS. 3 to 6.

With the above configuration, unlike the first example where the sub-word line non-selection signal XWD is generated in response to the sub-word line drive signal WD, there is no limit on the order of the generation of the sub-word line drive signal WD and the sub-word line non-selection signal XWD. By controlling the order of shift of the two signals, therefore, current consumption can be reduced. This effect will be apparent from the following description on the configuration and operation of this example.

Figure 8A:
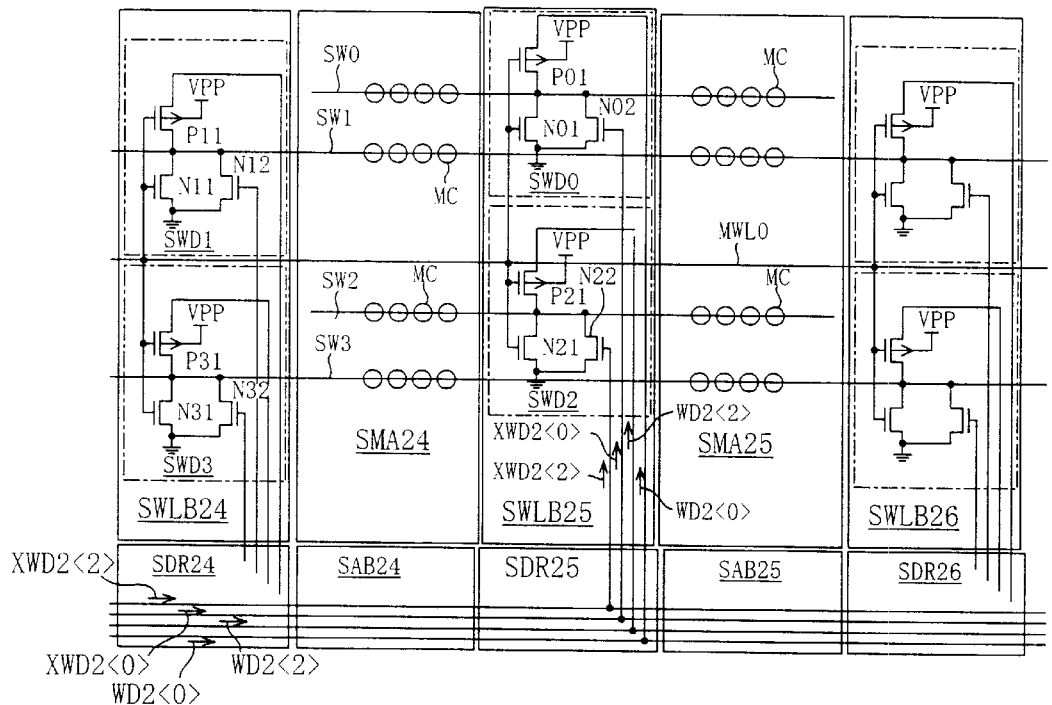
FIGS. 8(a) and 8(b) are a circuit diagram and a timing chart, respectively, of a second example of the sub-word line drive section according to the present invention.

First, the operation of the unit sub-word line drive SWD will be described with reference to FIGS. 8(a) and 8(b). Herein described specifically are the operation that the sub-word line drive circuit SWD0 in the sub-word line drive section SWLB25 is selected to raise the sub-word line SW0 to the internal boosted potential VPP as the active level, and the operation that the sub-word line drive circuit SWD0 is inactivated to lower the sub-word line SW0 to the ground potential VSS as the inactive level. In this example, the internal boosted potential VPP is about 4 V, the internal lowered potential VINT is about 2.5 V, the ground potential VSS is about 0 V, and the external supply potential is about 3.3 V.

Figure 8B:
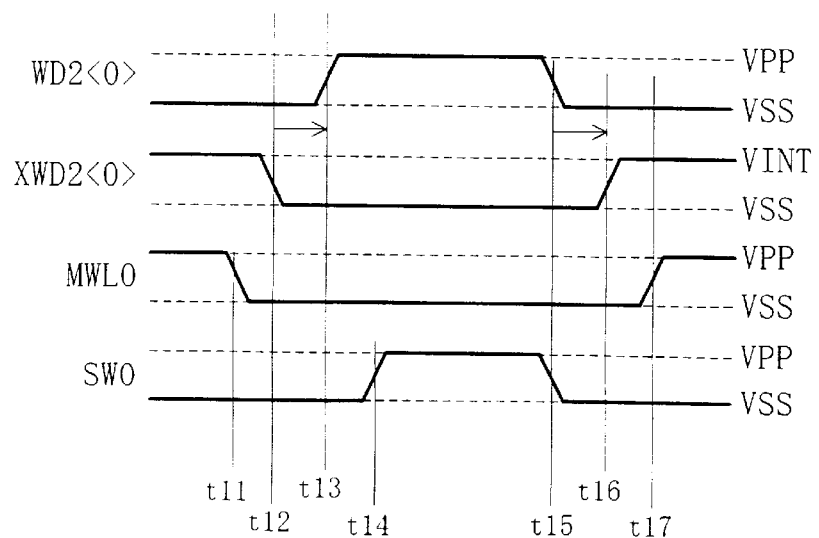

As is shown by the third waveform of the timing chart of FIG. 8(b), the main word line MWL0 is lowered from the internal boosted potential VPP as the inactive level to the ground potential VSS as the active level at timing t11 in response to an input of an external row address, so as to select the sub-word line drive circuit SWD0. Since the main word line MWL0 is connected to the gate electrodes of the p-channel MOS transistor P01 and the n-channel MOS transistor N01 of the sub-word line drive circuit SWD0, the potential change from the internal boosted potential VPP to the ground potential VSS of the main word line MWL0 turns the n-channel MOS transistor N01 from the ON to OFF state. This also turns the n-channel MOS transistors N11 to N31 of the sub-word line drive circuits SWD1 to SWD3 from the ON to OFF state. Nevertheless, although the potential at the main word line MWL0 has changed to the ground potential VSS as the active level, the potential at the sub-word lines SW0 to SW3 is still kept at the ground potential VSS as the inactive level. This is due to the fact that the sub-word line drive signals WD2<0–3> are still kept at the ground potential VSS as the inactive level, the sub-word line non-selection signals XWD2<0,1,2,3> are still kept at the internal lowered potential VINT, and thus the n-channel MOS transistors N02 to N32 of the sub-word line drive circuits SWD0 to SWD3 are in the ON state. These MOS transistors keep the sub-word lines SW0 to SW3 lowered at the ground potential VSS.

Thereafter, unlike the first example, as is shown by the second waveform of the chart, at timing t12, the sub-word line non-selection signal XWD2<0> is lowered from the internal lowered potential VINT to the ground potential VSS. This turns the n-channel MOS transistor N02 of the sub-word line drive circuit SWD0 to the OFF state.

As is shown by the first waveform of the timing chart, at timing t13, the sub-word line drive signal WD2<0> is raised from the ground potential VSS as the inactive level to the internal boosted potential VPP as the active level. The line for the sub-word line drive signal WD2<0> is connected to the source region of the p-channel MOS transistor P0 of the sub-word line drive circuit SWD0. The gate of the p-channel MOS transistor P01 is already at the ground potential VSS in response to the main word line MWL0. Under these conditions, when the sub-word line drive signal WD2<0> is raised to the internal boosted potential VPP from the ground potential VSS, the sub-word line SW0 is also raised to the internal boosted potential VPP as the active level from the ground potential VSS as the inactive level at timing t14.

Meanwhile, since the other sub-word line drive signals WD2<1,2,3> are kept at the ground potential VSS as the inactive level, the other sub-word line non-selection signals XWD2<1,2,3> are kept at the internal lowered potential VINT. Therefore, the n-channel MOS transistors N12, N22, and N32 of the non-selected sub-word line drive circuits SWD1, SWD2, and SWD3 are kept in the ON state, keeping the sub-word lines connected to these drive circuits at the ground potential VSS. This contributes to keeping the sub-word lines from high impedance.

Thus, in this example, in the process of the selection of the sub-word line SW0, the sub-word line drive signal WD2<0> is raised to the internal boosted potential VPP at a sufficient interval from the previous lowering of the sub-word line non-selection signal XWD2<0> to the ground potential VSS. This prevents a through current from flowing in the sub-word line drive circuit SWD0 from the line for the sub-word line drive signal WD2<0> to the ground through the p-channel transistor P01 and the n-channel MOS transistor N02.

If the sub-word line drive signal WD2<0> is raised to the internal boosted potential VPP before the sub-word line non-selection signal XWD2<0> is lowered to the ground potential VSS, there exists a state allowing the p-channel MOS transistor P01 and the n-channel MOS transistor N02 to be turned ON simultaneously during the period from the time when the sub-word line drive signal WD2<0> is raised to the internal boosted potential VPP until the time when the sub-word line non-selection signal XWD2<0> is lowered to the level of [ground potential VSS+threshold voltage Vtn of n-channel MOS transistor N02]. In such a state, a through current flows from the line for the sub-word line drive signal WD which is kept at the internal boosted potential VPP to the ground. In order to avoid this occurrence, the sub-word line non-selection signal XWD2<0> is first lowered to the ground potential VSS, and after a sufficient interval, the sub-word line drive signal WD2<0> is raised to the internal boosted potential VPP.

Next, with continued reference of FIG. 8(b), the operation that the sub-word line drive circuit SWD0 is inactivated so as to lower the sub-word line SW0 to the ground potential VSS as the inactive level will be described.

As is shown by the first waveform of the timing chart, at timing t15, the sub-word line drive signal WD2<0> is lowered from the internal boosted potential VPP as the active level to the ground potential VSS as the inactive level. The line for the sub-word line drive signal WD2<0> is connected to the source region of the p-channel MOS transistor P01 of the sub-word line drive circuit SWD0, and the gate of the p-channel MOS transistor P01 connected to the main word line MWL0 is at the ground potential VSS. Under these conditions, when the sub-word line drive signal WD2<0> is lowered from the internal boosted potential VPP to the ground potential VSS as described above, the sub-word line SW0 is lowered from the internal boosted potential VPP as the active level to a potential of the ground potential VSS as the inactive level with the threshold voltage Vtp of the p-channel MOS transistor P01 added thereto. After a sufficient interval, at timing t16, as is shown by the second waveform of the timing chart, the sub-word line non-selection signal XWD2<0> is raised from the ground potential VSS to the internal lowered potential VINT. This turns ON the n-channel MOS transistor N02 of the sub-word line drive circuit SWD0. Thus, the sub-word line SW0 is lowered to the ground potential VSS as is shown by the fourth waveform of the timing chart.

Subsequently, as is shown by the third waveform of the timing chart, at timing t17, the main word line MWL0 is raised from the ground potential VSS as the active level to the internal boosted potential VPP as the inactive level. The main word line MWL0 is connected to the gate electrodes of the p-channel MOS transistor P01 and the n-channel MOS transistor N01 of the sub-word line drive circuit SWD0 as described above. With the potential change from the ground potential VSS to the internal boosted potential VPP of the main word line MWL0, the p-channel MOS transistor P01 is turned from the ON to OFF state, while the n-channel MOS transistor N01 is turned from the OFF to ON state. The n-channel MOS transistors N11 to N31 of the sub-word line drive circuits SWD1 to SWD3 are also turned from the OFF to ON state. Thus, with the potential change of the main word line MWL0 to the internal boosted potential VPP as the inactive level, the sub-word lines SW0 to SW3 are kept fixed at the ground potential VSS also by the n-channel MOS transistors N11 to N31 of which gate electrodes are connected to the main word line MWL0.

In the process of the non-selection of the sub-word line SW0, the sub-word line non-selection signal XWD2<0> is raised to the internal lowered potential VINT at a sufficient interval from the previous lowering of the sub-word line drive signal WD2<0> to the ground potential VSS (see timings t15 to t16 in FIG. 8(b)). This prevents a through current from flowing in the sub-word line drive circuit SWD0 from the line for the sub-word line drive signal WD2<0> to the ground through the p-channel MOS transistor P01 and the n-channel MOS transistor N02. If the sub-word line non-selection signal XWD2<0> is raised to the internal lowered potential VINT before the sub-word line drive signal WD is lowered to the ground potential VSS, there exists a state allowing the p-channel MOS transistor P01 and the n-channel MOS transistor N02 to be turned ON simultaneously during the period from the time when the sub-word line non-selection signal XWD2<0> is raised to the level of [ground potential VSS+threshold voltage Vtn of n-channel MOS transistor N02] until the time when the sub-word line drive signal WD2<0> is lowered. In such a state, a through current flows from the line for the sub-word line drive signal WD which is kept at the internal boosted potential VPP to the ground. In order to avoid this occurrence, the sub-word line drive signal WD2<0> is first lowered to the ground potential VSS, and after a sufficient interval, the sub-word line non-selection signal XWD2<0> is raised to the internal lowered potential VINT.

In summary, in this example, as shown in the timing chart of FIG. 8(b), when the sub-word line SW0 is to be selected, the sub-word line non-selection signal XWD2<0> is first lowered to the ground potential VSS, and after a sufficient interval, the sub-word line drive signal WD2<0> is raised to the internal boosted potential VPP. When the sub-word line SW0 is to be inactivated, the sub-word line drive signal WD2<0> is first lowered to the ground potential VSS, and after a sufficient interval, the sub-word line non-selection signal XWD2<0> is raised to the internal lowered potential VINT. In this way, as in the first example, power consumption of the internal boosted potential generation circuit and thus the entire device can be widely reduced. (Configuration for supply of internal lowered potential)

Control of the selected internal lowered potential VXWD shown in FIG. 7(a) and a circuit for generating the internal lowered potential will be described.

The sub-word line non-selection signal generation circuits XWDG shown in FIG. 7(a) are placed in the respective intersection regions SDR between the sub-word line drive sections SWLB and the sense amplifier sections SAB. The sub-word line non-selection signal generation circuits XWDG are therefore alternated with the sub-word line drive sections SWLB in the vertical direction. With this configuration, in comparatively many cases, a comparatively shallow n-well in the sub-word line drive section SWLB is electrically connected with an n-well in the adjacent intersection region SDR. The reason is as follows. In a semiconductor integrated circuit device of a triple-well structure, for example, assume that a large memory cell block MB is entirely isolated from a p-type semiconductor substrate by a comparatively deep barrier n-well formed therebetween. The barrier n-well therefore covers the entire bottom of the large memory cell block MB from beneath. The barrier n-well is normally in connection with bottom portions of comparatively shallow n-wells. Thus, all the comparatively shallow n-wells located on the barrier n-well are electrically connected with one another. That is, in the semiconductor integrated circuit device of the triple-well structure where the entire bottom of a large memory cell block MB is covered with the barrier n-well, all comparatively shallow n-wells existing in the large memory cell block MB are electrically connected with one another, thereby having an equal potential. In view of the above, since the substrate potential of the p-channel MOS transistors P01, P11, . . . of the sub-word line drive circuits SWD in the sub-word line drive section SWLB is the internal boosted potential VPP, the substrate potential of a p-channel MOS transistor (not shown) of an inverter as the sub-word line non-selection signal generation circuit XWDG is also the internal boosted potential VPP.

For reduction of power consumption of the internal boosted potential generation circuit, the internal lowered potential is used as the active level of the sub-word line non-selection signals XWD as described above. In this configuration, the highest potential is the internal lowered potential VINT at the source region of the p-channel MOS transistor of the sub-word line non-selection signal generation circuit XWDG as the inverter, while it is the internal boosted potential VPP at the substrate. The source region of the p-channel MOS transistor is formed of a p-type semiconductor, while the substrate is formed of an n-type semiconductor, constituting together a pn junction diode. Therefore, if the potential at the n-type substrate is higher than the potential at the p-type source region, a reverse bias is applied to this pn junction diode, preventing a large current from flowing to this diode. On the contrary, if the potential at the substrate is somewhat lower than the potential at the source region, a forward bias is applied to the pn junction diode, causing a large current to flow to the diode. The internal potentials such as the internal boosted potential VPP and the internal lowered potential VINT are generated inside the semiconductor integrated circuit device using the external supply potential VDD. Therefore, the speed at which the external supply potential VDD is initially boosted upon supply of VDD is different between the internal potentials to be generated. Since the efficiency of the charge pump type internal boosted potential generation circuit is low as described above, the internal boosted potential VPP starts to be raised slowly upon supply of the external supply potential, while the internal lowered potential VINT starts to be raised comparatively fast. If the source region of the p-channel MOS transistor of the sub-word line non-selection signal generation circuit XWDG is connected to the line for the internal lowered potential VINT, since the internal lowered potential VINT is raised faster than the internal boosted potential VPP, the potential at the n-type substrate becomes somewhat lower than the potential at the p-type source region at the initial stage, causing a forward bias. As a result, a large current flows to the pn junction diode, with a possibility of latch-up. In order to avoid this problem, the selected internal lowered potential VXWD is used as a control signal for the sub-word line non-selection signal generation circuit XWDG.

Figure 9B:
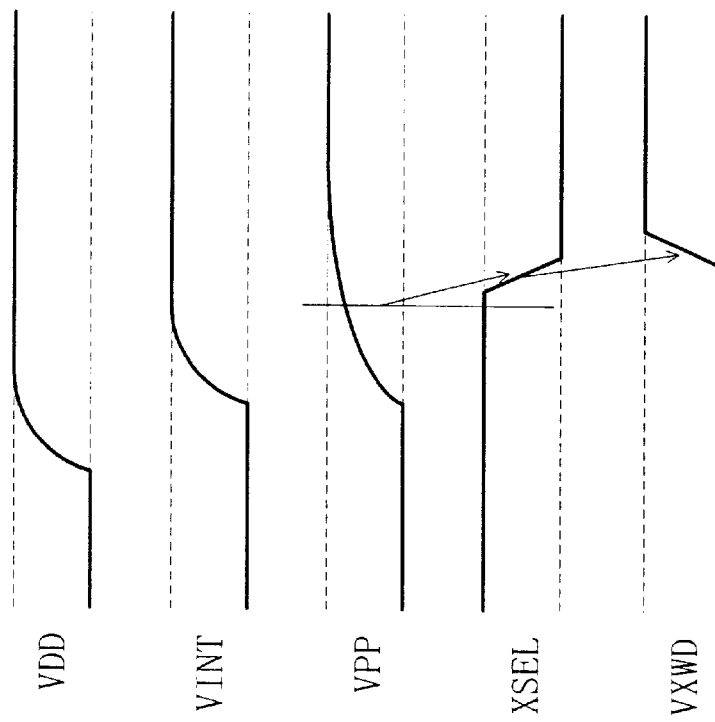
FIGS. 9(a) and 9(b) are a block circuit diagram and a timing chart, respectively, of a first example of a selected internal lowered potential generation circuit placed in the intersection region shown in FIG. 7(a).
Figure 9A:
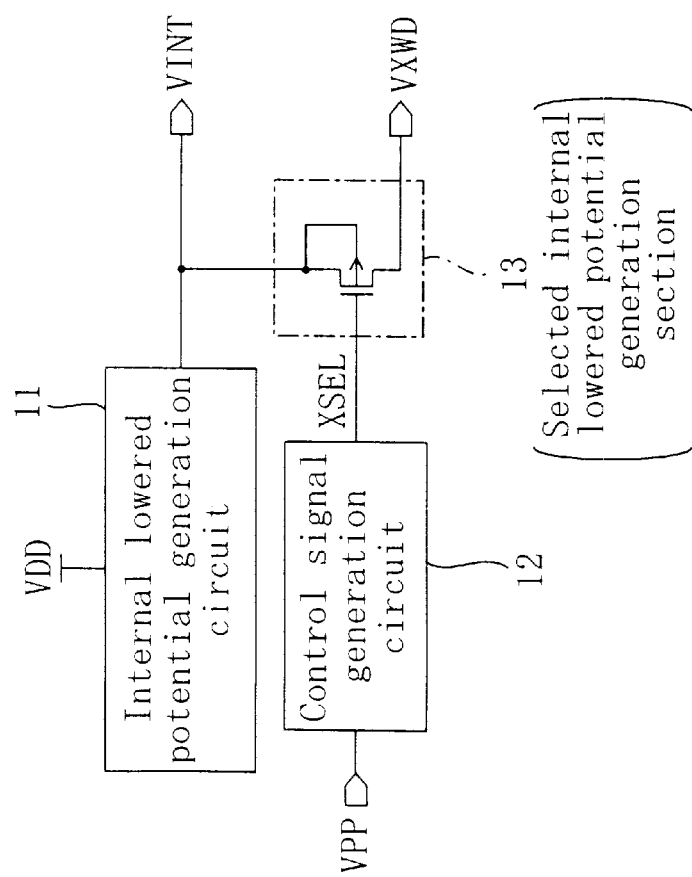

Hereinbelow, two examples of the selected internal lowered potential generation circuit for controlling the supply of the internal lowered potential VINT depending on the selected internal lowered potential VXWD are presented.
First example FIGS. 9(*a*) and 9(*b*) are a block diagram and a timing chart of the first example of the selected internal lowered potential generation circuit.

The selected internal lowered potential generation circuit of the first example includes: an internal lowered potential generation circuit 11 for generating the internal lowered potential VINT based on the external supply potential VDD input therein; a control signal generation circuit 12 for generating a control signal XSEL based on the internal boosted potential VPP input therein; and a selected internal lowered potential generation section 13 including a p-channel transistor which receives the internal lowered potential VINT at the source region and the control signal XSEL at the gate electrode.

The operation of the selected internal lowered potential generation circuit with the above configuration will be described. First, upon connection with the external power supply, the potential at the input of the internal lowered potential generation circuit 11 rises to the external supply potential VDD. This allows the internal lowered potential VINT, as well as the internal boosted potential VPP, to start rising. During this rising, as described above, the internal lowered potential VINT rises faster than the internal boosted potential VPP. When the control signal generation circuit 12 detects that the internal boosted potential VPP reaches a predetermined value, it lowers the control signal XSEL from an inactive level to the ground potential VSS which is the active level. This turns ON the p-channel MOS transistor in the selected internal lowered potential generation circuit 13, allowing the internal lowered potential VINT to be supplied as the selected internal lowered potential VXWD via the p-channel MOS transistor. The selected internal lowered potential VXWD thus rises to the internal lowered potential VINT. By this operation of the selected internal lowered potential generation circuit 13, the potential at the source region of the p-channel MOS transistor of the sub-word line non-selection signal generation circuit XWDG starts rising to the internal lowered potential VINT only after the internal boosted potential VPP reaches the predetermined potential. This makes it possible to always establish a reverse bias, even at power-on of the external power supply, where the potential at the n-type substrate (VPP) is higher than the potential at the p-type source region. In this way, the problem that a large current flows to the pn junction diode causing latch-up is prevented.

Second Example

Figure 10A:
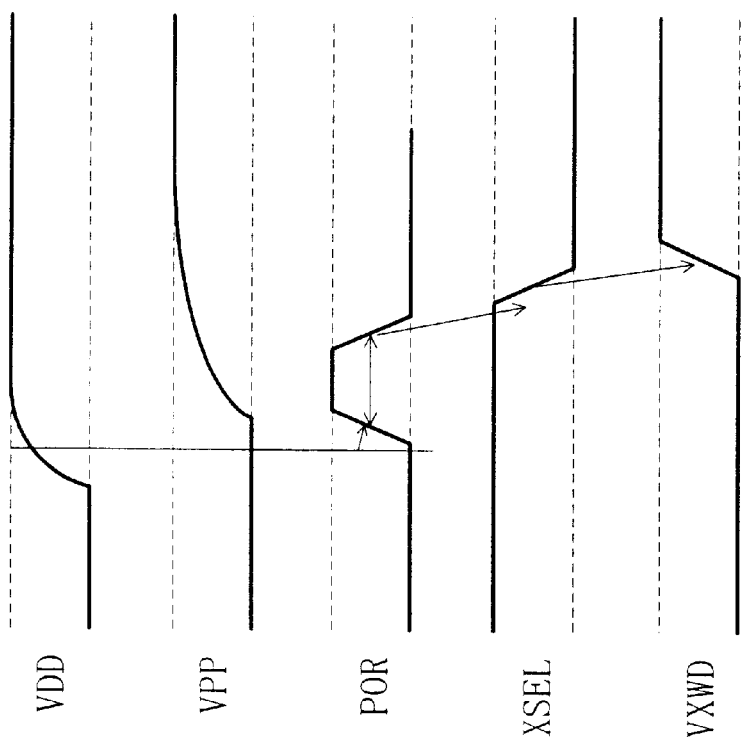
FIGS. 10(a) and 10(b) are a block circuit diagram and a timing chart, respectively, of a second example of the selected internal lowered potential generation circuit placed in the intersection region shown in FIG. 7(a).
Figure 10B:
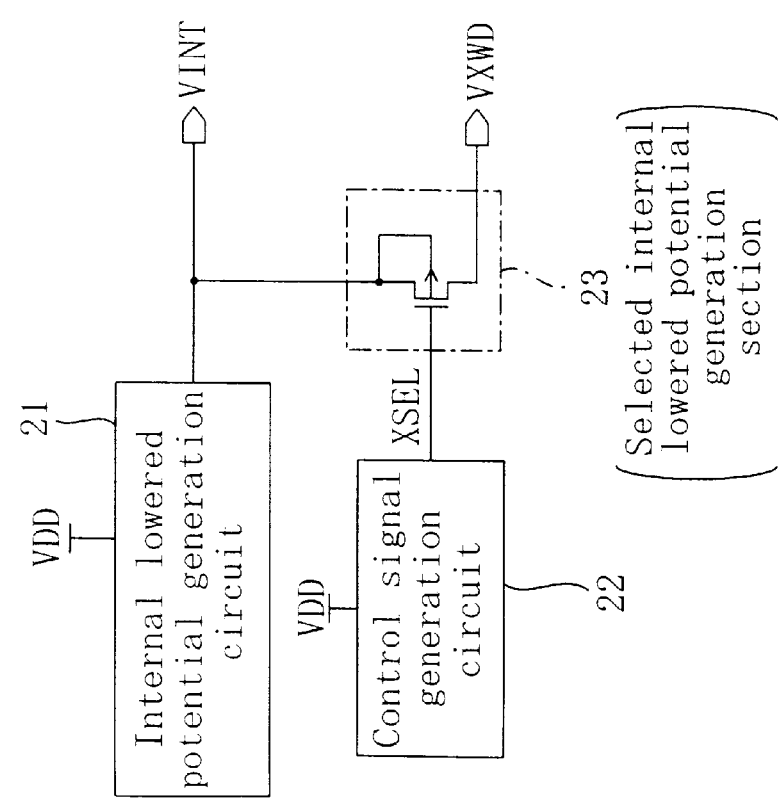

FIGS. 10(*a*) and 10(*b*) are a block diagram and a timing chart of the second example of the selected internal lowered potential generation circuit.

The selected internal lowered potential generation circuit of the second example includes: an internal lowered potential generation circuit 21 for generating the internal lowered potential VINT based on the external supply potential VDD input therein; a control signal generation circuit 22 for generating a control signal XSEL based on the external supply potential VDD input therein; and a selected internal lowered potential generation section 23 including a p-channel transistor which receives the internal lowered potential VINT at the source region and the control signal XSEL at the gate electrode. In this example, the control signal generation circuit 22 includes a timer-equipped circuit for generating a powering detection signal POR which rises when the external supply potential VDD is initially supplied and falls when a predetermined time passes.

The operation of the selected internal lowered potential generation circuit with the above configuration will be described. First, upon connection with the external power supply, the external supply potential VDD at the input of the internal lowered potential generation circuit 21 gradually rises. The internal boosted potential VPP also starts rising. In the control signal generation circuit 22, in response to the rising of the external supply potential VDD, the powering detection signal POR rises from the ground potential VSS as the inactive level to an active level. When a predetermined time passes after the rising of the powering detection signal POR, the powering detection signal POR falls again from the active level to the ground potential VSS as the inactive level in response to a notification from the timer. In response to the falling of the signal, the control signal XSEL is lowered from an inactive level to the ground potential VSS as the active level. This turns ON the p-channel MOS transistor of the selected internal lowered potential generation circuit 23, allowing the internal lowered potential VINT to be supplied as the selected internal lowered potential VXWD via the p-channel MOS transistor. The selected internal lowered potential VXWD thus rises to the internal lowered potential VINT. By this operation of the circuit 23, the potential at the source region of the p-channel MOS transistor of the sub-word line non-selection signal generation circuit XWDG starts rising to the internal lowered potential VINT only after the predetermined time has passed when the internal boosted potential VPP becomes sufficiently high. This makes it possible to always establish a reverse bias, even at power-on of the external power supply, where the potential at the n-type substrate (VPP) is higher than the potential at the p-type source region. In this way, the problem that a large current flows to the pn junction diode causing latch-up is prevented.

(Configuration of intersection region)

The circuit configuration and layout of the intersection region SDR that includes the sub-word line non-selection signal generation circuit XWDG will be described. In the following example, the case shown in FIG. 4 where one sub-word line non-selection signal generation circuit XWDG is provided in each intersection region SDR will be described.

Example

Figure 11:
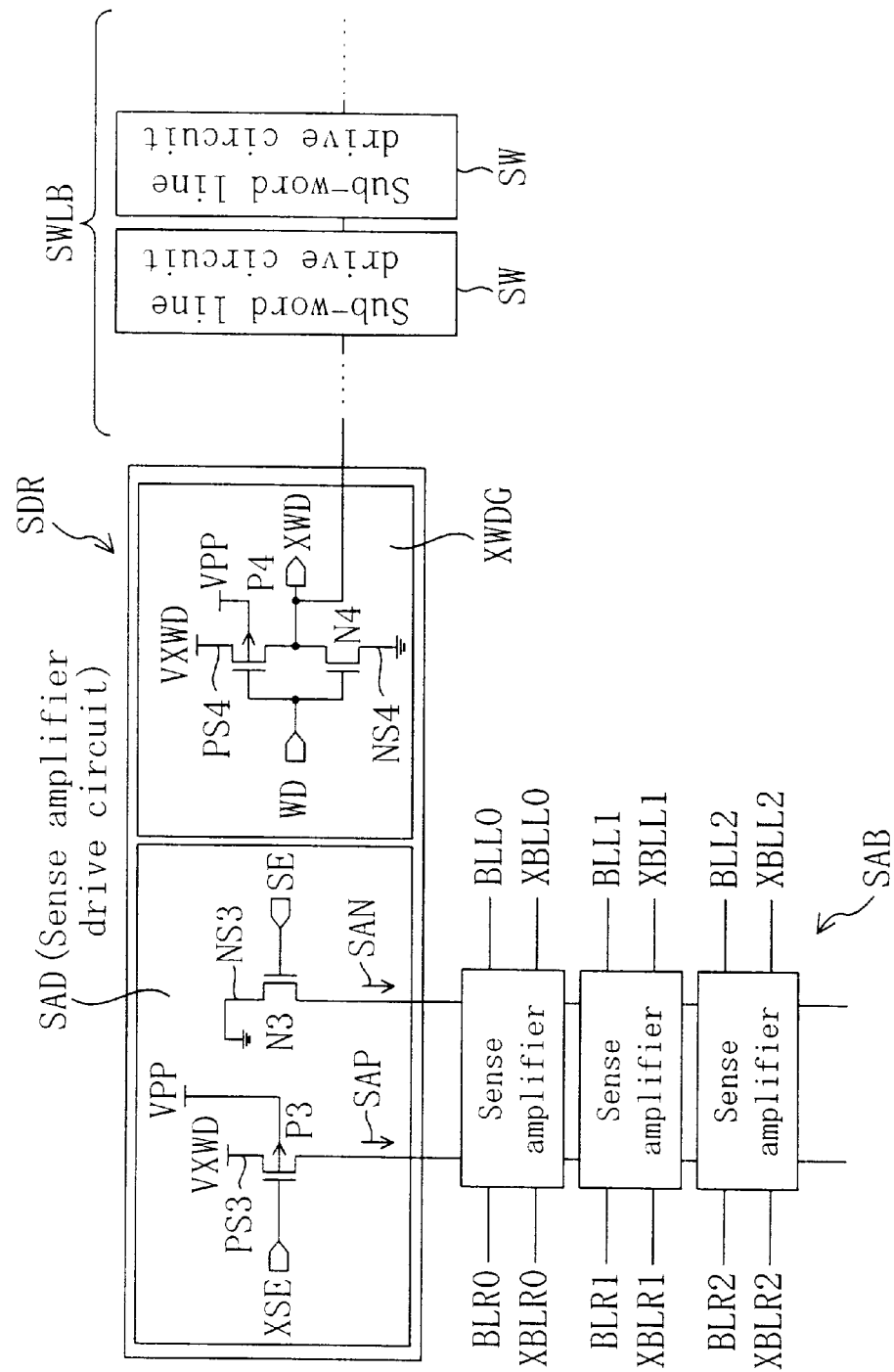
FIG. 11 is a block circuit diagram of the intersection region including a single sub-word line non-selection signal generation circuit as shown in FIG. 4.

FIG. 11 is a block diagram of the circuit configuration of the intersection region SDR including one sub-word line non-selection signal generation circuit XWDG as shown in FIG. 4, for example.

Referring to FIG. 11, the intersection region SDR includes the sub-word line non-selection signal generation circuit XWDG and a sense amplifier drive circuit SAD. The sub-word line non-selection signal generation circuit XWDG includes an inverter composed of a p-channel MOS transistor P4 and an n-channel MOS transistor N4 formed in series between a terminal for supplying the selected internal lowered potential VXWD and the ground. The inverter receives the sub-word line drive signal WD as a control signal, to generate the sub-word line non-selection signal XWD. The output sub-word line non-selection signal XMD is supplied to a plurality of sub-word line drive circuits SWD as described above.

The sense amplifier drive circuit SAD includes a p-channel MOS transistor P3 receiving the selected internal lowered potential VXWD as the source potential and an inverted sense amplifier drive control signal XSE as the gate input, and an n-channel MOS transistor N3 receiving the ground potential VSS as the source potential and a non-inverted sense amplifier drive control signal SE as the gate input. The p-channel MOS transistor P3 and the n-channel MOS transistor N3 of the sense amplifier drive circuit SAD are connected to p-channel MOS transistors and n-channel MOS transistors (not shown), respectively, of unit sense amplifiers in the sense amplifier section SAB. In other words, a p-type sense amplifier drive signal SAP and an n-type sense amplifier drive signal SAN generated by the sense amplifier drive circuit SAD are used as the source potential for the p-channel MOS transistors and the n-channel MOS transistors, respectively, of the unit sense amplifiers in the sense amplifier section SAB.

In DRAMs, in general, it is preferable to reduce the chip size as much as possible for reduction of fabrication cost. In particular, size reduction of large memory cell blocks MB is a critical factor for chip size reduction. It is therefore desired to reduce the areas of the components such as sub-memory cell arrays SMA, the sub-word line drive sections SWLB, and the sense amplifier sections SAB. Naturally, reduction of the area of the intersection regions SDR is also desired. It is therefore required to lay out two circuits, the sub-word line non-selection signal generation circuit XWDG and the sense amplifier drive circuit SAD, in a reduced-area intersection region SDR. Hereinbelow, a layout capable of increasing the area utilization efficiency will be described.

Figure 12A:
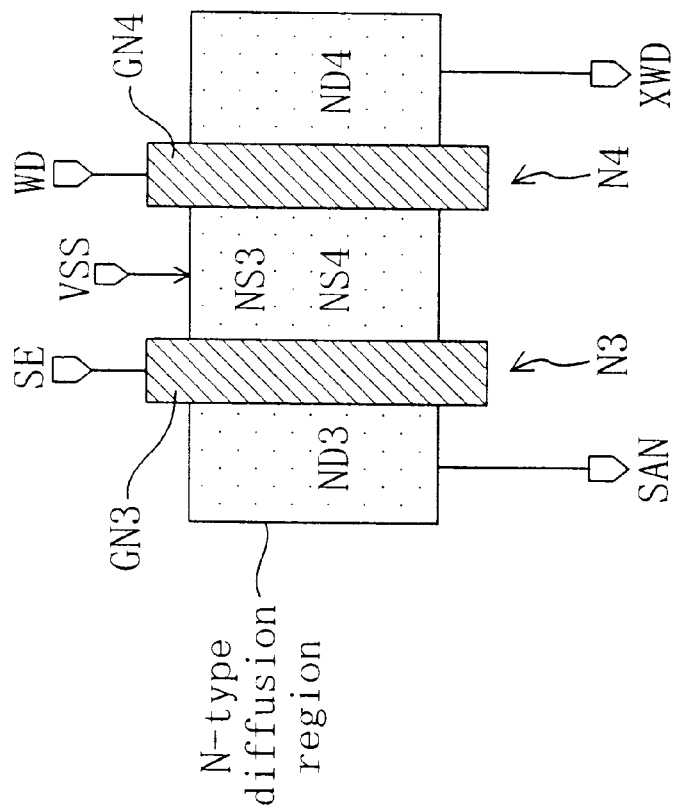
FIGS. 12(a) and 12(b) are layouts of a p-type diffusion area and an n-type diffusion area, respectively, of the intersection region shown in FIG. 11.
Figure 12B:
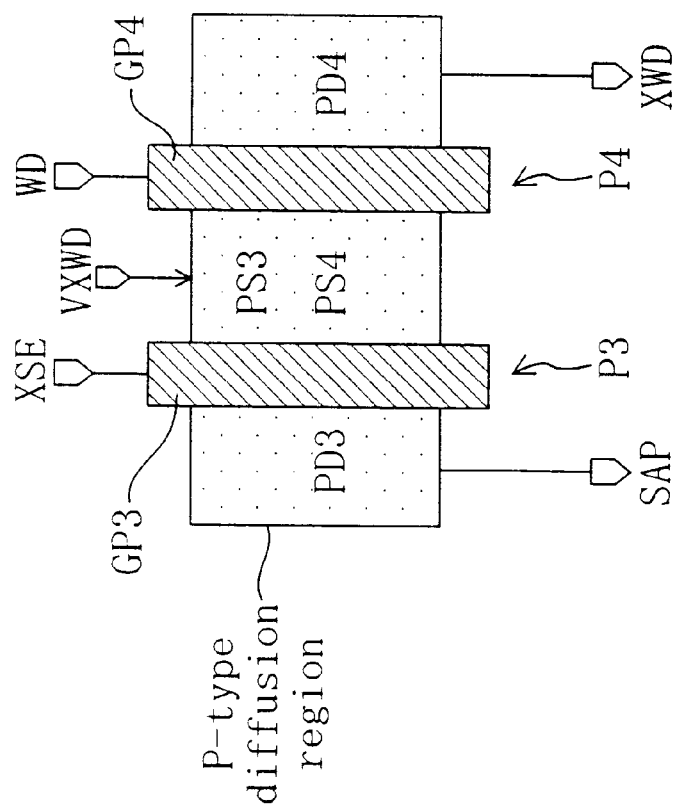

FIGS. 12(a) and 12(b) are an exemplified layout of part of the intersection region SDR. This layout can be obtained by using the internal lowered potential VINT, which is the active level of the sense amplifier drive signal SAP, as the active level of the sub-word line non-selection signal XWD as described above.

As shown in FIG. 11, source regions PS3 and PS4 of the p-channel MOS transistors P3 and P4, respectively, are both connected to the line for the selected internal lowered potential VXWD, while source regions NS3 and NS4 of the n-channel MOS transistors N3 and N4, respectively, are both grounded. As shown in FIGS. 12(a) and 12(b), therefore, the p-channel MOS transistors P3 and P4 and the n-channel MOS transistors N3 and N4 can share the respective source regions.

In the layout of the p-channel MOS transistors P3 and P4 shown in FIG. 12(a), gate electrodes GP3 and GP4 are formed of polysilicon or polycide on p-type diffusion regions. The gate electrode GP3 is electrically connected to the line for the inverted sense amplifier drive control signal XSE, and the gate electrode GP4 is electrically connected to the line for the sub-word line drive signal WD. A p-type diffusion region PS3, PS4 (source region) interposed between the gate electrodes GP3 and GP4 is connected to the line for the selected internal lowered potential VXWD. A p-type diffusion region PD3 (drain region) located left of the gate electrode GP3 is connected to the line for the p-type sense amplifier drive signal SAP. A p-type diffusion region PD4 (drain region) located right of the gate electrode GP4 is connected to the line for the sub-word line non-selection signal XWD. In the layout of the n-channel MOS transistors N3 and N4 shown in FIG. 12(b), gate electrodes GN3 and GN4 are formed of polysilicon or polycide on n-type diffusion regions. The gate electrode GN3 is electrically connected to the line for the non-inverted sense amplifier drive control signal SE, and the gate electrode GN4 is electrically connected to the line for the sub-word line drive signal WD. An n-type diffusion region NS3, NS4 (source region) interposed between the gate electrodes GN3 and GN4 is grounded. An n-type diffusion region ND3 (drain region) located left of the gate electrode GN3 is connected to the line for the n-type sense amplifier drive signal SAN. An n-type diffusion region ND4 (drain region) located right of the gate electrode GN4 is connected with the line for the sub-word line non-selection signal XWD.

With the above configuration, the area of the source regions of both p-channel and n-channel MOS transistors (NS3, NS4, PS3, and PS4) can be reduced.

In other words, by using the internal lowered potential VINT as the active level of both the sub-word line non-selection signal XWD and the sense amplifier drive signal SAP, and by using the layout shown in FIGS. 12(a) and 12(b), the area utilization efficiency of the semiconductor integrated circuit device can be increased, allowing for the layout of providing both the sub-word line non-selection signal generation circuit XWDG and the sense amplifier drive circuit SAD in a comparatively small area.

In this example, the source region of the p-channel MOS transistors P3 and P4 in the Intersection region SDR is connected to the line for the selected internal lowered potential VXWD. Alternatively, such a source region may be connected with the line for the internal lowered potential VINT or the line for the external supply potential VDD.

(Control of internal boosted potential and internal lowered potential)

Figure 13:
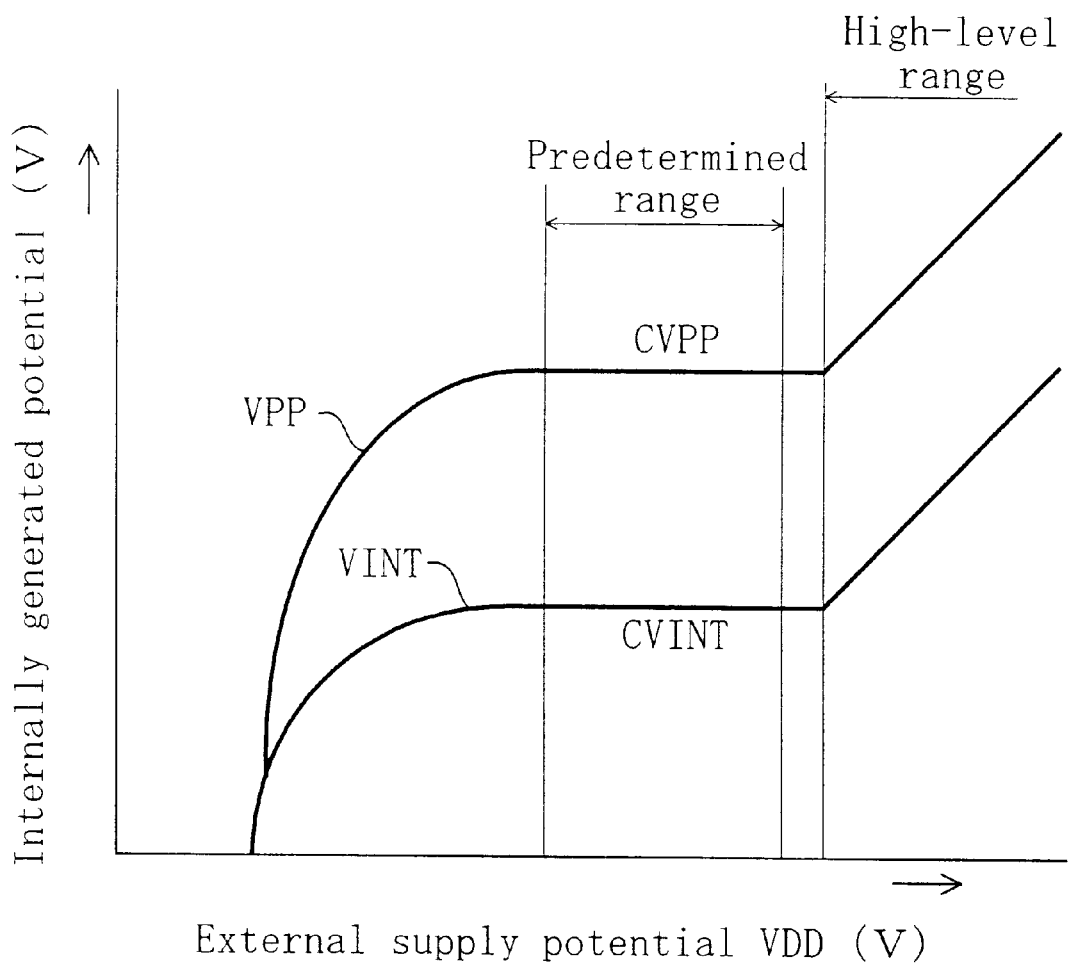
FIG. 13 is a graph showing the external supply potential dependencies of the internal boosted potential and the internal lowered potential according to the present invention.

FIG. 13 shows curves of the external supply potential dependency of the internal boosted potential VPP and the internal lowered potential VINT employed in this embodiment. The reason for employing this dependency curve will be described.

As described above, the signals input into the sub-word line drive circuit SWD have two different active levels, i.e., the internal boosted potential VPP and the internal lowered potential VINT. A semiconductor integrated circuit device such as a DRAM has a lower limit for the external supply potential VDD determined by its specification. The external supply potential VDD therefore has to be stably kept at or above the specified lower limit. Moreover, internally generated potentials tend to be different from the external supply potential VDD. As a result, there arises a possibility that the change characteristics, such as a generation timing, depending on the change of the external supply potential VDD, may be different between the sub-word line drive signal WD using the internal boosted potential VPP as the active level and the sub-word line non-selection signal XWD using the internal lowered potential VINT as the active level. If this occurs, at the time when the external supply potential VDD reaches a certain value in the course of a change of the potential VDD (e.g., at power-on of the power supply), the sub-word line drive circuit SWD which receives both the sub-word line drive signal WD and the sub-word line non-selection signal XWD may malfunction.

In order to avoid the above problem and ensure stable operation in a wide range of the external supply potential VDD, in the semiconductor integrated circuit device of this embodiment, the change rates of the internal boosted potential VPP and the internal lowered potential VINT with respect to the external supply potential VDD are made substantially the same.

More specifically, as shown in FIG. 13, the internal boosted potential VPP and the internal lowered potential VINT are fixed at different values CVPP and CVINT in a predetermined range where the external supply potential VDD changes. By setting the internal boosted potential VPP and the internal lowered potential VINT at the fixed values CVPP and CVINT that hardly depend on the external supply potential VDD, the change characteristics of the internal potentials can be adjusted. For example, the generation timings of the two potentials depending on the change of the external supply potential VDD can be made substantially the same. As a result, the sub-word line drive circuit SWD can be stably operated in a predetermined range of the external supply potential VDD.

In some cases, a semiconductor integrated circuit device is subjected to a voltage accelerating test or the like carried out in a high-level range of the external supply potential VDD exceeding an upper limit thereof determined by the specification of the device. In order to support such cases, it is preferable to have a predetermined range which hardly depends on the external supply potential VDD and a range which comparatively largely depends on the external supply potential VDD. In this embodiment, therefore, as shown in FIG. 13, in the high-level range exceeding the upper limit of the external supply potential VDD, the change rates of the internal boosted potential VPP and the internal lowered potential VINT with respect to the change of the external supply potential VDD are made substantially the same. As a result, the sub-word line drive circuit SWD can stably operate in a wide range of change of the external supply potential VDD.

(Configuration of sub-word line drive circuit)

Examples of the circuit configuration and layout of the sub-word line drive circuit will be described with reference to FIGS. 14 through 16, taking the sub-word line drive section SWLB shown in FIG. 4 (second example of peripheries of sub-memory cell arrays) as an example. In the configuration shown in FIG. 4, each of the intersection regions SDR has one sub-word line non-selection signal generation circuit XWDG, with XWDG<0> and XWDG<2> alternated in the vertical direction. Note that in FIGS. 14 through 16, the block number of each reference code, e.g., 25 for WD25<0>, is omitted for simplification, and the signal line 10 number, e.g., <0> for WD<0>, is expressed without brackets like WD0.

First Example

Figure 14:
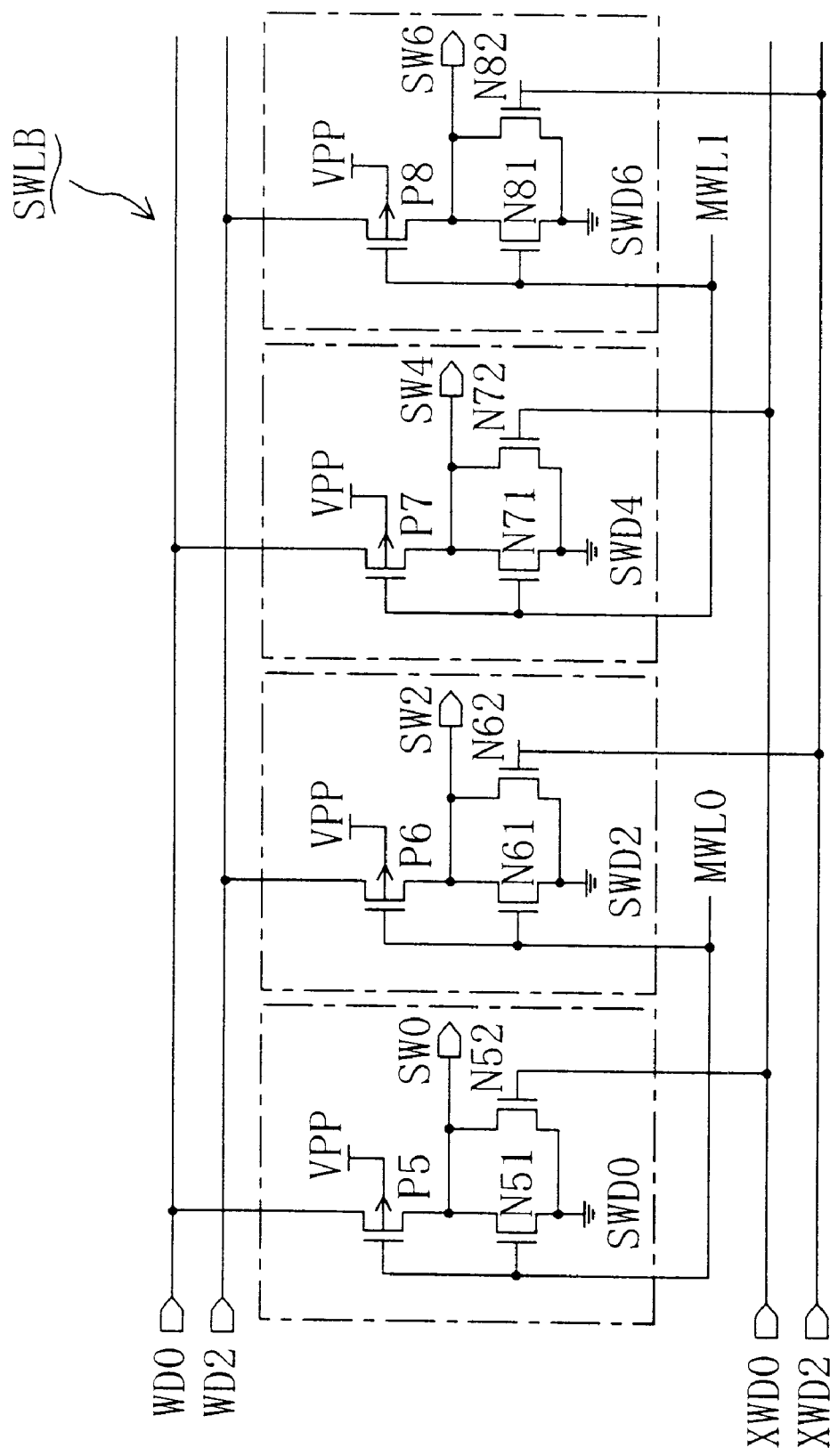
FIG. 14 is a partial circuit diagram showing a first or second example of the sub-word line drive section in FIG. 7(a).

FIG. 14 is a circuit diagram of the sub-word line drive section SWLB that is common for the first and second examples. Only four sub-word line drive circuits SWD0, SWD2, SWD4, and SWD6 are shown in this figure.

Referring to FIG. 14, the sub-word line drive circuit SWD0 (or SWD2, SWD4, or SWD6) includes a p-channel MOS transistor P5 (or P6, P7, or P8) and an n-channel MOS transistor N51 (or N61, N71, or N81) constituting an inverter and an n-channel MOS transistor N52 (or N62, N72, or N82). The gate electrodes of the p-channel MOS transistors P5 and P6 and the n-channel MOS transistors N51 and N61 in the sub-word line drive circuits SWD0 and SWD2 are connected to a common main word line MWL0. The gate electrodes of the p-channel MOS transistors P7 and P8 and the n-channel MOS transistors N71 and N81 in the sub-word line drive circuits SWD4 and SWD6 are connected to a common main word line MWL1. In the sub-word line drive circuits SWD0 and SWD4, the gate electrodes of the n-channel MOS transistors N52 and N72 are connected to a common line for a sub-word line non-selection signal XWD0, and the source regions of the p-channel MOS transistors P5 and P7 are connected to a common line for a sub-word line drive signal WD0. Likewise, in the sub-word line drive circuits SWD2 and SWD6, the gate electrodes of the n-channel MOS transistors N62 and N82 are connected to a common line for a sub-word line non-selection signal XWD2, and the source regions of the p-channel MOS transistors P6 and P8 are connected to a common line for a sub-word line drive signal WD2.

Figure 15:
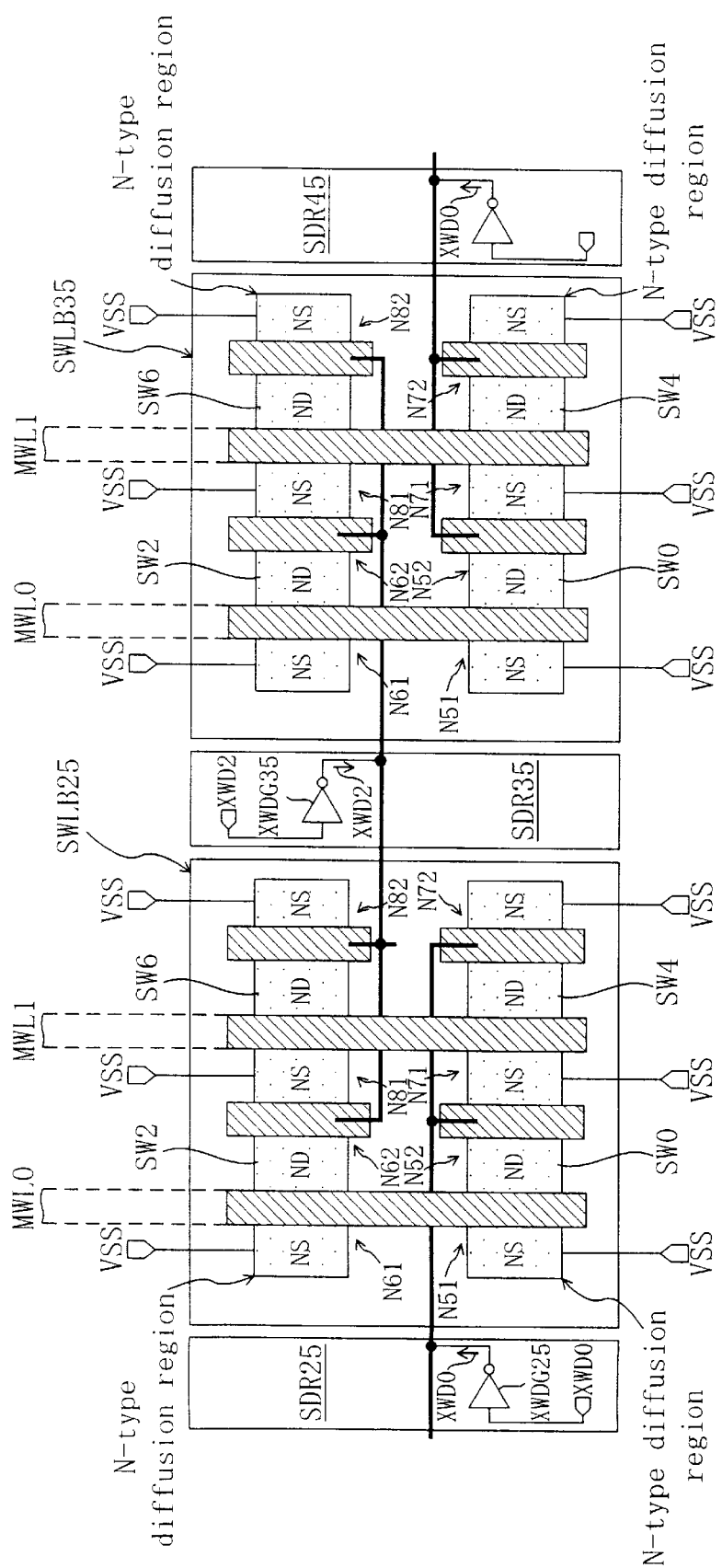
FIG. 15 is a layout of the first example of the sub-word line drive section in FIG. 7(a).

FIG. 15 is a layout of the sub-word line drive section SWLB of the first example. In FIG. 15, NS and ND represent a source region and a drain region, respectively. Specifically, FIG. 15 shows a layout of the n-channel MOS transistors N51, N52, N61, N62, N71, N72, N81, and N82 in each of sub-word line drive sections SWLB25 and SWLB35 located between intersection regions SDR25, SDR35, and SDR45.

As shown in FIG. 15, in each of the sub-word line drive sections SWLB25 and SWLB35, the n-channel MOS transistors N52 and N72 which receive the common sub-word line non-selection signal XWD0 at the respective gate electrodes are placed in the lower n-type diffusion region as is viewed from the figure alternately with the n-channel MOS transistors N51 and N71 which are connected to the main word lines MWL0 and MWL1 at the respective gate electrodes. That is, the n-channel MOS transistors N51, N52, N71, and N72 are arranged in this order from left to right as is viewed from the figure. Likewise, the n-channel MOS transistors N62 and N82 which receive the common sub-word line non-selection signal XWD2 at the respective gate electrodes are placed in the upper n-type diffusion region as is viewed from the figure alternately with the n-channel MOS transistors N61 and N81 which are connected to the main word lines MWL0 and MWL1 at the respective gate electrodes. That is, the n-channel MOS transistors N61, N62, N81, and N82 are arranged in this order from left to right as is viewed from the figure.

According to the layout of this example, the n-channel MOS transistors N52 and N71 and the n-channel MOS transistors N62 and N81 respectively share the source region NS connected to the ground. This contributes to reduction of the layout area of the semiconductor integrated circuit device.

The line for the sub-word line non-selection signal XWD2 generated in the intersection region SDR35 is connected to the gate electrodes of the n-channel MOS transistors N62 and N82 formed in the common n-type diffusion region in each of the sub-word line drive sections SWLB25 and SWLB35 located on both sides of the intersection region SDR35. Likewise, the line for the sub-word line non-selection signal XWD0 generated in the intersection region SDR25 is connected to the gate electrodes of the n-channel MOS transistors N52 and N72 formed in the common n-type diffusion region in each of the sub-word line drive sections SWLB15 (not shown) and SWLB25 located on both sides of the intersection region SDR25.

Thus, the line for the sub-word line non-selection signal XWD generated in the intersection region SDR is connected to the gate electrodes of two n-channel MOS transistors formed in the common n-type diffusion region in each of the sub-word line drive sections SWLB located on both sides of the intersection region SDR. This makes it possible to have a common positional relationship of the sub-word lines SW0, SW2, SW4, and SW6 in the sub-word line drive sections SWLB25 and SWLB35. With such a common positional relationship of the sub-word lines SW for all the sub-word line drive sections SWLB, the positional order of physical addresses in the respective sub-memory cell arrays can be unified. This simplifies analysis and examination of the device.

Second Example

Another layout of the sub-word line drive section SWLB having the configuration shown in FIG. 14 will be described.

Figure 16:
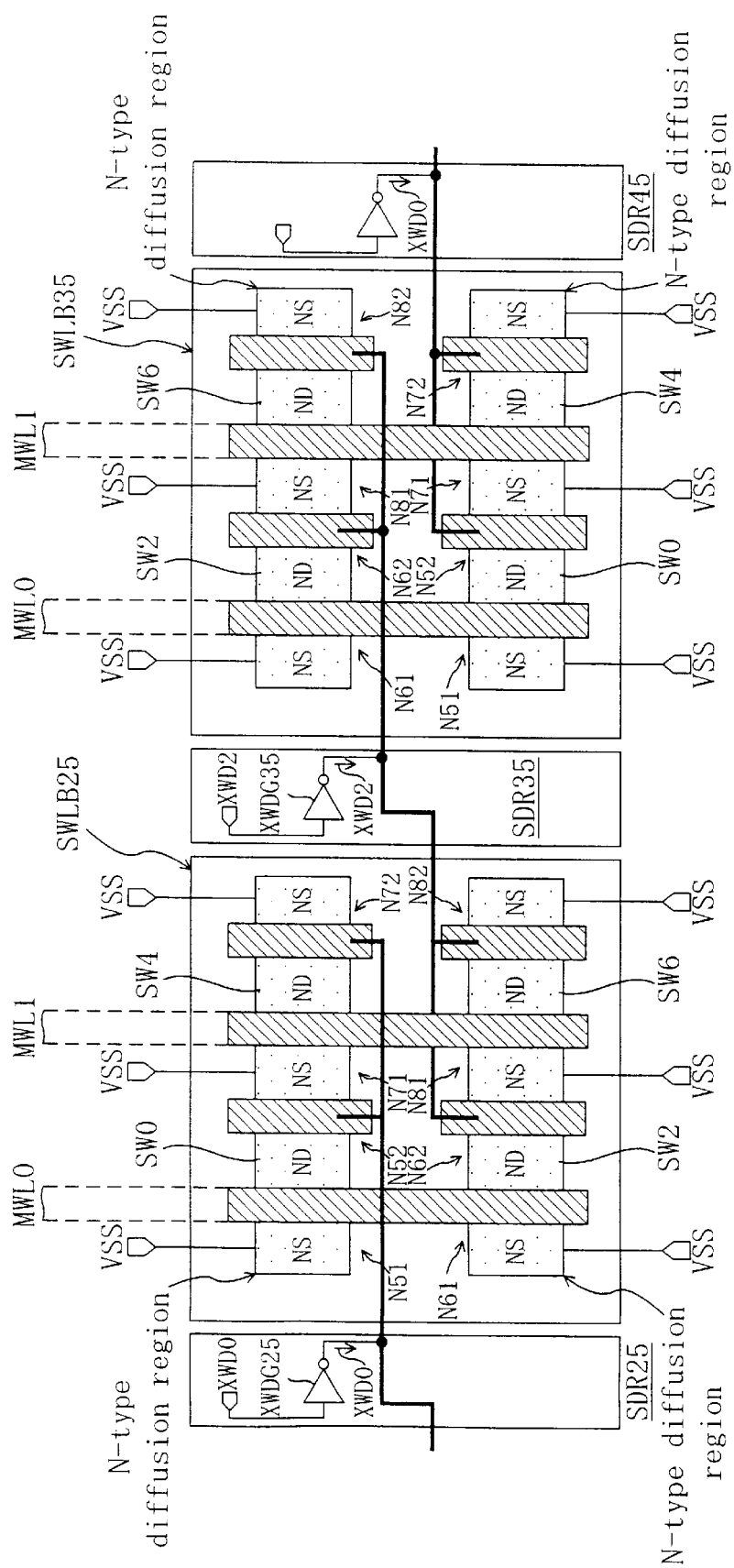
FIG. 16 is a layout of the second example of the sub-word line drive section in FIG. 7(a).

FIG. 16 is a layout of the second example of the sub-word line drive section SWLB. In FIG. 16, NS and ND represent a source region and a drain region, respectively. FIG. 16 shows a layout of the n-channel MOS transistors N51, N52, N61, N62, N71, N72, N81, and N82 in each of sub-word line drive sections SWLB25 and SWLB35 placed between intersection regions SDR25, SDR35, and SDR45.

As shown in FIG. 16, in the sub-word line drive section SWLB25, the n-channel MOS transistors N62 and N82 which receive the common sub-word line non-selection signal XWD2 at the respective gate electrodes are placed in the lower n-type diffusion region as is viewed from the figure alternately with the n-channel MOS transistors N61 and N81 which are connected to the main word lines MWL0 and MWL1 at the respective gate electrodes. That is, the n-channel MOS transistors N61, N62, N81, and N82 are arranged in this order from left to right as is viewed from the figure. Likewise, the n-channel MOS transistors N52 and N72 which receive the common sub-word line non-selection signal XWD0 at the respective gate electrodes are placed in the upper n-type diffusion region as is viewed from the figure alternately with the n-channel MOS transistors N51 and N71 which are connected with the main word lines MWL0 and MWL1 at the respective gate electrodes. That is, the n-channel MOS transistors N51, N52, N71, and N72 are arranged in this order from left to right as is viewed from the figure.

In this example, however, in the sub-word line drive section SWLB35, the positional relationship between the transistors that receive the sub-word non-selection signals XWD0 and XWD2 at the gate electrodes is reverse from that in the sub-word line drive section SWLB25. That is, in the sub-word line drive section SWLB35, the n-channel MOS transistors N52 and N72 which receive the common sub-word line non-selection signal XWD0 at the respective gate electrodes are placed in the lower n-type diffusion region alternately with the n-channel MOS transistors N51 and N71 which are connected to the main word lines MWL0 and MWL1 at the respective gate electrodes. That is, the n-channel MOS transistors N51, N52, N71, and N72 are arranged in this order from left to right. Likewise, the n-channel MOS transistors N62 and N82 that receive the common sub-word line non-selection signal XWD2 at the respective gate electrodes are placed in the upper n-type diffusion region alternately with the n-channel MOS transistors N61 and N81 which are connected to the main word lines MWL0 and MWL1 at the respective gate electrodes. That is, the n-channel MOS transistors N61, N62, N81, and N82 are arranged in this order from left to right. In short, the latter layout is the same as that of the sub-word line drive section SWLB35 of the first example shown in FIG. 15.

In the second example, also, the n-channel MOS transistors N52 and N71 and the n-channel MOS transistors N62 and N81 respectively share the source region NS connected to the ground. This contributes to reduction of the layout area of the semiconductor integrated circuit device.

According to the layout of this example, each line for the sub-word line non-selection signals XWD0 and XWD2 generated in the intersection region SDR is connected to the gate electrodes of the n-channel MOS transistors formed in the upper n-type diffusion region in the sub-word line drive section SWLB located on the right side of the intersection region SDR, while it is connected to the gate electrodes of the n-channel MOS transistors formed in the lower n-type diffusion region -in the sub-word line drive section SWLB located on the left side of the intersection region SDR. This configuration does not unify the positional relationship of the sub-word lines SW0, SW2, SW4, and SW6 in the sub-word line drive sections SWLB25 and SWLB35. However, the positional relationship of the sub-word lines SW0, SW2, SW4, and SW6 in the upper n-type diffusion regions of the sub-word line drive sections SWLB25 and SWLB35 and that in the lower n-type diffusion regions thereof are rotationally symmetric with each other. That is, the layouts of the intersection regions SDR can be unified, meaning that only one layout cell is required for the intersection regions SDR and thus the number of layout steps can be reduced.

(Sectional configuration of semiconductor integrated circuit device)

Examples of the sectional configuration of the memory cell arrays and their peripheries of the semiconductor integrated circuit device of the triple-well structure will be described with reference to FIGS. 17 through 19.

In general, DRAMs use a negative potential which is lower than the ground potential VSS as the potential at a substrate region of memory cells for storing information, i.e., a p-well (substrate potential VBB), for the purposes of preventing stored information from being damaged due to implantation of a minority carrier into the memory cells, improving the stored information holding characteristics, and reducing the diffusion capacitance. Such a negative potential, i.e., the substrate potential VBB is required to be generated inside the semiconductor integrated circuit device, and a circuit for generating the substrate potential VBB is generally of the charge pump type, which is comparatively low in current supply performance as described above. Using such a circuit, therefore, increases power consumption for generating the substrate potential VBB.

In this embodiment, in order to reduce power consumption of the semiconductor integrated circuit device, the capacity of a load to which the substrate potential VBB is applied is made as small as possible.

In DRAMs, also, the ground potential VSS tends to be applied to p-wells in the peripheries in order to increase the current-carrying capacity of transistors constituting periphery circuits and reduce the layout area for well isolation. For this reason, the p-wells in the memory cell arrays are isolated from the p-wells in the peripheries by a comparatively deep barrier n-well. In general, the active level of the source potential of the p-channel MOS transistors constituting the sub-word line drive circuits is the internal boosted potential VPP. This indicates that the potential at comparatively shallow n-wells which Is equal to the substrate potential of the p-channel MOS transistors in the sub-word line drive sections must be equal to or higher than the internal boosted potential VPP. On the contrary, the active level of the source potential of p-channel MOS transistors constituting the sense amplifiers is the internal lowered potential VINT. This indicates that the potential of comparatively shallow n-wells which is equal to the substrate potential of the p-channel MOS transistors in sense amplifier sections can be equal to or higher than the internal boosted potential VINT. If the entire bottom of the large memory cell block MB is covered with a barrier n-well as described above, all comparatively shallow n-wells formed in the large memory cell block MB are electrically connected with one another via the barrier n-well, resulting in having a common potential. Since the internal boosted potential VPP is higher than the internal lowered potential VINT, when the potential at the comparatively shallow n-wells, i.e., the substrate potential of the p-channel MOS transistors in the sub-word line drive sections is the internal boosted potential VPP, the potential at the comparatively shallow n-wells, i.e., the substrate potential of the p-channel MOS transistors in the sense amplifier sections is raised to the internal boosted potential VPP. The active level of the source potential of the p-channel MOS transistors of the sense amplifiers is the internal lowered potential VINT. If the substrate potential becomes the internal boosted potential VPP, a reverse bias effect arises where the absolute of the threshold voltage of the MOS transistors increases, reducing the current supply capacity.

In order to prevent the reduction of the current supply capacity, the semiconductor integrated circuit device of this embodiment has a sectional configuration as described in the following examples.

First Example

Figure 17A:
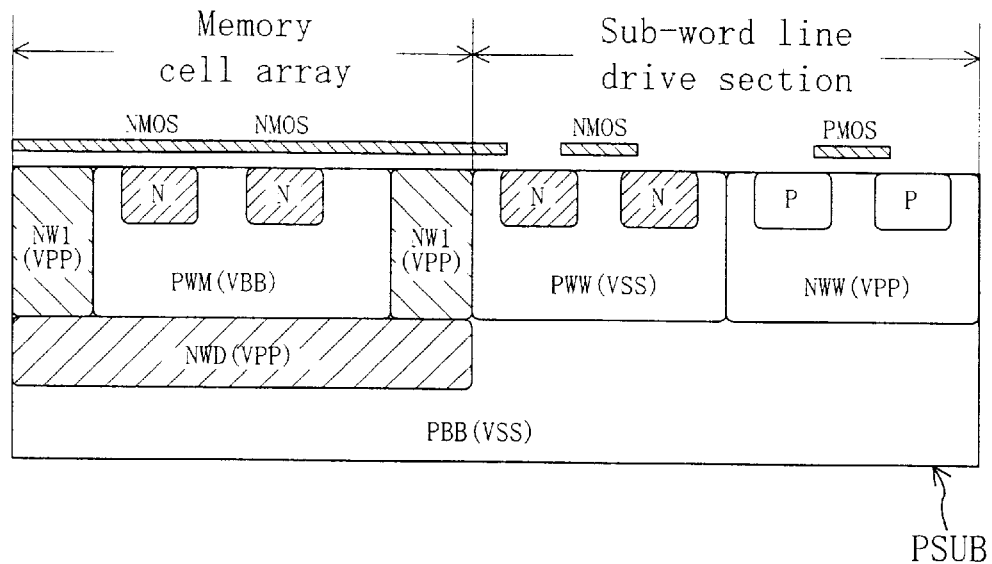
FIGS. 17(a) and 17(b) are cross-sectional views of a first example of the memory cell array and the sub-word line drive section, and the memory cell array and the sense amplifier section, respectively, according to the present invention.
Figure 17B:
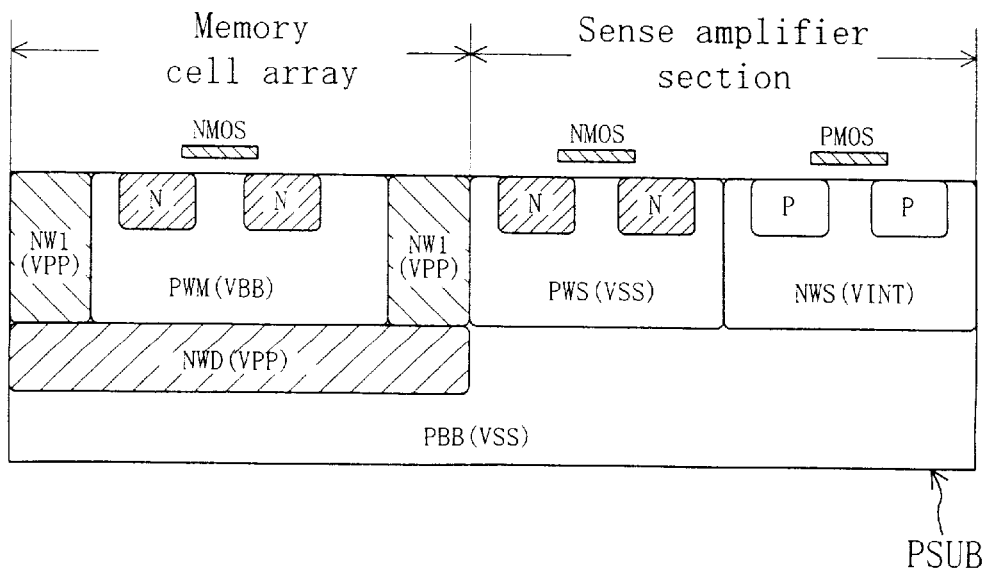

FIGS. 17(a) and 17(b) are cross-sectional views of the configuration of a memory cell array and a sub-word line drive section and the configuration of a memory cell array and a sense amplifier section, respectively.

Referring to FIG. 17(a), a p-type semiconductor substrate PSUB includes a substrate base PBB and a triple-well structure on the substrate base PBB. The triple-well structure includes a comparatively shallow p-well PWM and a comparatively deep barrier n-well NWD for isolating the p-well PWM from the substrate base PBB. A comparatively shallow n-well NW1 is formed on each of both sides of the memory cell array area for electrically isolating the comparatively shallow p-well PWM from a comparatively shallow p-well PWW outside the triple-well structure. In the area of the sub-word line drive section outside the triple-well structure, a comparatively shallow n-well NWW and the comparatively shallow p-well PWW are formed. The barrier n-well NWD and the comparatively shallow n-wells NW1 inside the triple-well structure are electrically connected with each other, having the same potential. The substrate base PBB and the comparatively shallow p-well PWW outside the triple-well structure are electrically connected with each other, having the same potential.

A voltage is applied to the respective wells in the semiconductor integrated circuit device having the above configuration in the following manner. The negative substrate potential VBB is applied to the p-well PWM of the memory cell array as described above. The internal boosted potential VPP is applied to the barrier n-well NWD for isolating the p-well PWM from the substrate base PBB and the comparatively shallow n-wells NW1 connected to the barrier n-well NWD. In the sub-word line drive section, the internal boosted potential VPP is applied to the comparatively shallow n-well NWW, and the ground potential VSS is applied to the comparatively shallow p-well PWW.

Referring to FIG. 17(b), the p-type semiconductor substrate PSUB includes the substrate base PBB and the triple-well structure formed on the substrate base PBB. The triple-well structure includes the comparatively shallow p-well PWM and the comparatively deep barrier n-well NWD for isolating the p-well PWM from the substrate base PBB. The comparatively shallow n-well NW1 is formed on each of both sides of the memory cell array area to electrically isolate the comparatively shallow p-well PWM from a comparatively shallow p-well PWS outside the triple-well structure. In the area of the sense amplifier section outside the triple-well structure, a comparatively shallow n-well NWS and the comparatively shallow p-well PWS are formed. The barrier n-well NWD and the comparatively shallow n-wells NW1 inside the triple-well structure are electrically connected with each other, having the same potential. The substrate base PBB and the comparatively shallow p-well PWS outside the triple-well structure are electrically connected with each other, having the same potential.

A voltage is applied to the respective wells in the semiconductor integrated circuit device having the above configuration in the following manner. The negative substrate potential VBB is applied to the p-well PWM of the memory cell array as described above. The internal boosted potential VPP is applied to the barrier n-well NWD for isolating the p-well PWM from the substrate base PBB and the comparatively shallow n-wells NW1 connected to the barrier n-well NWD. In the sense amplifier section, the internal lowered potential VINT is applied to the comparatively shallow n-well NWS, and the ground potential VSS is applied to the comparatively shallow p-well PWS.

With the above configuration, the n-well NWW in the sub-word line drive section and the n-well NWS in the sense amplifier section are prevented from electrical connection with each other via the barrier n-well NWD, allowing the two n-wells to have different potentials. It is therefore possible to apply the internal lowered potential VINT, not the internal boosted potential VPP, to the n-well NWS in the sense amplifier section. This overcomes the problem of reduction in current supply capacity that may otherwise occur due to the reverse bias effect where the absolute of the threshold voltage of the p-channel MOS transistors in the sense amplifier section increases.

Although not shown in FIGS. 17(a) and 17(b), the intersection region SDR in the periphery is located outside the triple-well structure and does not include the barrier n-well MWD, as the cases of the sub-word line drive section and the sense amplifier section. This allows the potential at the n-well of the intersection region to be freely set, for example, to be set at the internal lowered potential VINT, and thus avoids the possibility of latch-up at power-on of the power supply as described above.

In the example shown in FIGS. 17(a) and 17(b), the internal boosted potential VPP is applied to the barrier n-well NWD in the memory cell array. Instead, the external supply potential VDD or the internal lowered potential VINT may be applied.

A dummy cell may be formed on each comparatively shallow n-well NW1 to reduce the step and thus provide a configuration suitable for high integration.

Second Example

Figure 18A:
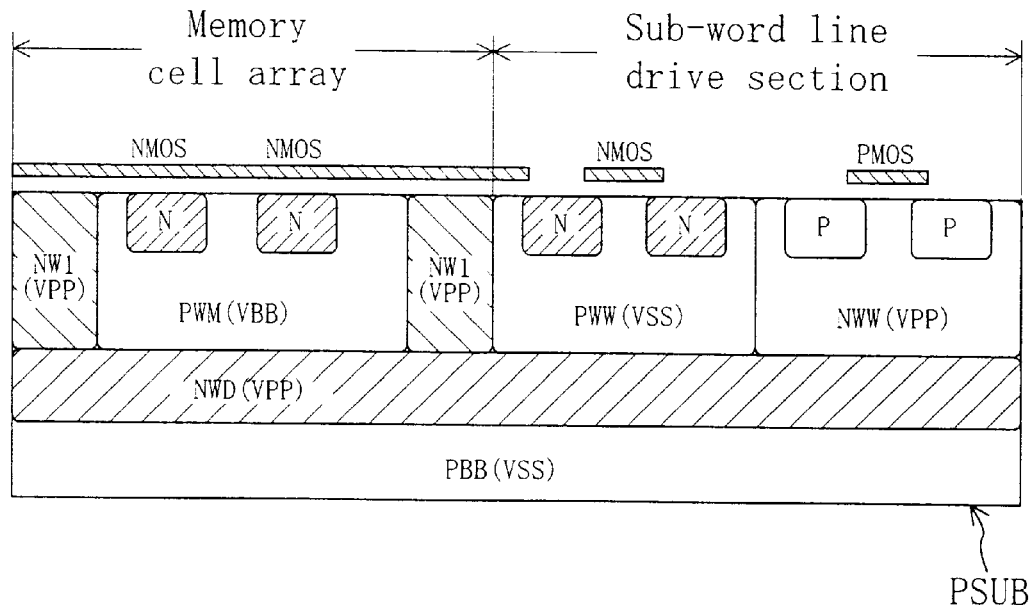
FIGS. 18(a) and 18(b) are cross-sectional views of a second example of the memory cell array and the sub-word line drive section, and the memory cell array and the sense amplifier column, respectively, according to the present invention.
Figure 18B:
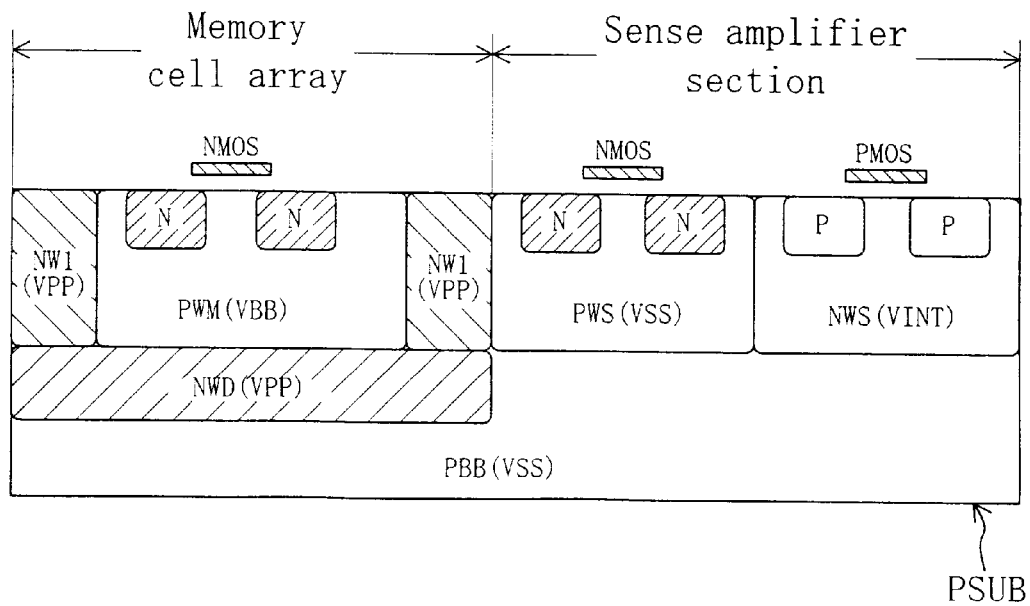

FIGS. 18(a) and 18(b) are cross-sectional views of the configuration of a memory cell array and a sub-word line drive section and the configuration of a memory cell array and a sense amplifier section, respectively, of the second example.

The difference of this example from the first example shown in FIGS. 17(a) and 17(b) is that the sub-word line drive section is also formed inside the triple well structure, with a comparatively shallow n-well NWW thereof being connected to the barrier n-well NWD.

Referring to FIG. 18(a), a p-type semiconductor substrate PSUB includes a substrate base PBB and a triple-well structure on the substrate base PBB. The triple-well structure includes comparatively shallow p-wells PWM and PWW and a comparatively deep barrier n-well NWD for isolating the p-wells PWM and PWW from the substrate base PBB. A comparatively shallow n-well NW1 is formed on each of both sides of the memory cell array area to electrically isolate the comparatively shallow p-well PWM from the comparatively shallow p-well PWW. In the area of the sub-word line drive section, the comparatively shallow n-well NWW and the comparatively shallow p-well PWW are formed. The barrier n-well NWD is electrically connected with the comparatively shallow n-wells NW1 and the comparatively shallow n-well NWW. These three wells have therefore the same potential.

A voltage is applied to the respective wells in the semiconductor integrated circuit device having the above configuration in the following manner. The negative substrate potential VBB is applied to the p-well PWM of the memory cell array as described above. The internal boosted potential VPP is applied to the barrier n-well NWD for isolating the p-well PWM from the substrate base PBB, and the comparatively shallow n-wells NW1 and the comparatively shall n-well NWW in the sub-word line drive section which are connected to the barrier n-well NWD. The ground potential VSS is applied to the comparatively shallow p-well PWW in the sub-word line drive section.

Referring to FIG. 18(b), the p-type semiconductor substrate PSUB includes the substrate base PBB and the triple-well structure formed on the substrate base PBB. The triple-well structure includes the comparatively shallow p-well PWM and the comparatively deep barrier n-well NWD for isolating the p-well PWM from the substrate base PBB. The comparatively shallow n-well NW1 is formed on each of both sides of the memory cell array area to electrically isolate the comparatively shallow p-well PWM from a comparatively shallow p-well PWS outside the triple-well structure. In the area of the sense amplifier section outside the triple-well structure, a comparatively shallow n-well NWS and the comparatively shallow p-well PWS are formed. The barrier n-well NWD and the comparatively shallow n-wells NW1 inside the triple-well structure are electrically connected with each other, having the same potential. The substrate base PBB and the comparatively shallow p-well PWS outside the triple-well structure are electrically connected with each other, having the same potential.

A voltage is applied to the respective wells in the semiconductor integrated circuit device having the above configuration in the following manner. The negative substrate potential VBB is applied to the p-well PWM of the memory cell array as described above. The internal boosted potential VPP is applied to the barrier n-well NWD for isolating the p-well PWM from the substrate base PBB and the comparatively shallow n-wells NW1 connected to the barrier n-well NWD. In the sense amplifier section, the internal lowered potential VINT is applied to the comparatively shallow n-well NWS, and the ground potential VSS is applied to the comparatively shallow p-well PWS as in the first example.

With the above configuration, only the n-wells NW1 on both sides of the memory cell array and the n-well NWW in the sub-word line drive section are electrically connected via the barrier n-well NWD. The n-well NWW is still prevented from electrical connection with the n-well NWS in the sense amplifier section via the barrier n-well NWD, allowing the two n-wells to have different potentials. It is therefore possible to apply the internal lowered potential VINT, not the internal boosted potential VPP, to the n-well NWS in the sense amplifier section. This overcomes the problem of reduction in current supply capacity that may otherwise occur due to the reverse bias effect where the absolute of the threshold voltage of the p-channel MOS transistors in the sense amplifier section increases.

As in the first example, the potential at an n-well of the intersection region can also be freely set, for example, to be set at the internal lowered potential VINT. This avoids the possibility of latch-up at power-on of the power supply as described above.

In the example shown in FIGS. 18(a) and 18(b), the ground potential VSS is applied to the comparatively shallow p-well PWW in the sub-word line drive section. Instead, the substrate potential VBB may be applied.

A dummy cell may be formed on each comparatively shallow in-well NW1 to reduce the step and thus provide a configuration suitable for high integration.

Third Example

Figure 19A:
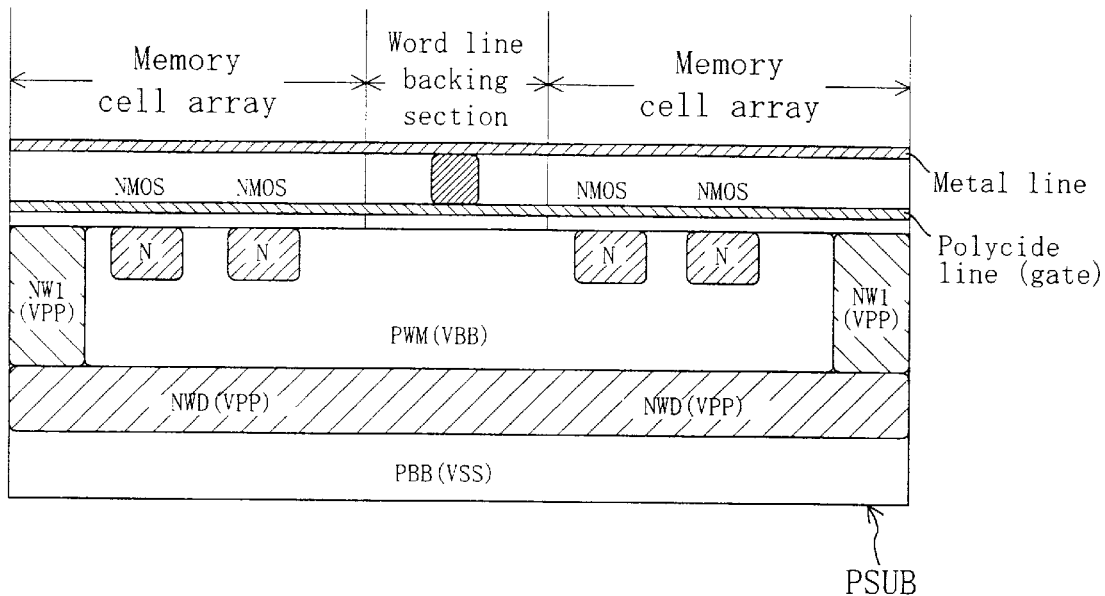
FIGS. 19(a) and 19(b) are cross-sectional views of a third example of the memory cell array and the sub-word line drive section, and the memory cell array and the sense amplifier column, respectively, according to the present invention.
Figure 19B:
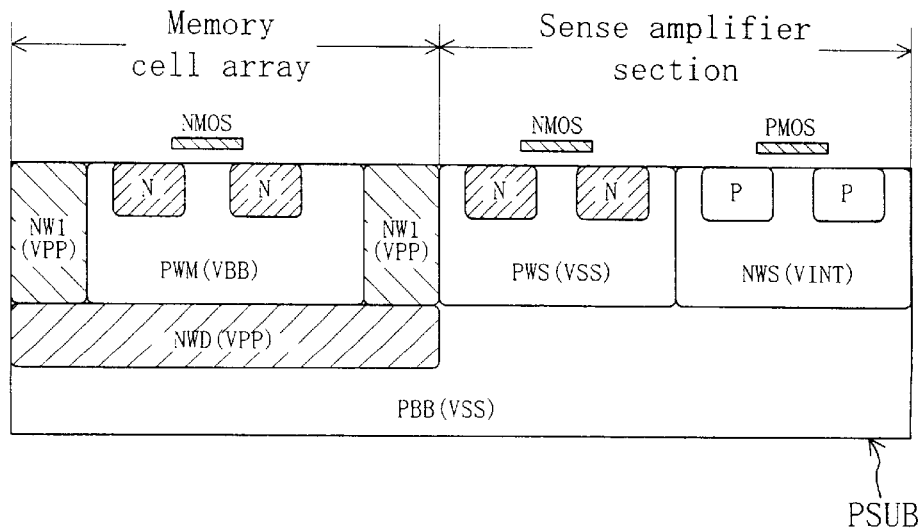

FIGS. 19(a) and 19(b) are cross-sectional views of the configuration of a memory cell array and a word line backing section and the configuration of a memory cell array and a sense amplifier section, respectively, of the third example.

The difference of this example from the first example shown in FIGS. 17(a) and 17(b) is that the word lines have a backing structure, not the hierarchical structure. In the word line backing structure, when one word line is long, the polycide lines having a comparatively high resistance constituting the gates of memory cell transistors in each memory cell array are connected with the metal lines having a comparatively low resistance and the same potential as the polycide lines in a word line backing section in order to suppress signal delay due to the resistance of the polycide lines. The memory cell array and the word line backing section are formed within a triple-well structure with comparatively shallow n-wells NW1 formed on both sides being connected to a barrier n-well NWD.

Referring to FIG. 19(a), a p-type semiconductor substrate PSUB includes a substrate base PBB and a triple-well structure on the substrate base PBB. The triple-well structure includes a comparatively shallow p-well PWM and the comparatively deep barrier n-well NWD for electrically isolating the p-well PWM from the substrate base PBB. The comparatively shallow n-wells NW1 are formed on both sides of the memory cell array to electrically isolate the comparatively shallow p-well PWM from a surrounding comparatively shallow p-well.

A voltage is applied to the respective wells in the semiconductor integrated circuit device having the above configuration in the following manner. The negative substrate potential VBB is applied to the p-well PWM of the memory cell array as described above. The internal boosted potential VPP is applied to the barrier n-well NWD for electrically isolating the p-well PWM from the substrate base PBB and the comparatively shallow n-wells NW1 connected to the barrier n-well NWD.

Referring to FIG. 19(b), the p-type semiconductor substrate PSUB includes the substrate base PBB and the triple-well structure formed on the substrate base PBB. The triple-well structure includes the comparatively shallow p-well PWM and the comparatively deep barrier n-well NWD for isolating the p-well PWM from the substrate base PBB. The comparatively shallow n-wells NW1 are formed on both sides of the memory cell array to electrically isolate the comparatively shallow p-well PWM from a comparatively shallow p-well PWS outside the triple-well structure. In the area of the sense amplifier section outside the triple-well structure, a comparatively shallow n-well NWS and the comparatively shallow p-well PWS are formed. The barrier n-well NWD and the comparatively shallow n-wells NW1 inside the triple-well structure are electrically connected with each other, having the same potential. The substrate base PBB and the comparatively shallow p-well PWS outside the triple-well structure are electrically connected with each other, having the same potential.

A voltage is applied to the respective wells in the semiconductor integrated circuit device having the above configuration in the following manner. The negative substrate potential VBB is applied to the p-well PWM of the memory cell array as described above. The internal boosted potential VPP is applied to the barrier n-well NWD for isolating the p-well PWM from the substrate base PBB and the comparatively shallow n-wells NW1 connected to the barrier n-well NWD.

With the above word line backing structure, only the n-wells NW1 on both sides of the memory cell array and the n-well NWW in the sub-word line drive section (not shown) are electrically connected via the barrier n-well NWD. The n-well NWS in the sense amplifier section is still prevented from being electrically connected with the n-well NWW via the barrier n-well NWD, allowing the two n-wells to have different potentials. It is therefore possible to apply the internal lowered potential VINT, not the internal boosted potential VPP, to the n-well NWS in the sense amplifier section. This overcomes the problem of reduction in current supply capacity that may otherwise occur due to the reverse bias effect where the absolute of the threshold voltage of the p-channel MOS transistors in the sense amplifier section increases.

In this example, the ground potential VSS is applied to the comparatively shallow p-well PWS in the sense amplifier section. Instead, the substrate potential VBB may be applied.

(OTHER EXAMPLES)

The present invention is not limited to above examples, but can be implemented in other forms as follows.

In FIG. 1, the DRAM may include any number of memory cell blocks having any memory capacity. The arrangement and shape of the semiconductor substrate are not limited to those shown in FIG. 1. The external supply potential VDD can be of any value. The block construction of the DRAM, the names and combinations of start control signals, and the configuration of each memory cell block may be selected from a variety of possibilities.

In FIG. 2, each of the memory cell blocks MB0 to MB3 may have any number of sub-memory cell arrays. The combination of the paired sub-memory cell arrays, the directions of the signal lines, and the like may be selected from a variety of possibilities.

In FIGS. 3, 4, 5, and 6, the combination of the sub-word line drive circuits in the sub-word line drive section with the sub-word lines may be selected from a variety of possibilities. The main word lines MWL may be formed every two, four, eight, or 16 sub-word lines.

In FIGS. 7 and 8, the sub-word line drive circuit in the sub-word line drive section may be formed of only a NMOS transistor which receives, for example, the main word line MWL0, the sub-word line drive signal WD, and the sub-word line non-selection signal XWD. This configuration omits the formation of the comparatively shallow n-well in the sub-word line drive section, allowing for free setting of the potential at the barrier n-well. The sub-word line drive circuit may be implemented in a variety of configurations.

In FIG. 13, the external supply potential dependency curves of the internal boosted potential VPP and the internal lowered potential VINT are not limited to the illustrated ones.

In FIGS. 17 through 19, the positions and the order of the wells and the material for the metal lines and the like are not limited to the illustrated ones. Using the p-type semiconductor substrate is not a requisite for DRAMs, but an n-type substrate may be used. The well structure, the substrate potential, and the combination thereof may be practically determined from a variety of possibilities.

In the above description, the semiconductor integrated circuit device according to the present invention was applied to a DRAM. The present invention can also be applied to a variety of memory integrated circuit devices, such as synchronous DRAM and static RAM, and digital integrated circuit devices incorporating such memory integrated circuits. In such cases, also, substantially the same effects as those described above, such as reduction of power consumption, can be obtained.

The present invention can also be widely applied to semiconductor memory devices which effectively utilize at least the word line hierarchical structure and devices/systems incorporating such semiconductor memory devices. In such cases, also, substantially the same effects as those described above can be obtained.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor integrated circuit device having a number of MOS transistors and lines integrated on a semiconductor substrate, the device comprising:

main word lines and a plurality of sub-word lines branching from each of the main word lines;

a plurality of bit lines extending to intersect the plurality of sub-word lines;

memory cell arrays each including a plurality of memory cells arranged in a matrix, the memory cells being connected with the sub-word lines and the bit lines;

sense amplifier sections each including a plurality of sense amplifiers connected with the bit lines;

main word line drive signal generation circuits for generating a main word line drive signal;

sub-word line drive signal generation circuits for generating a sub-word line drive signal;

sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein the sub-word line drive signal has a state of being at a boosted potential higher than an external supply potential, and the sub-word line non-selection signal has a state of being at an internal lowered potential lower than the external supply potential.

2. The device of claim 1, wherein the sub-word line drive sections and the sense amplifier sections are placed in directions to intersect each other, and the sub-word line non-selection signal generation circuits are placed in respective intersection regions at which the sub-word line drive sections and the sense amplifier sections intersect each other.

3. The device of claim 1, wherein the sub-word line non-selection signal generation circuits are configured to receive the sub-word line drive signal and generate the sub-word line non-selection signal based on the sub-word line drive signal.

4. The device of claim 1, wherein the boosted potential and the internal lowered potential are generated based on the external supply potential, and the boosted potential and the internal lowered potential are substantially fixed when the external supply potential falls within a range.

5. The device of claim 2, further comprising sense amplifier drive circuits in the respective intersection regions for driving the sense amplifiers, wherein the sense amplifier drive circuit and the sub-word line non-selection signal generation circuit in each intersection region have respective MOS transistors having a common source or drain formed in the semiconductor substrate.

6. The device of claim 2, wherein the sub-word line non-selection signal generation circuits are placed on both sides of each of the sub-word line drive section, and the sub-word line drive sections receive the sub-word line non-selection signal from the sub-word line non-selection signal generation circuits as an input signal.

7. The device of claim 2, wherein four or more lines for the sub-word line non-selection signal are connected to each of the sub-word line drive sections, the sub-word line non-selection signal generation circuits and the sub-word line drive sections are alternately placed adjacent to each other, and the sub-word line non-selection signal generated by each of the sub-word line non-selection signal generation circuits excluding outermost ones is input into four or more sub-word line drive sections including the adjacent ones on both sides.

8. The device of claim 2, wherein the sub-word line drive sections and the sub-word line non-selection signal generation circuits are alternately placed adjacent to each other, the sub-word line drive signal is input into the sub-word line drive sections from both sides, and the sub-word line non-selection signal is input into the sub-word line drive sections from the adjacent sub-word line non-selection signal generation circuits on both sides.

9. The device of claim 2, further comprising:

an internal lowered potential generation circuit for generating the internal lowered potential based on the input external supply potential;

a selected internal lowered potential generation circuit including a MOS transistor driven by the internal lowered potential generated by the internal lowered potential generation circuit, a selected internal lowered potential changing depending on a change of the internal lowered potential; and a line for supplying the selected internal lowered potential extending from the selected internal lowered potential generation circuit to be connected to the sub-word line non-selection signal generation circuit, wherein the line for supplying the selected internal lowered potential is placed over the sense amplifier section.

10. The device of claim 2, further comprising:

an internal lowered potential generation circuit for generating the internal lowered potential based on the input external supply potential;

a selected internal lowered potential generation circuit including a MOS transistor driven by the internal lowered potential generated by the internal lowered potential generation circuit, a selected internal lowered potential changing depending on a change of the internal lowered potential; and a line for supplying the selected internal lowered potential extending from the selected internal lowered potential generation circuit to be connected to the sub-word line non-selection signal generation circuit, wherein the line for supplying the selected internal lowered potential is placed over the sub-word line drive section.

11. The device of claim 2, further comprising:

an internal lowered potential generation circuit for generating the internal lowered potential based on the input external supply potential;

a selected internal lowered potential generation circuit including a MOS transistor driven by the internal lowered potential generated by the internal lowered potential generation circuit, a selected internal lowered potential changing depending on a change of the internal lowered potential;

a line for supplying the selected internal lowered potential extending from the selected internal lowered potential generation circuit to be connected to the sub-word line non-selection signal generation circuit; and a control circuit receiving the boosted potential for controlling the MOS transistor so as to stop supply of charges to the line for supplying the selected internal lowered potential until the boosted potential reaches a value.

12. The device of claim 9, further comprising a control circuit receiving the external supply potential for controlling the MOS transistor so as to stop supply of charges to the line for supplying the selected internal lowered potential until a time passes from power-on of an external power supply.

13. The device of claim 1, wherein the memory cell array includes n-channel MOS transistors each formed in a p-well in a first n-well region, and a negative potential is applied to the p-well during operation of the n-channel MOS transistor, the sense amplifier section includes p-channel MOS transistors each formed in a second n-well region which is shallower than the first n-well region, the sub-word line drive section includes p-channel MOS transistors each formed in a third n-well region which is shallower than the first n-well region, and the second n-well region and the third n-well region are electrically isolated from each other.

14. The device of claim 1, wherein the memory cell array and the sub-word line drive section respectively include n-channel channel MOS transistors each formed in a p-well in a first n-well region, a negative potential is applied to the p-well while a boosted potential is applied to the first n-well region during operation of the n-channel MOS transistor, the sense amplifier section includes p-channel MOS transistors each formed in a second n-well region which is shallower than the first n-well region, and the first n-well region and the second n-well region are electrically isolated from each other.

15. The device of claim 13, further comprising dummy memory cells free from data storing formed in a fourth n-well region which is shallower than the first n-well region at ends of the memory cell array, wherein the fourth n-well region and the first n-well region are electrically isolated from each other.

16. A semiconductor integrated circuit device having a number of MOS transistors and lines integrated on a semiconductor substrate, the device comprising:

main word lines and a plurality of sub-word lines branching from each of the main word lines;

a plurality of bit lines extending to intersect the plurality of sub-word lines;

memory cell arrays each including a plurality of memory cells arranged in a matrix, the memory cells being connected with the sub-word lines and the bit lines;

sense amplifier sections each including a plurality of sense amplifiers connected with the bit lines;

main-word line drive signal generation circuits for generating a main word line drive signal;

sub-word line drive signal generation circuits for generating a sub-word line drive signal;

sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein a plurality of columns of n-type diffusion regions are formed in the semiconductor substrate, each of the sub-word line drive sections includes a plurality of n-type diffusion regions belonging to the plurality of columns of n-type diffusion regions, each of the n-type diffusion regions includes a plurality of MOS transistors having gate electrodes, and a line for the sub-word line non-selection signal extending from each of the sub-word line non-selection signal generation circuits is connected to the gate electrodes in the n-type diffusion regions of a common column in the sub-word line drive sections on both sides of the sub-word line non-selection signal generation circuit.

17. A semiconductor integrated circuit device having a number of MOS transistors and lines integrated on a semiconductor substrate, the device comprising:

main word lines and a plurality of sub-word lines branching from each of the main word lines;

a plurality of bit lines extending to intersect the plurality of sub-word lines;

memory cell arrays each including a plurality of memory cells arranged in a matrix, the memory cells being connected with the sub-word lines and the bit lines;

sense amplifier sections each including a plurality of sense amplifiers connected with the bit lines;

main-word line drive signal generation circuits for generating a main word line drive signal;

sub-word line drive signal generation circuits for generating a sub-word line drive signal;

sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein a plurality of columns of n-type diffusion regions are formed in the semiconductor substrate, each of the sub-word line drive sections includes a plurality of n-type diffusion regions belonging to the plurality of columns of n-type diffusion regions, each of the n-type diffusion regions includes a plurality of MOS transistors having gate electrodes, and a line for the sub-word line non-selection signal extending from each of the sub-word line non-selection signal generation circuits is connected to the gate electrodes in the n-type diffusion regions of different columns in the sub-word line drive sections on both sides of the sub-word line non-selection signal generation circuit.

18. A semiconductor integrated circuit device having a number of MOS transistors and lines integrated on a semiconductor substrate, the device comprising:

a plurality of word lines;

a plurality of bit lines extending to intersect the plurality of word lines;

memory cell arrays each including a plurality of memory cells arranged in a matrix, the memory cells being connected with the word lines and the bit lines;

sense amplifier sections each including a plurality of sense amplifiers connected with the bit lines;

word line drive sections each including a plurality of word line drive circuits for driving the word line;

a first wiring layer constituting the word lines;

a second wiring layer having a resistance lower than the first wiring layer; and a word line backing section for connecting the first wiring layer and the second wiring layer, wherein the memory cell array includes n-channel MOS transistors each formed in a p-well in a first n-well region, and a negative potential is applied to the p-well during operation of the n-channel MOS transistor, and the sense amplifier section includes p-channel MOS transistors each formed in a second n-well region.

19. A semiconductor integrated circuit device having a number of MOS transistors and lines integrated on a semiconductor substrate, the device comprising:

main word lines and a plurality of sub-word lines branching from each of the main word lines;

a plurality of bit lines extending to intersect the plurality of sub-word lines;

memory cell arrays each including a plurality of memory cells arranged in a matrix, the memory cells being connected with the sub-word lines and the bit lines;

sense amplifier sections each including a plurality of sense amplifiers connected with the bit lines;

main-word line drive signal generation circuits for generating a main word line drive signal;

sub-word line drive signal generation circuits for generating a sub-word line drive signal;

sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein each of the sub-word line drive circuits includes a MOS transistor having a gate connected to the main word line and a source or a drain receiving the sub-word line drive signal for selecting the sub-word line, and when the selected sub-word line drive circuit is to be inactivated, the sub-word line is first inactivated before the main word line drive signal is inactivated.

20. The device of claim 19, wherein the sub-word line drive signal has a state of being at a boosted potential higher than an external supply potential, and the sub-word line non-selection signal has a state of being at an internal lowered potential lower than the external supply potential, the sub-word line drive sections and the sense amplifier sections are placed to intersect each other, and each of the sub-word line non-selection signal generation circuits is placed in an intersection region between the sub-word line drive section and the sense amplifier section, and composed of an inverter receiving the sub-word line drive signal.

21. A semiconductor integrated circuit device having a number of MOS transistors and lines integrated on a semiconductor substrate, the device comprising:

main word lines and a plurality of sub-word lines branching from each of the main word lines;

a plurality of bit lines extending to intersect the plurality of sub-word lines;

memory cell arrays each including a plurality of memory cells arranged in a matrix, the memory cells being connected with the sub-word lines and the bit lines;

sense amplifier sections each including a plurality of sense amplifiers connected with the bit lines;

main-word line drive signal generation circuits for generating a main word line drive signal;

sub-word line drive signal generation circuits for generating a sub-word line drive signal;

sub-word line non-selection signal generation circuits for generating a sub-word line non-selection signal; and sub-word line drive sections each including a plurality of sub-word line drive circuits each connected with the main-word line drive signal generation circuit, the sub-word line drive signal generation circuit, and the sub-word line non-selection signal generation circuit for driving the sub-word line based on the main-word line drive signal, the sub-word line drive signal, and the sub-word line non-selection signal, wherein each of the sub-word line drive circuits includes a first MOS transistor having a gate connected to the main word line and a source or a drain receiving the sub-word line drive signal for selecting the sub-word line, and a second MOS transistor having a gate receiving the sub-word line non-selection signal for inactivating the sub-word line, and when the sub-word line drive circuit is to be selected, the second MOS transistor is first turned OFF before the sub-word line is selected, and when the selected sub-word line drive circuit is to be inactivated, the sub-word line is first inactivated before the main word line drive signal is inactivated.

* * * * *